USO11069410B1

(12) United States Patent
Cui et al.

(10) Patent No.: US 11,069,410 B1
(45) Date of Patent: Jul. 20, 2021

(54) THREE-DIMENSIONAL NOR-NAND COMBINATION MEMORY DEVICE AND METHOD OF MAKING THE SAME

(71) Applicant: SANDISK TECHNOLOGIES LLC, Addison, TX (US)

(72) Inventors: Zhixin Cui, Nagoya (JP); Hardwell Chibvongodze, Hiratsuka (JP); Rajdeep Gautam, Nagoya (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/985,335

(22) Filed: Aug. 5, 2020

(51) Int. Cl.
*G11C 16/10* (2006.01)
*H01L 27/11519* (2017.01)
(Continued)

(52) U.S. Cl.
CPC ............ *G11C 16/10* (2013.01); *G11C 11/223* (2013.01); *G11C 11/2273* (2013.01); *G11C 11/2275* (2013.01); *G11C 16/0408* (2013.01); *G11C 16/0466* (2013.01); *G11C 16/26* (2013.01); *G11C 17/16* (2013.01); *G11C 17/18* (2013.01); *H01L 23/5226* (2013.01);
(Continued)

(58) Field of Classification Search
CPC ..... G11C 16/10; G11C 11/2273; G11C 17/18; G11C 16/26; G11C 11/223; G11C 16/0408; G11C 17/16; G11C 16/0466; G11C 11/2275; G11C 2216/26; H01L 27/11519; H01L 27/11521; H01L 27/11582; H01L 27/11206; H01L 23/5226; H01L 27/11565; H01L 27/11568; H01L 27/11556; H01L 27/1159; H01L 27/11587; H01L 27/11597
USPC ....................................... 365/185.11
See application file for complete search history.

(56) References Cited

U.S. PATENT DOCUMENTS 10,381,376 B1 8/2019 Nishikawa et al.
10,483,272 B2 * 11/2019 Oh ....................... H01L 23/5283
(Continued)

OTHER PUBLICATIONS

U.S. Appl. No. 16/142,447, filed Sep. 26, 2018, SanDisk Technologies LLC.
(Continued)

*Primary Examiner* — Fernando Hidalgo
(74) *Attorney, Agent, or Firm* — The Marbury Law Group PLLC

(57) ABSTRACT

First alternating stacks of first insulating strips and first spacer material strips is formed in a first device region, second alternating stacks of second insulating strips and second spacer material strips are formed in a second device region. Each of the first line trenches is filled with a respective laterally alternating sequence of memory stack structures and first dielectric pillar structures to form a three-dimensional NAND memory. Each of the memory stack structures includes a vertical semiconductor channel and a vertical stack of memory elements. Each of the second line trenches with a respective laterally alternating sequence of active region assemblies of lateral field effect transistors and second dielectric pillar structures to form a three-dimensional NOR memory. Each of the active region assemblies includes a source pillar, a drain pillar, and a tubular channel region. The spacer material strips include, or are subsequently replaced with, electrically conductive strips.

20 Claims, 41 Drawing Sheets

(51) Int. Cl.

| | |
|---|---|
| *H01L 27/11521* | (2017.01) |
| *H01L 27/11556* | (2017.01) |
| *H01L 27/11565* | (2017.01) |
| *H01L 27/11568* | (2017.01) |
| *H01L 27/11582* | (2017.01) |
| *H01L 23/522* | (2006.01) |
| *H01L 27/11587* | (2017.01) |
| *H01L 27/1159* | (2017.01) |
| *H01L 27/11597* | (2017.01) |
| *G11C 17/16* | (2006.01) |
| *G11C 17/18* | (2006.01) |
| *G11C 16/04* | (2006.01) |
| *G11C 16/26* | (2006.01) |
| *G11C 11/22* | (2006.01) |
| *H01L 27/112* | (2006.01) |

(52) U.S. Cl.
CPC .... *H01L 27/1159* (2013.01); *H01L 27/11206* (2013.01); *H01L 27/11519* (2013.01); *H01L 27/11521* (2013.01); *H01L 27/11556* (2013.01); *H01L 27/11565* (2013.01); *H01L 27/11568* (2013.01); *H01L 27/11582* (2013.01); *H01L 27/11587* (2013.01); *H01L 27/11597* (2013.01); *G11C 2216/26* (2013.01)

(56) References Cited

U.S. PATENT DOCUMENTS

| | | |
|---|---|---|
| 10,559,588 B2 | 2/2020 | Dong et al. |
| 10,593,692 B2 | 3/2020 | Borukhov |
| 10,700,078 B1 | 6/2020 | Cui et al. |
| 10,700,086 B2 * | 6/2020 | Makala .......... H01L 27/11524 |
| 10,700,090 B1 | 6/2020 | Cui et al. |
| 2007/0029607 A1 | 2/2007 | Kouznetzov |
| 2019/0139975 A1 * | 5/2019 | Oh .................... G06F 12/0893 |
| 2019/0221575 A1 | 7/2019 | Dong et al. |
| 2019/0252405 A1 | 8/2019 | Tsutsumi |
| 2019/0333930 A1 * | 10/2019 | Borukhov ......... H01L 29/0847 |
| 2020/0006375 A1 | 1/2020 | Zhou et al. |
| 2020/0006376 A1 | 1/2020 | Makala et al. |
| 2020/0058672 A1 | 2/2020 | Nishikawa et al. |
| 2020/0242030 A1 * | 7/2020 | Yoon .................. G06F 12/0646 |

OTHER PUBLICATIONS

U.S. Appl. No. 16/423,500, filed May 28, 2019, SanDisk Technologies LLC.
U.S. Appl. No. 16/539,103, filed Aug. 13, 2019, SanDisk Technologies LLC.
U.S. Appl. No. 16/539,124, filed Aug. 13, 2019, SanDisk Technologies LLC.
U.S. Appl. No. 16/707,036, filed Dec. 9, 2019, SanDisk Technologies LLC.
U.S. Appl. No. 16/707,541, filed Dec. 9, 2019, SanDisk Technologies LLC.
U.S. Appl. No. 16/728,825, filed Dec. 27, 2019, SanDisk Technologies LLC.
U.S. Appl. No. 16/738,644, filed Jan. 9, 2020, SanDisk Technologies LLC.
U.S. Appl. No. 16/876,816, filed May 18, 2020, SanDisk Technologies LLC.
U.S. Appl. No. 16/876,877, filed May 18, 2020, SanDisk Technologies LLC.

* cited by examiner

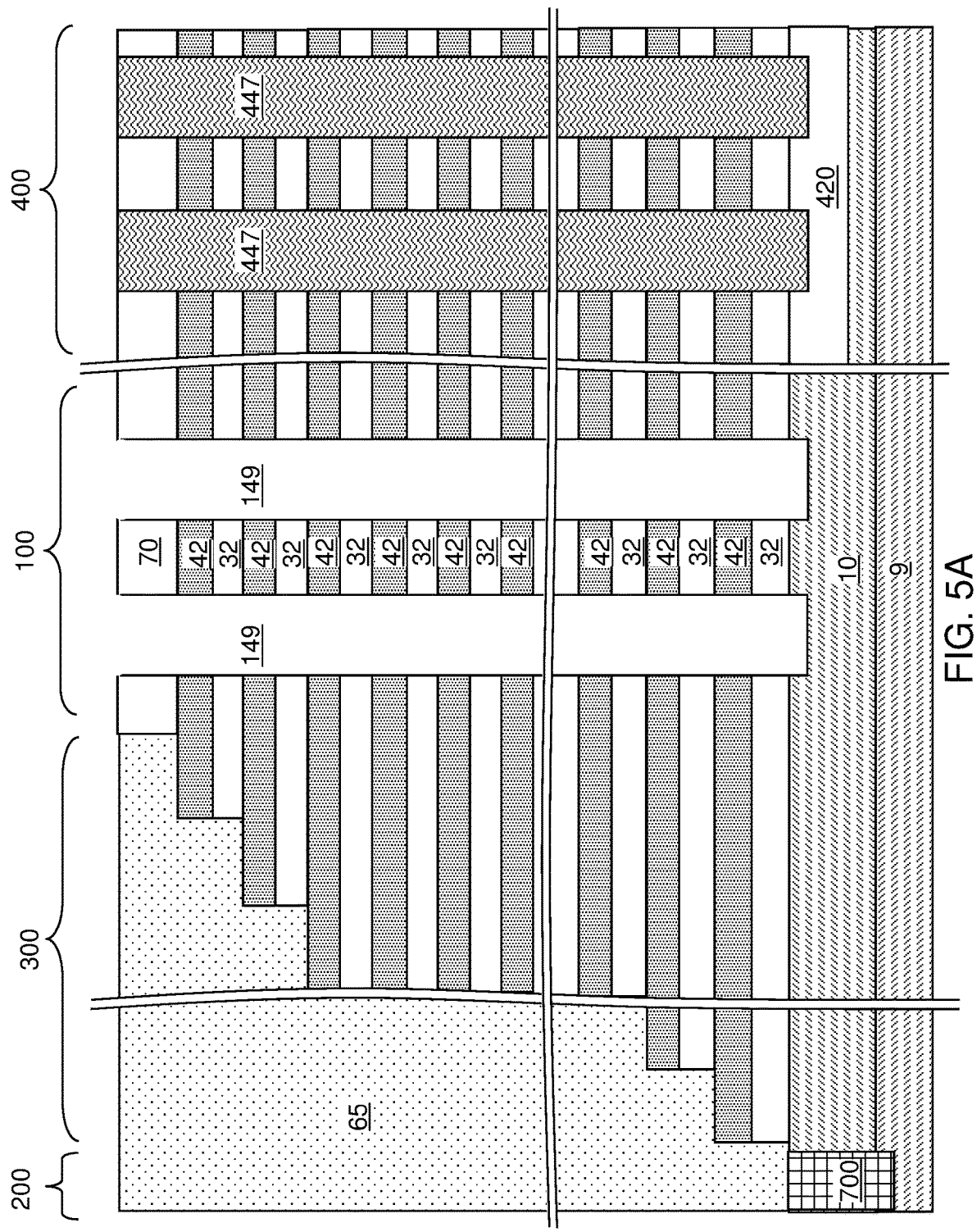

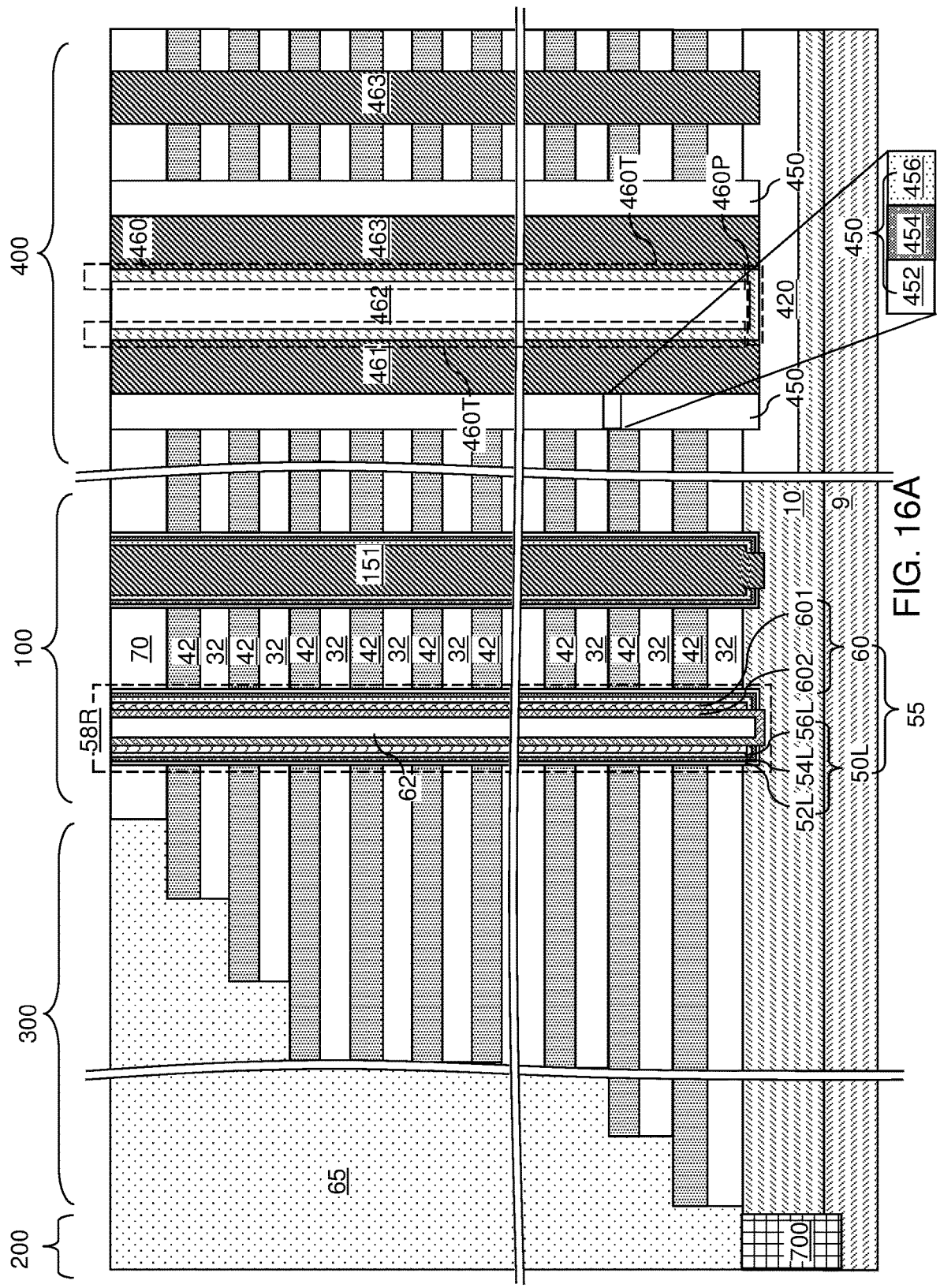

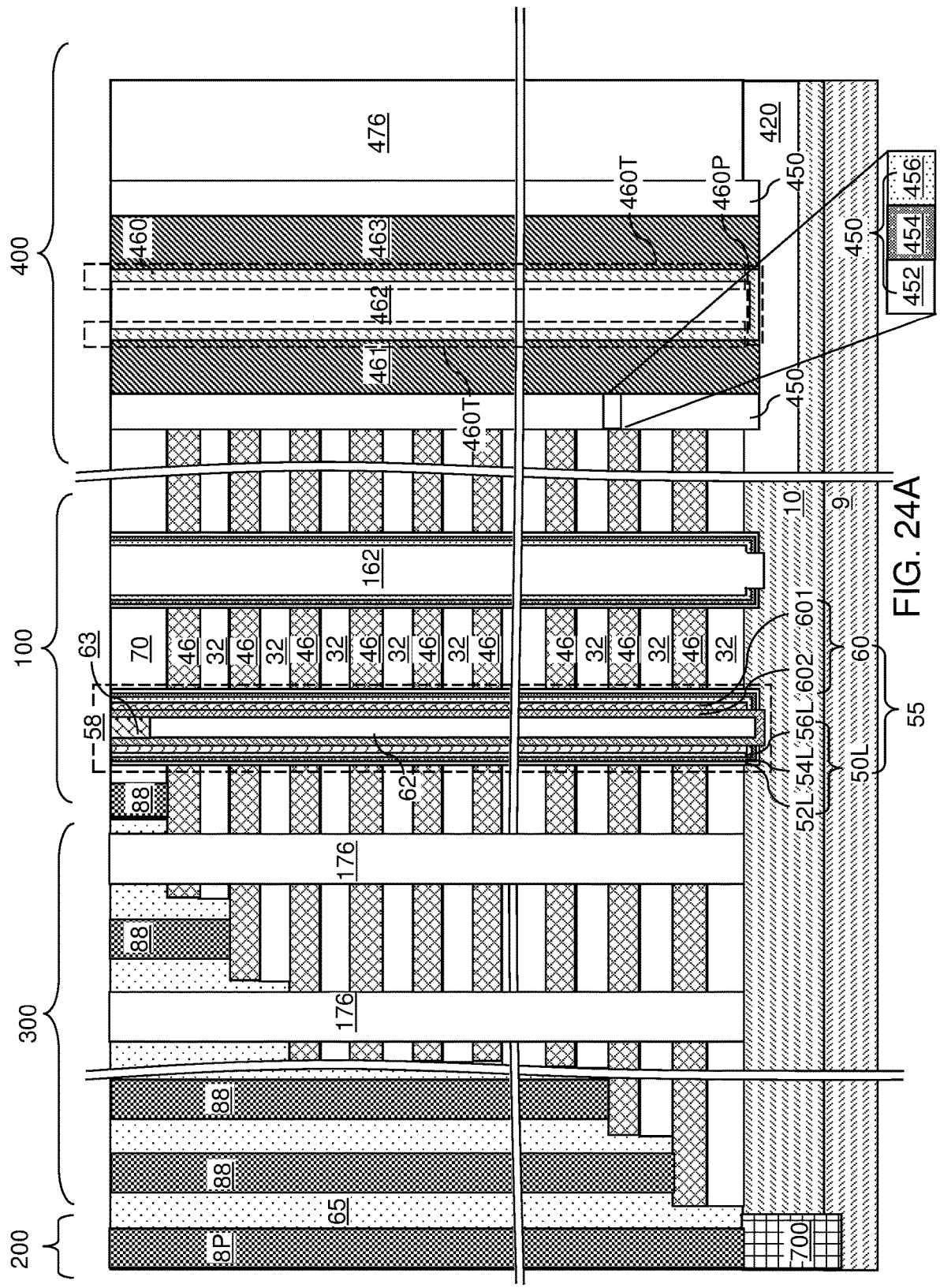

THREE-DIMENSIONAL NOR-NAND COMBINATION MEMORY DEVICE AND METHOD OF MAKING THE SAME

FIELD

The present disclosure relates generally to the field of semiconductor devices, and particular to a three-dimensional NOR-NAND combination memory device and methods of manufacturing the same.

BACKGROUND

Generally, two types of three-dimensional flash memory devices are known in the art. A first type of the three-dimensional flash memory devices is a NAND-type flash memory device, which provides fast erase, relatively fast programming, but slow reading. A second type of the three-dimensional flash memory devices is a NOR-type flash memory device, which provides fast reading, but slow erase and slow programming. Typically, NAND memory devices and NOR memory devices are formed employing different sets of processing steps on different substrates.

SUMMARY

According to an aspect of the present disclosure, a three-dimensional memory device comprises: first alternating stacks of first insulating strips and first electrically conductive strips located over a first device region of a substrate and laterally spaced apart from each other by first line trenches, wherein each of the first line trenches is filled with a respective laterally alternating sequence of memory stack structures and first dielectric pillar structures, and wherein each of the memory stack structures comprises a vertical semiconductor channel that continuously extends vertically through each level of the first electrically conductive strips and a vertical stack of memory elements located at each level of the first electrically conductive strips; and second alternating stacks of second insulating strips and second electrically conductive strips located over second device region of the substrate and laterally spaced apart from each other by second line trenches, wherein each of the second line trenches comprises a laterally alternating sequence of active region assemblies of NOR memory lateral field effect transistors and second dielectric pillar structures, and wherein each of the active region assemblies of the NOR memory lateral field effect transistors comprises a source pillar, a drain pillar, and a tubular channel region contacting the source pillar and the drain pillar.

According to another aspect of the present disclosure, a method of forming a three-dimensional memory device is provided. The method comprises forming a vertically alternating sequence of insulating layers and spacer material layers over a substrate, wherein the spacer material layers comprise a sacrificial material or an electrically conductive material; forming first line trenches in a first device region and second line trenches in a second device region, wherein the vertically alternating sequence is divided into first alternating stacks of first insulating strips and first spacer material strips in the first device region, and is divided into second alternating stacks of second insulating strips and second spacer material strips in the second device region; filling each of the first line trenches with a respective laterally alternating sequence of memory stack structures and first dielectric pillar structures, and wherein each of the memory stack structures comprises a vertical semiconductor channel and a vertical stack of memory elements; and filling each of the second line trenches with a respective laterally alternating sequence of active region assemblies of NOR memory lateral field effect transistors and second dielectric pillar structures, and wherein each of the active region assemblies of the NOR memory lateral field effect transistors comprises a source pillar, a drain pillar, and a tubular channel region contacting the source pillar and the drain pillar, wherein the first spacer material strips and the second spacer material strips comprise, or are subsequently replaced with, first electrically conductive strips and second electrically conductive strips, respectively.

BRIEF DESCRIPTION OF THE DRAWINGS

FIG. 5A is a schematic vertical cross-sectional view of the exemplary structure after formation of sacrificial line trench fill structures according to an embodiment of the present disclosure.

FIG. 16A is a schematic vertical cross-sectional view of the exemplary structure after formation of NOR semiconductor channels and NOR dielectric cores according to an embodiment of the present disclosure.

FIG. 24A is a schematic vertical cross-sectional view of the exemplary structure after formation of contact via structures according to an embodiment of the present disclosure.

DETAILED DESCRIPTION

Figure 1:
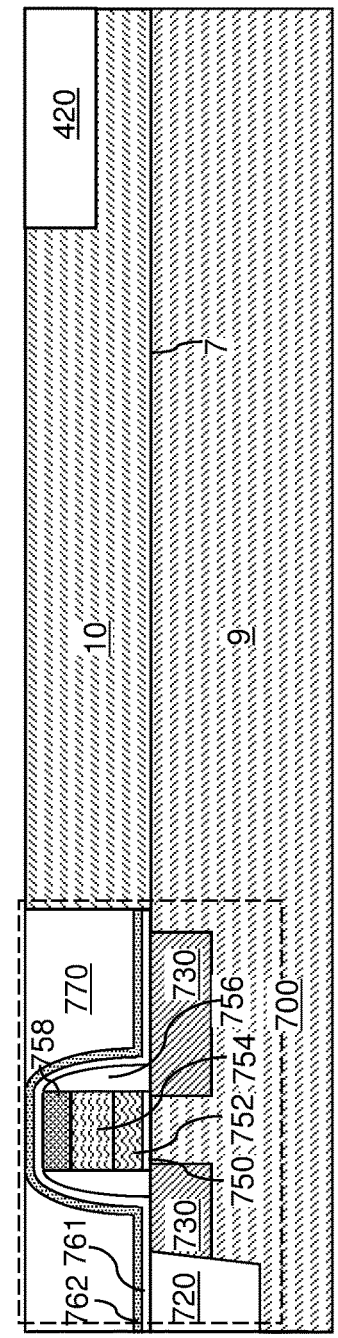
FIG. 1 is a schematic vertical cross-sectional view of an exemplary structure after formation of at least one peripheral device, a semiconductor material layer, and a dielectric isolation layer according to an embodiment of the present disclosure.

As discussed above, the embodiments of the present disclosure is directed to a three-dimensional NOR-NAND combination memory device and methods of manufacturing the same, the various aspects of which are now described in detail.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Referring to FIG. 1, an exemplary structure according to an embodiment of the present disclosure is illustrated, which can be employed, for example, to fabricate a device structure containing a three-dimensional array of NAND memory elements and a three-dimensional array of NOR memory elements on a same semiconductor substrate and within a single semiconductor die. The exemplary structure includes a substrate (9, 10), which can be a semiconductor substrate. The substrate can include a substrate semiconductor layer 9 and an optional semiconductor material layer 10. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-5}$ S/m to $1.0 \times 10^5$ S/m. As used herein, a "semiconductor material" refers to a material having electrical conductivity in the range from $1.0 \times 10^{-5}$ S/m to $1.0$ S/m in the absence of electrical dopants therein, and is capable of producing a doped material having electrical conductivity in a range from $1.0$ S/m to $1.0 \times 10^7$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to provide electrical conductivity greater than $1.0 \times 10^5$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^7$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors. A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 770. In one embodiment the planarized top surface of the planarization dielectric layer 770 can be coplanar with a top surface of the dielectric liners (761, 762). Subsequently, the planarization dielectric layer 770 and the dielectric liners (761, 762) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the substrate semiconductor layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 770 can be removed, for example, by chemical mechanical planarization (CMP). In this case, the semiconductor material layer 10 can have a top surface that is coplanar with the top surface of the planarization dielectric layer 770. In one embodiment, the semiconductor material layer 10 can have a doping of a first conductivity type.

The region (i.e., area) of the at least one semiconductor device 700 is herein referred to as a peripheral device region 200. The region in which a NAND memory array is subsequently formed is herein referred to as a first device region 100. The region in which a NOR memory array is subsequently formed is herein referred to as a second device region 400. The first device region 100 may be a first memory block, and the second device region 400 may be a second memory block. A contact region 300 for subsequently forming stepped terraces of electrically conductive strips can be provided between the first and second device regions (100, 400) and the peripheral device region 200.

A dielectric isolation layer 420 can be formed in an upper portion of the semiconductor material layer 10 within the second device region 400, for example, by recessing a portion of the semiconductor material layer 10 within the second device region 400, by depositing a dielectric fill material such as silicon oxide, and planarizing the dielectric fill material. A remaining portion of the dielectric fill material comprises the dielectric isolation layer 420. The thickness of the dielectric isolation layer 420 may be in a range from 30 nm to 300 nm, although lesser and greater thicknesses can also be employed. The dielectric isolation layer 420 can be employed to provide electrical isolation of NOR memory devices to be formed in the second device region 400 from the semiconductor material layer 10.

In one alternative embodiment, the peripheral device region 200 containing the at least one semiconductor device 700 for a peripheral circuitry may be located under the first device region 100 in a CMOS under array configuration. In another alternative embodiment, the peripheral device region 200 may be located on a separate substrate which is subsequently bonded to the first device region 100.

Figure 2:
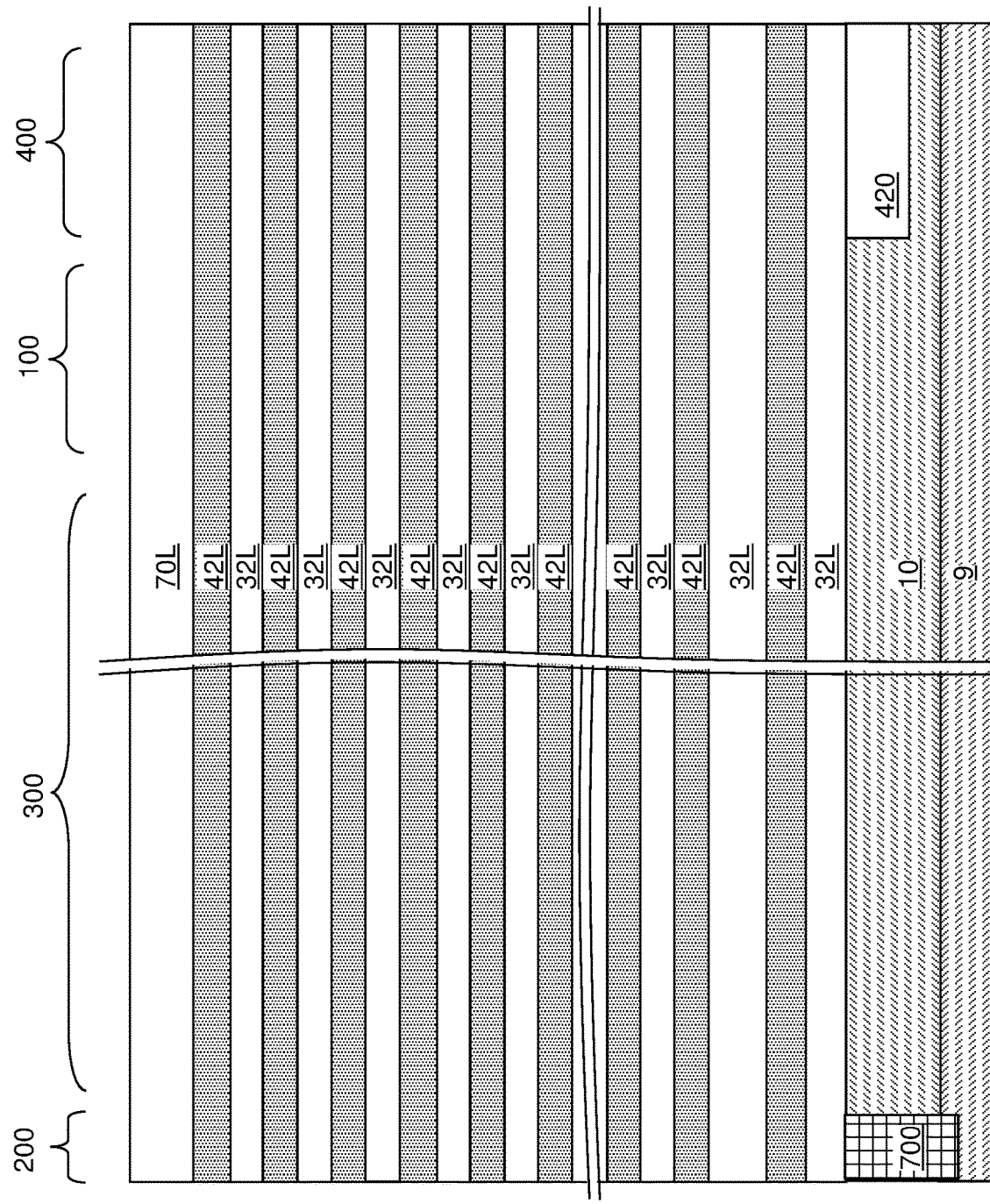
FIG. 2 is a schematic vertical cross-sectional view of the exemplary structure after formation of a vertically alternating sequence of insulating layers and spacer material layers according to an embodiment of the present disclosure.

Referring to FIG. 2, a vertically alternating sequence of first material layers (such as insulating layers 32L) and second material layers (such as spacer material layers) is formed over the substrate (9, 10). As used herein, a "vertically alternating sequence" refers to an alternating sequence of multiple instances of a first element and multiple instances of a second element that alternate vertically such that an instance of the second element overlies and/or underlies each instance of the first element, and an instance of the first element overlies and/or underlies each instance of the second element. The vertically alternating sequence can include a stack of an alternating plurality of first material layers (which can be insulating layers 32L) and second material layers (which can be sacrificial material layer 42L). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. Thus, a vertically alternating sequence of first elements and second elements is an alternating plurality of the first elements and the second elements in which the alternating of the first elements and second elements occurs along the vertical direction. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer can be an insulating layer 32L including an insulating material, and each second material layer can provide vertical spacing between each vertically neighboring pair of insulating layers 32L. As such, each second material layers are herein referred to as spacer material layers. The second material of the spacer material layers can be an electrically conductive material, or can be a sacrificial material that is subsequently replaced with an electrically conductive material to form electrically conductive strips. In one embodiment, each first material layer can be an insulating layer 32L, and each second material layer can be a sacrificial material layer. In this case, the stack can include an alternating plurality of insulating layers 32L and sacrificial material layers 42L, and constitutes a prototype stack of alternating layers comprising insulating layers 32L and sacrificial material layers 42L. As used herein, a "prototype" structure or an "in-process" structure refers to a transient structure that is subsequently modified in the shape or composition of at least one component therein. While the present disclosure is described employing an embodiment in which the spacer material layers are formed as sacrificial material layers 42L, embodiments are expressly contemplated herein in which the spacer material layers are formed as electrically conductive layers. In this case, the electrically conductive layers are divided into electrically conductive strips during formation of line trenches, and subsequent processing steps for replacing sacrificial material strips with electrically conductive strips can be omitted.

In one embodiment, the vertically alternating sequence (32L, 42L) can include insulating layers 32L composed of the first material, and sacrificial material layers 42L composed of a second material different from that of insulating layers 32L. The first material of the insulating layers 32L can be at least one insulating material. As such, each insulating layer 32L can be an insulating material layer. Insulating materials that can be employed for the insulating layers 32L include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32L can be silicon oxide.

The second material of the sacrificial material layers 42L is a sacrificial material that can be removed selective to the first material of the insulating layers 32L. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42L may comprise an insulating material, a semiconductor material, or a conductive material. The second material of the sacrificial material layers 42L can be subsequently replaced with electrically conductive electrodes which can function, for example, as control gate electrodes of a vertical NAND device and as gate electrodes of a vertical NOR device. Non-limiting examples of the second material include silicon nitride, an amorphous semiconductor material (such as amorphous silicon), and a polycrystalline semiconductor material (such as polysilicon). In one embodiment, the sacrificial material layers 42L can be spacer material layers that comprise silicon nitride or a semiconductor material including at least one of silicon and germanium.

In one embodiment, the insulating layers 32L can include silicon oxide, and sacrificial material layers can include silicon nitride sacrificial material layers. The first material of the insulating layers 32L can be deposited, for example, by chemical vapor deposition (CVD). For example, if silicon oxide is employed for the insulating layers 32L, tetraethyl orthosilicate (TEOS) can be employed as the precursor material for the CVD process. The second material of the sacrificial material layers 42L can be formed, for example, CVD or atomic layer deposition (ALD).

The thicknesses of the insulating layers 32L and the sacrificial material layers 42L can be in a range from 20 nm to 50 nm, although lesser and greater thicknesses can be employed for each insulating layer 32L and for each sacrificial material layer 42L. The number of repetitions of the pairs of an insulating layer 32L and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42L in the vertically alternating sequence (32L, 42L) can have a uniform thickness that is substantially invariant within each respective sacrificial material layer 42L.

Optionally, an insulating cap layer 70L can be formed over the vertically alternating sequence (32L, 42L). The insulating cap layer 70L includes a dielectric material that is different from the material of the sacrificial material layers 42L. In one embodiment, the insulating cap layer 70L can include a dielectric material that can be employed for the insulating layers 32L as described above. The insulating cap layer 70L can have a greater thickness than each of the insulating layers 32L. The insulating cap layer 70L can be deposited, for example, by chemical vapor deposition. In one embodiment, the insulating cap layer 70L can be a silicon oxide layer.

Figure 3A:
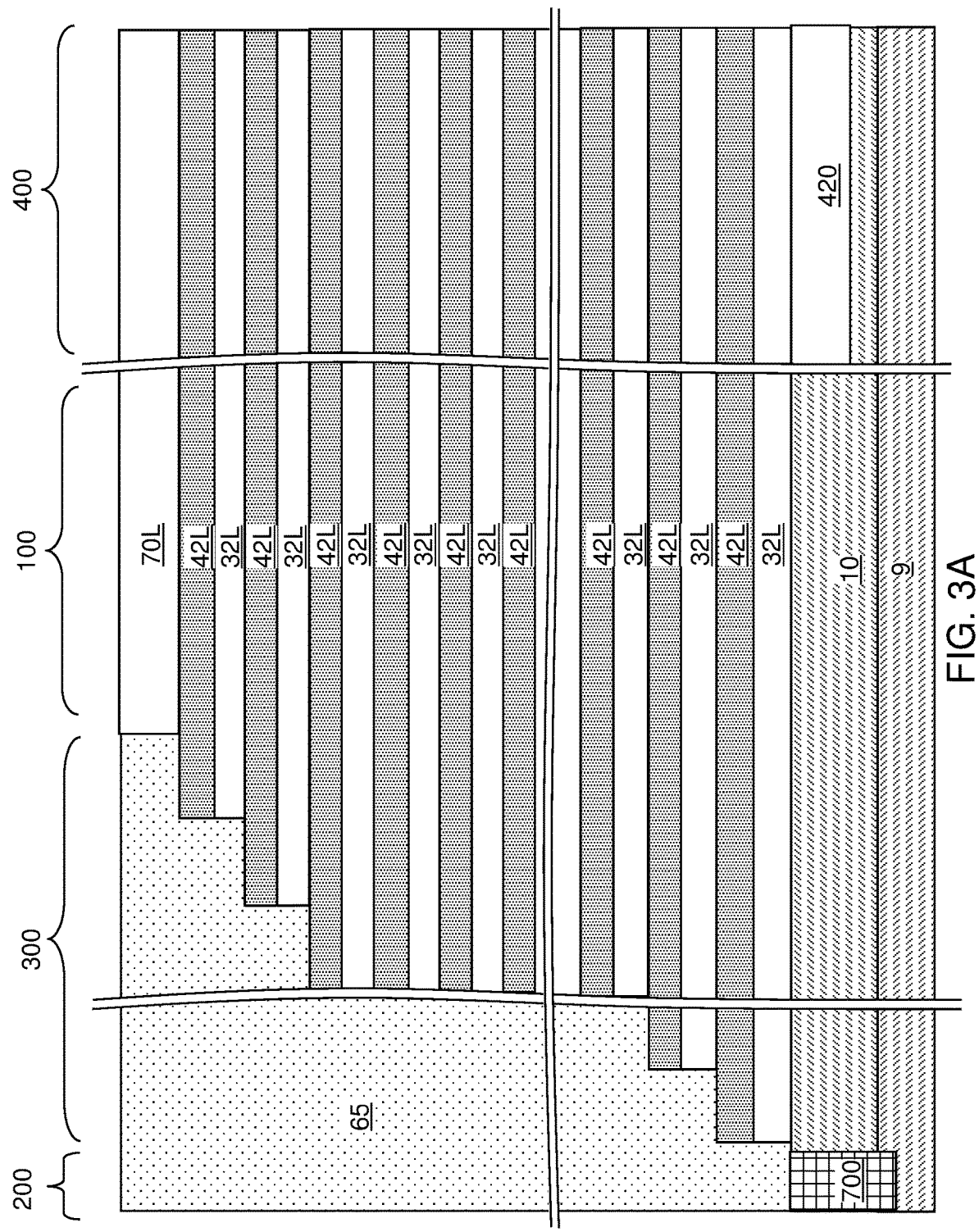
FIG. 3A is a schematic vertical cross-sectional view of the exemplary structure after formation of stepped terraces, a retro-stepped dielectric material portion, and a field isolation dielectric material portion according to an embodiment of the present disclosure.
Figure 3B:
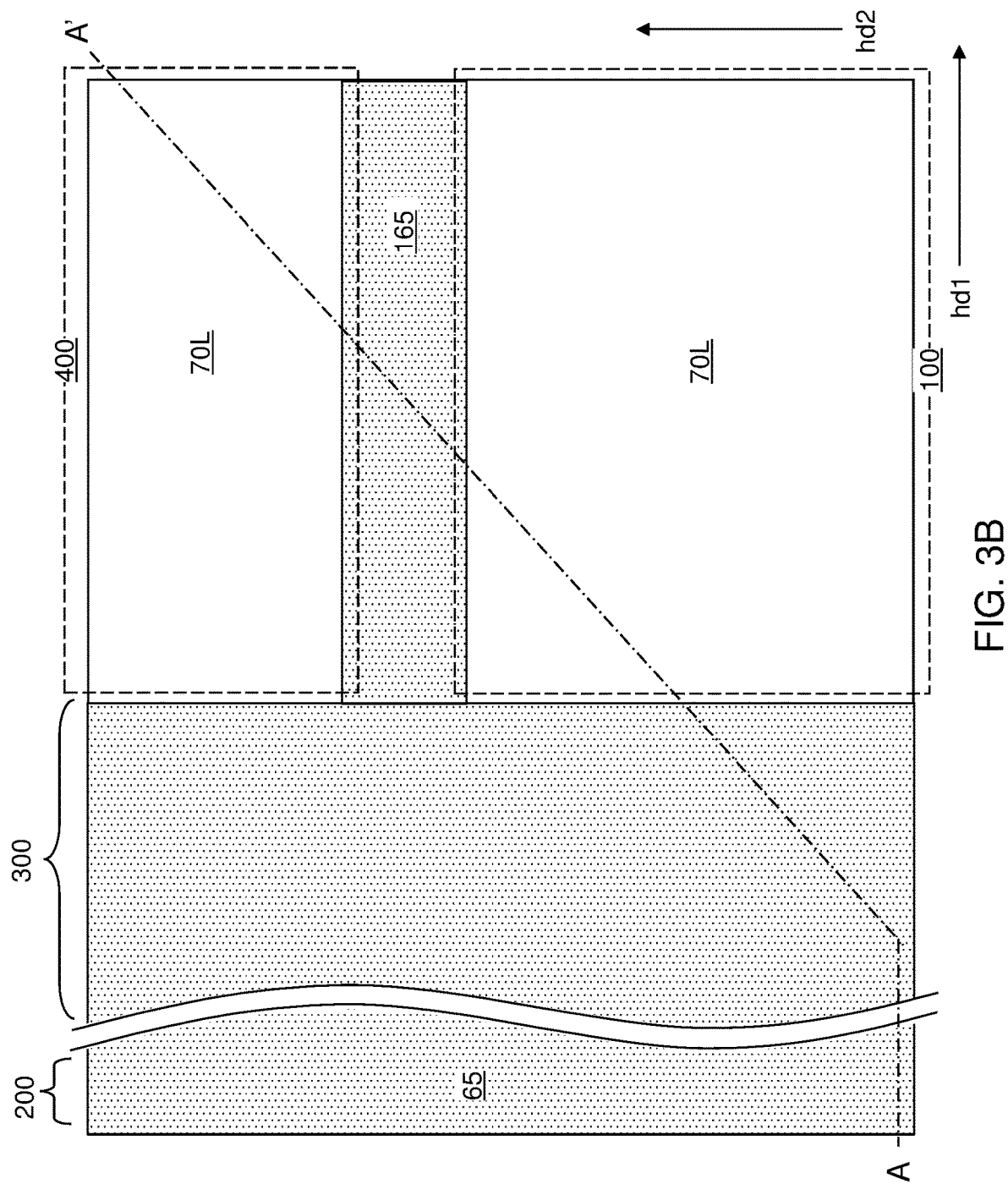
FIG. 3B is a top-down view of the exemplary structure of FIG. 3A. The vertical plane A-A' is the plane of the cross-section for FIG. 3A.

Referring to FIGS. 3A and 3B, the portion of the vertically alternating sequence of the insulating layers 32L and the spacer material layers (i.e., the sacrificial material layers 42L) located between the first device region 100 and the second device region 400 can be removed, for example, by applying a photoresist layer including an opening between the first device region 100 and the second device region 400, and by etching unmasked portions of the vertically alternating sequence of the insulating layers 32L and the spacer material layers. The photoresist layer can be subsequently removed, for example, by ashing. Further, the vertically alternating sequence of the insulating layers 32L and the spacer material layers (i.e., the sacrificial material layers 42L) can be patterned to form stepped surfaces that continuously extend from a bottommost layer of the vertically alternating sequence (32L, 42L) to a topmost layer of the alternating sequence (32L, 42L) in the contact region 300. A stepped cavity can be formed within the contact region 300 which is located between the first and second device regions (100, 400) and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Stepped surfaces are formed at a peripheral portion of the vertically alternating sequence (32L, 42L) through formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces. Generally, a terrace region is formed by patterning the vertically alternating sequence (32L, 42L). Each sacrificial material layer 42L other than a topmost sacrificial material layer 42L within the vertically alternating sequence (32L, 42L) laterally extends farther than any overlying sacrificial material layer 42L within the vertically alternating sequence (32L, 42L). The terrace region includes stepped surfaces of the vertically alternating sequence (32L, 42L) that continuously extend from a bottommost layer within the vertically alternating sequence (32L, 42L) to a topmost layer within the vertically alternating sequence (32L, 42L).

A dielectric material such as silicon oxide can be deposited in the cavity between the first device region 100 and the second device region 400 and in the stepped cavity. Excess portions of the deposited dielectric material can be removed from above the top surface of the insulating cap layer 70L, for example, by chemical mechanical planarization (CMP). A remaining portion of the dielectric material filling the cavity between the first device region 100 and the second device region 400 include a dielectric isolation structure 165. The dielectric isolation structure 165 is shown in FIG. 3B and is not shown in FIG. 3A because it is located in the cut-away area between the first device region 100 and the second device region 400 in the view of FIG. 3A. The dielectric isolation structure 165 may be an inter-block isolation structure which electrically isolates a first memory block located in the first device region 100 from a second memory block located in the second device region 400. A remaining portion of the deposited dielectric material filling the stepped cavity includes a retro-stepped dielectric material portion 65. The retro-stepped dielectric material portion 65 (i.e., an insulating fill material portion) can be formed in the stepped cavity by deposition of a dielectric material therein. As used herein, a "retro-stepped" element refers to an element that has stepped surfaces and a horizontal cross-sectional area that increases monotonically as a function of a vertical distance from a top surface of a substrate on which the element is present. If silicon oxide is employed for the dielectric isolation structure 165 and the retro-stepped dielectric material portion 65, the silicon oxide of the dielectric isolation structure 165 and the retro-stepped dielectric material portion 65 may, or may not, be doped with dopants such as B, P, and/or F.

Figure 4A:
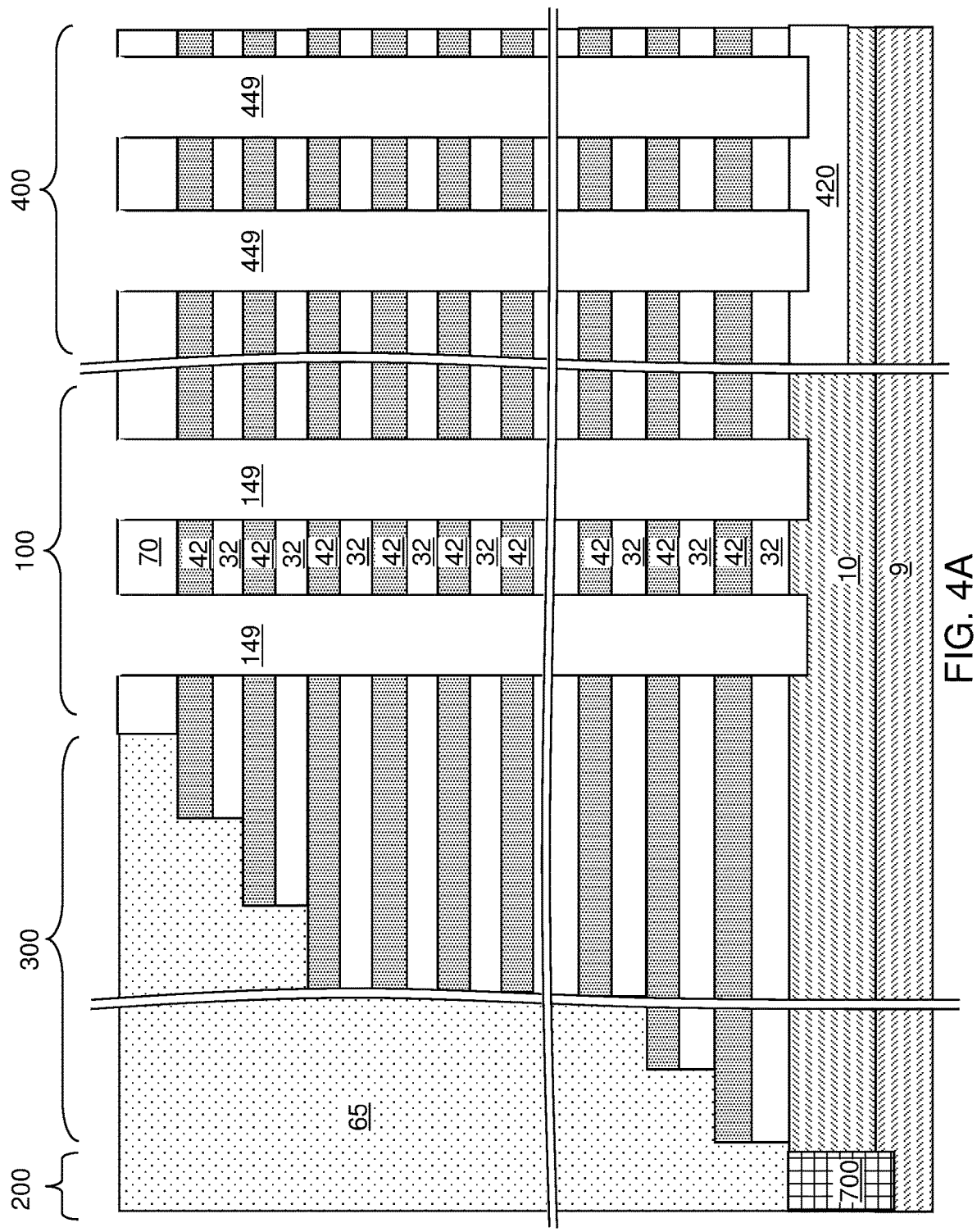
FIG. 4A is a schematic vertical cross-sectional view of the exemplary structure after formation of line trenches according to an embodiment of the present disclosure.
Figure 4B:
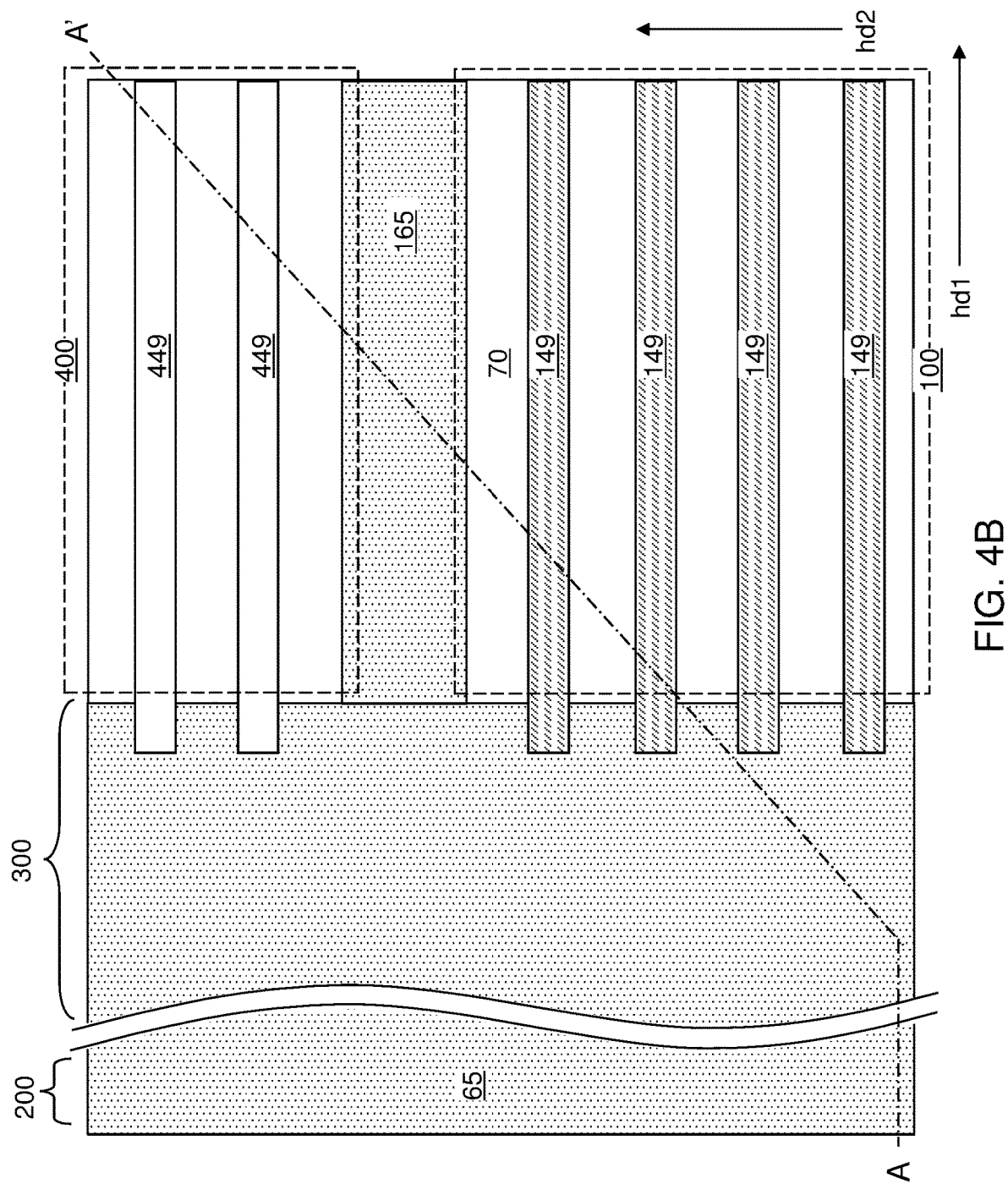
FIG. 4B is a top-down view of the exemplary structure of FIG. 4A. The vertical plane A-A' is the plane of the cross-section for FIG. 4A.

Referring to FIGS. 4A and 4B, a lithographic material stack (not shown) including at least a photoresist layer can be formed over the insulating cap layer 70L, the dielectric isolation structure 165, and the retro-stepped dielectric material portion 65, and can be lithographically patterned to form line-shaped openings therein. The line-shaped openings laterally extend along a first horizontal direction hd1, and have a uniform width along a second horizontal direction hd2 that is perpendicular to the first horizontal direction hd1. The pattern in the lithographic material stack can be transferred through the insulating cap layer 70L or the retro-stepped dielectric material portion 65, and through the vertically alternating sequence (32L, 42L) by at least one anisotropic etch that employs the patterned lithographic material stack as an etch mask. Portions of the vertically alternating sequence (32L, 42L) underlying the line-shaped openings in the patterned lithographic material stack are etched to form line trenches (149, 449), which include first line trenches 149 formed in the first device region 100 and second line trenches 449 formed in the second device region 400. As used herein, a "line trench" refers to a trench that has laterally extends straight along a horizontal direction.

In one embodiment, the line trenches (149, 449) laterally extend along the first horizontal direction hd1 (e.g., word line direction) through the vertically alternating sequence (32L, 42L). In one embodiment, the line trenches (149, 449) have a respective uniform width that is invariant under translation along the first horizontal direction hd1. In one embodiment, the line trenches (149, 449) within each device region (100, 400) can have the same width throughout, and the spacing between neighboring pairs of the line trenches (149, 449) can be the same. In this case, the line trenches (149, 449) can constitute a one-dimensional periodic array of line trenches (149, 449) having a pitch along a second horizontal direction hd2 that is perpendicular to the first horizontal direction hd1. The width of the line trenches (149, 449) along the second horizontal direction hd2 can be in a range from 30 nm to 500 nm, such as from 60 nm to 250 nm, although lesser and greater widths can also be employed. While the present disclosure is described employing an embodiment in which the first line trenches 149 and the second line trenches 449 laterally extend along a same horizontal direction (such as the first horizontal direction hd1), embodiments are expressly contemplated herein in which the first line trenches 149 and the second line trenches 449 laterally extend along different horizontal directions. In one embodiment, the first line trenches 149 can be formed as a one-dimensional periodic array of first line trenches 149, and the second line trenches 449 can be formed as a one-dimensional periodic array of second line trenches 449. The insulating cap layer 70L is divided into insulating cap strips 70.

The line trenches (149, 449) can extend through each layer of the vertically alternating sequence (32L, 42L) and the retro-stepped dielectric material portion 65. The chemistry of the anisotropic etch process employed to etch through the materials of the vertically alternating sequence (32L, 42L) can alternate to optimize etching of the first and second materials in the vertically alternating sequence (32L, 42L). The anisotropic etch can be, for example, a series of reactive ion etches. The sidewalls of the line trenches (149, 449) can be substantially vertical, or can be tapered. The patterned lithographic material stack can be subsequently removed, for example, by ashing.

The line trenches (149, 449) may laterally extend through the entire length of the first or second device regions (100, 400), and may laterally extend into the contact region 300. The line trenches (149, 449) may laterally extend through the entire contact region 300 along the first horizontal direction hd1, or may laterally extend only through part of a width, but not the entire width along the first horizontal direction hd1, of the contact region 300. In one embodiment, an overetch into the semiconductor material layer 10 may be optionally performed after the top surface of the semiconductor material layer 10 is physically exposed at a bottom of each line trench (149, 449). The overetch may be performed prior to, or after, removal of the lithographic material stack. In other words, the recessed surfaces of the semiconductor material layer 10 may be vertically offset from the unrecessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the line trenches (149, 449) can be coplanar with the topmost surface of the semiconductor material layer 10.

Each of the line trenches (149, 449) may include a sidewall (or a plurality of sidewalls) that extends substantially perpendicular to the topmost surface of the substrate. The substrate semiconductor layer 9 and the semiconductor material layer 10 collectively constitute a substrate (9, 10), which can be a semiconductor substrate. A surface of the semiconductor material layer 10 can be physically exposed at the bottom of each first line trench 149, and a surface of the dielectric isolation layer 420 can be physically exposed at the bottom of each second line trench 449. Alternatively, the semiconductor material layer 10 may be omitted, and the first line trenches 149 can extend to a top surface of the substrate semiconductor layer 9.

Generally, the first line trenches 149 can be formed in the first device region 100 and second line trenches 449 in the second device region 400. The vertically alternating sequence of the insulating layers 32L and the spacer material layers (such as the sacrificial material layers 42L) is divided into first alternating stacks of first insulating strips 32 and first spacer material strips (such as first sacrificial material strips 42) that are located in the first device region 100, and into second alternating stacks of second insulating strips 32 and second spacer material strips (such as second sacrificial material strips 42) that are located in the second device region 400. In other words, a first subset of the insulating strips 32 located within the first device region 100 is referred to as first insulating strips 32, and a second subset of the insulating strips 32 located within the second device region 400 is referred to as second insulating strips 32. A first subset of the sacrificial material strips 42 located within the first device region 100 is referred to as first sacrificial material strips 42, and a second subset of the sacrificial material strips 42 located within the second device region 400 is referred to as second sacrificial material strips 42.

In one embodiment, a total number of first insulating strips 32 within each first alternating stack (32, 42) is the same as a total number of second insulating strips 32 within each second alternating stack (32, 42), and a total number of first sacrificial material strips 42 within each first alternating stack (32, 42) is the same as a total number of second sacrificial material strips within each second alternating stack (32, 42). Each insulating strip 32 located at a same level can have the same material composition and the same thickness. Each sacrificial material strip 42 located at a same level can have the same material composition and the same thickness. In one embodiment, for each positive integer i that is not greater than a total number of first insulating strips 32 within each first alternating stack (32, 42), an i-th first insulating strip as counted upward from the substrate (9, 10) in each first alternating stack (32, 42) has a same thickness and a same material composition as an i-th second insulating strip 32 as counted upward from the substrate (9, 10) in each second alternating stack (32, 42). In one embodiment, for each positive integer j that is not greater than a total number of first sacrificial material strips 42 within each first alternating stack (32, 42), a j-th first sacrificial material strip as counted upward from the substrate (9, 10) in each first alternating stack (32, 42) has a same thickness and a same material composition as a j-th second sacrificial material strip 42 as counted upward from the substrate (9, 10) in each second alternating stack (32, 42).

Figure 5B:
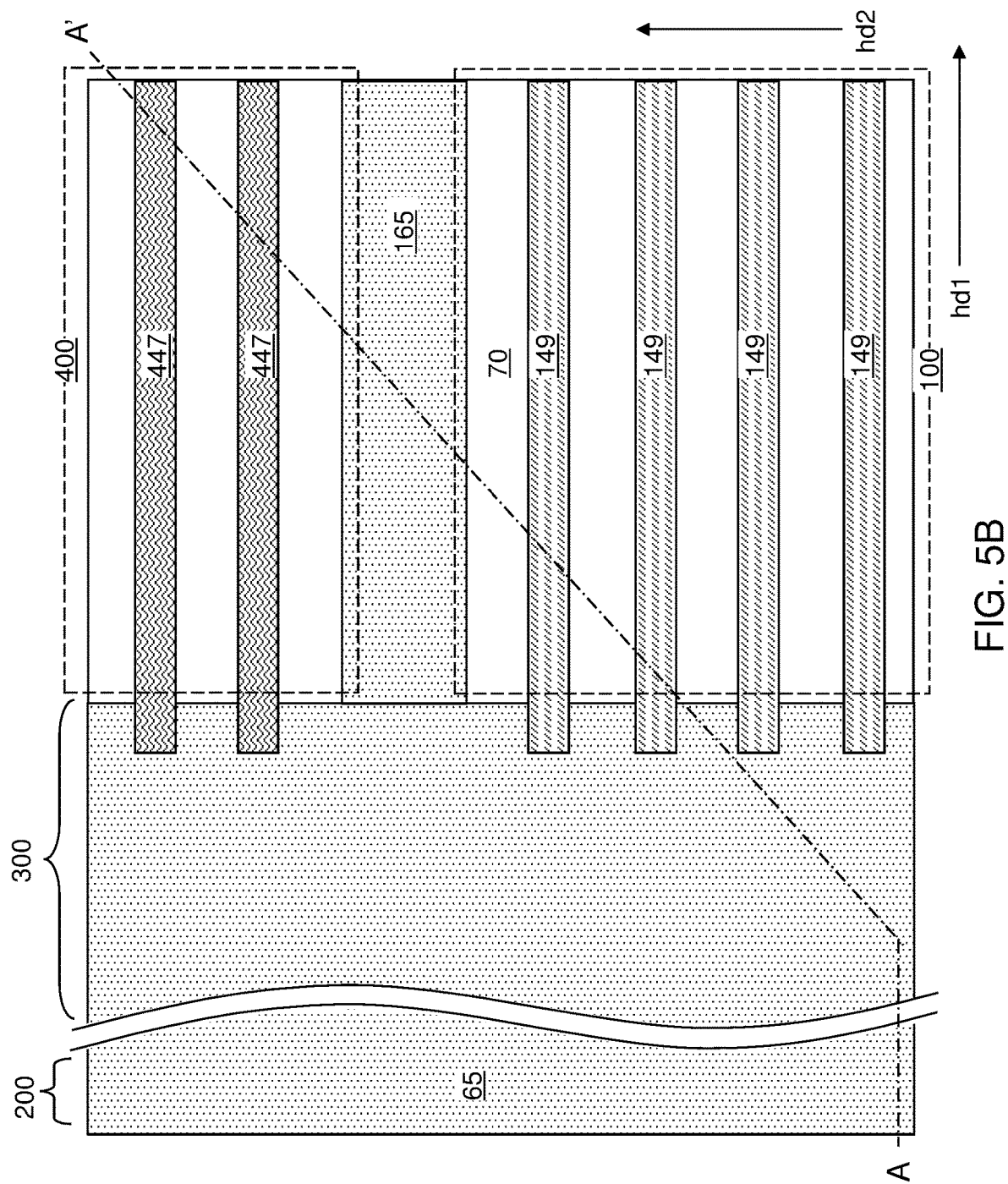
FIG. 5B is a top-down view of the exemplary structure of FIG. 5A. The vertical plane A-A' is the plane of the cross-section for FIG. 5A.

Referring to FIGS. 5A and 5B, a sacrificial trench fill material can be deposited in the first line trenches 149 and the second line trenches 449. Excess portions of the sacrificial trench fill material can be removed from above the horizontal plane including top surfaces of the insulating cap strips 70 by a planarization process, which can employ a recess etch process and/or a chemical mechanical planarization process. Each remaining portion of the sacrificial trench fill material that fills the first line trenches 149 and the second line trenches 449 constitute a sacrificial line trench fill structure 447. The sacrificial trench fill material includes a material that can be removed selective to materials of the insulating strips 32, the sacrificial material strips 42, the semiconductor material layer 10, and the dielectric isolation layer 420. For example, the sacrificial trench fill material may include amorphous silicon, amorphous carbon, diamond-like carbon (DLC), a silicon-germanium alloy, borosilicate glass (BSG), or a silicon-based polymer. Optionally, a sacrificial liner (not shown) may be employed to facilitate subsequent removal of each sacrificial line trench fill structure 447 selective to the materials of the insulating strips 32, the sacrificial material strips 42, the semiconductor material layer 10, and the dielectric isolation layer 420.

A photoresist layer (not shown) can be applied over the exemplary structure, and can be lithographically patterned to form an opening within the area of the first line trenches 149, while the area of the second line trenches 449 is covered with the photoresist layer. A first subset of the sacrificial line trench fill structures 447 filling the first line trenches 149 can be removed while the patterned photoresist layer protects a second subset of the sacrificial line trench fill structures 447 filling the second line trenches 449. The first line trenches 149 become vacant, and the second line trenches 449 are filled with a respective sacrificial line trench fill structure 447.

Figure 6:
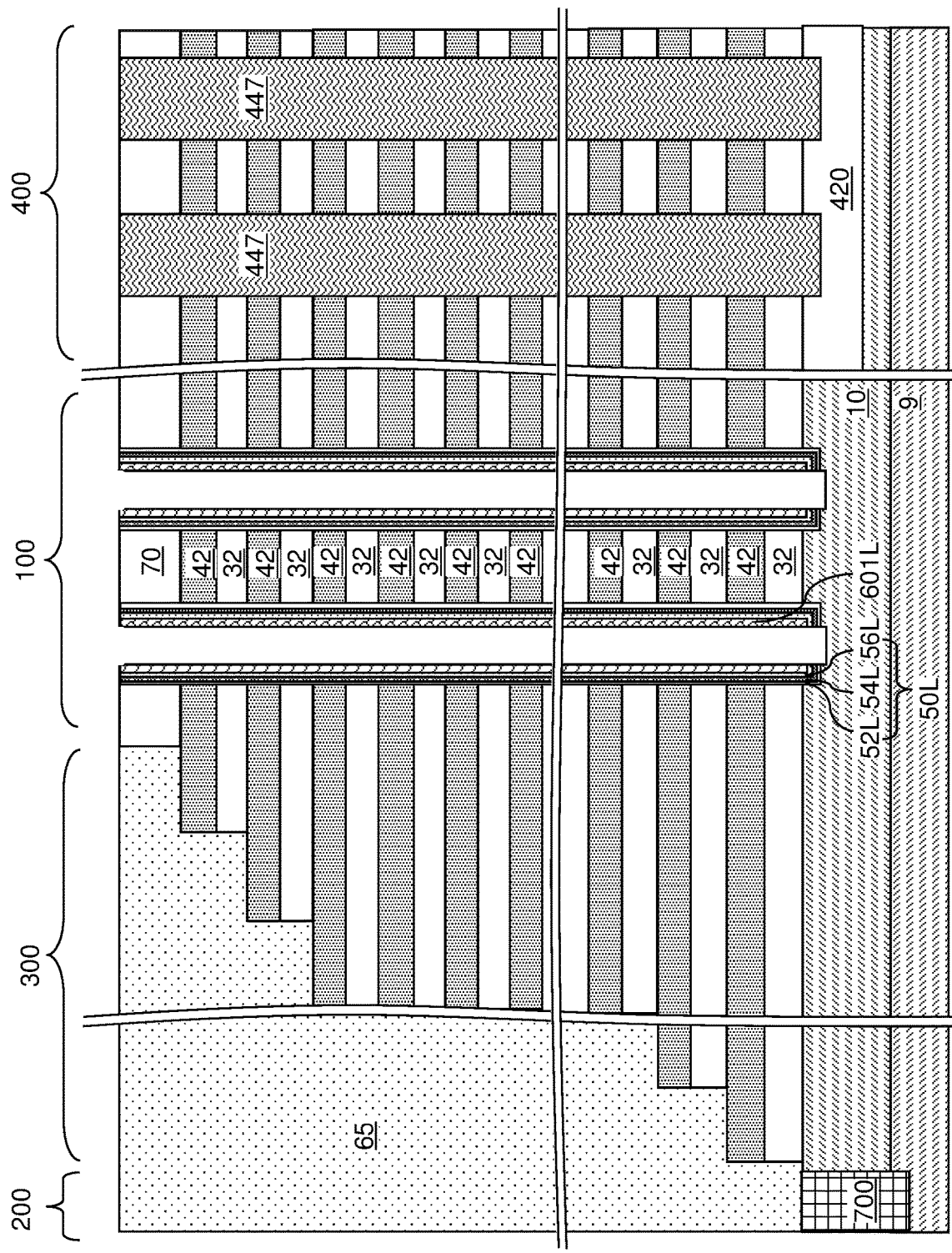
FIG. 6 is a schematic vertical cross-sectional view of the exemplary structure after formation of NAND memory films and first semiconductor channel material layers according to an embodiment of the present disclosure.

Referring to FIGS. 6A and 6B, a memory film is formed on each sidewall of the first line trenches 149. Each memory film formed on the sidewalls of the first line trenches 149 is subsequently employed as components of a three-dimensional NAND memory device, and thus, is herein referred to as a NAND memory film 50L. In one embodiment, the NAND memory films 50L can be formed by depositing a continuous NAND memory film in each of the first line trenches 149 and over the insulating cap strips 70, and by anisotropically etching horizontal portions of the continuous NAND memory film. Each remaining vertically-extending portion of the continuous NAND memory film constitutes a NAND memory film 50L.

In one embodiment, the continuous NAND memory film can include a layer stack that contains a continuous blocking dielectric material layer, a continuous charge storage material layer, and a continuous tunneling dielectric material layer. In this case, each NAND memory film 50L can include a layer stack that contains a respective blocking dielectric layer 52L, a respective charge storage layer 54L, and a respective tunneling dielectric layer 56L. Each blocking dielectric layer 52L can include a dielectric metal oxide (such as aluminum oxide) and/or silicon oxide, and can have a thickness in a range from 2 nm to 20 nm, although lesser and greater thicknesses can also be employed. Each charge storage layer 54L includes a charge storage material such as silicon nitride, and can have a thickness in a range from 2 nm to 20 nm, although lesser and greater thicknesses can also be employed. Generally, each charge storage layer 54L may be replaced with any vertical stack of memory elements that can store electrical charges such as a vertical stack of floating gate structures. Each tunneling dielectric layer 56L includes a tunneling dielectric material such as an ONO stack (i.e., a layer stack including a first silicon oxide layer, a silicon nitride layer, and a second silicon oxide layer). Each tunneling dielectric layer 56L can have a thickness in a range from 2 nm to 10 nm, although lesser and greater thicknesses can also be employed.

In one embodiment, an optional first continuous semiconductor channel material layer can be deposited on the continuous NAND memory film prior to patterning the continuous NAND memory film into a plurality of NAND memory films 50L. The first continuous semiconductor channel material layer can include a semiconductor channel material such as amorphous silicon, polysilicon, or a compound semiconductor material. The first continuous semiconductor channel material layer can have a doping of a first conductivity type, which may be p-type or n-type, or it may be intrinsic (i.e., not intentionally doped). The thickness of the first continuous semiconductor channel material layer can be in a range from 1 nm to 6 nm, although lesser and greater thicknesses can also be employed. The first continuous semiconductor channel material layer can be divided into first semiconductor channel material layers 601L by the anisotropic etch process, which etches horizontally-extending portions of the first continuous semiconductor channel material layer and the continuous NAND memory film. A rectangular opening can be formed through each first semiconductor channel material layer 601L and each NAND memory film 50L, and a surface of the semiconductor material layer 10 (or a surface of the substrate semiconductor layer 9) can be physically exposed within the rectangular opening underneath each first line cavity 149.

Generally, NAND memory film 50L can be formed on each sidewall of the first line trenches 149. Each of the NAND memory films 50L contacts a sidewall of a respective one of the first line trenches 149. In one embodiment, each of the NAND memory films 50L can comprise a layer stack including a blocking dielectric layer 52L, a charge storage layer 54L, and a tunneling dielectric layer 56L. Alternatively, the charge storage layer 54L may be replaced with floating gate structures within each NAND memory film 50L. Yet alternately, each NAND memory film 50L may comprise, and/or may consist essentially of, a ferroelectric dielectric layer for forming a three-dimensional NAND array including ferroelectric memory cells.

Figure 7:
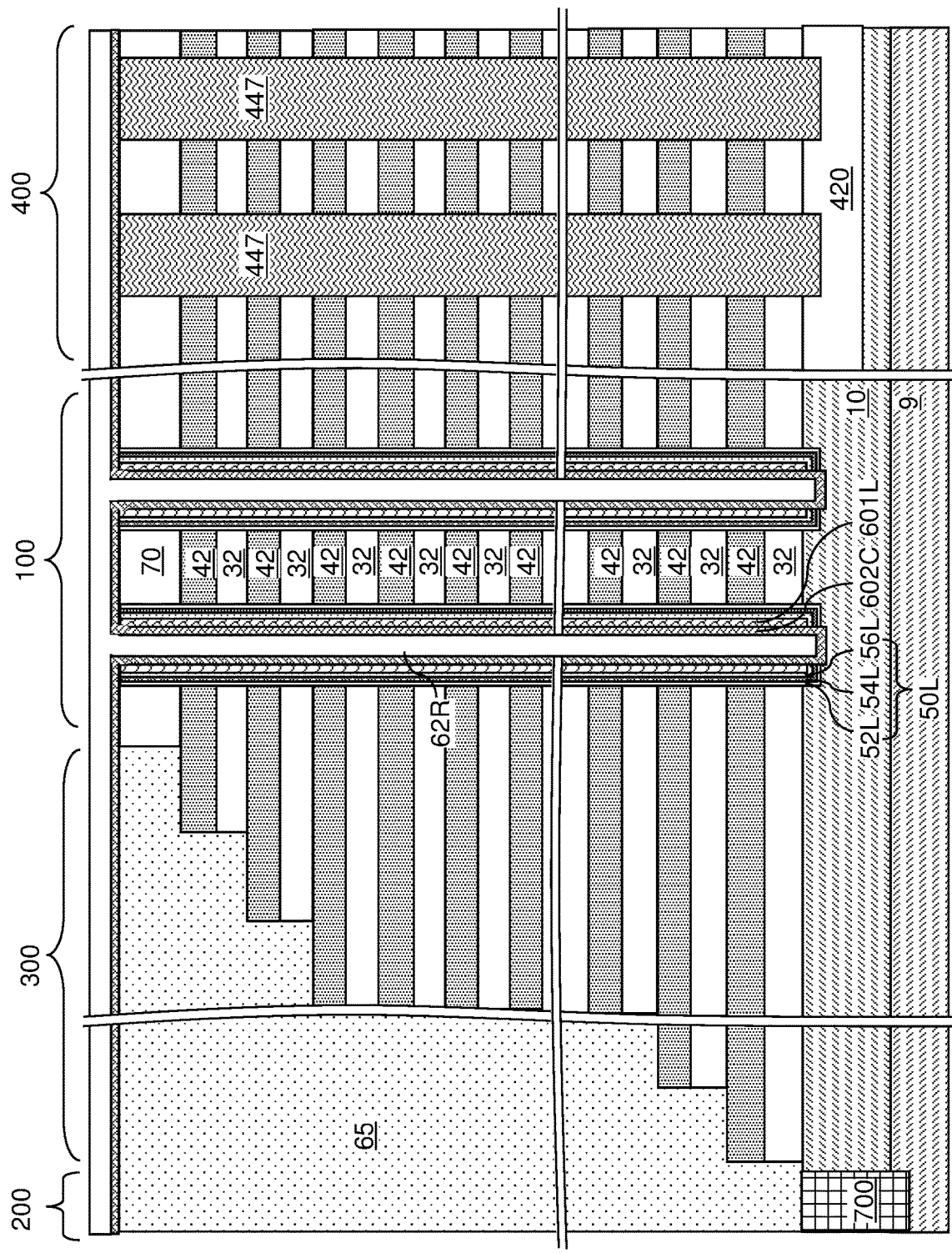
FIG. 7 is a schematic vertical cross-sectional view of the exemplary structure after formation of a second semiconductor channel material layer according to an embodiment of the present disclosure.

Referring to FIG. 7, a second continuous semiconductor channel material layer 602C can be deposited on the physically exposed surfaces of the first semiconductor channel material layers 601L (if present) and on the physically exposed surfaces of the semiconductor material layer 10 (or the substrate semiconductor layer 9). The second continuous semiconductor channel material layer 602C can include a semiconductor channel material such as amorphous silicon, polysilicon, or a compound semiconductor material. The semiconductor channel material of the second continuous semiconductor channel material layer 602C may be the same as, or may be different from, the semiconductor channel material of the first semiconductor channel material layers 601L. The second continuous semiconductor channel material layer 602C can be intrinsic (i.e., not intentionally doped) or it can have a doping of the first conductivity type, which can be the same as the conductivity type of the semiconductor material layer 10 (or can be the same as the conductivity type of the substrate semiconductor layer 9 in case the semiconductor material layer 10 is not present). The thickness of the second continuous semiconductor channel material layer 602L can be in a range from 2 nm to 20 nm, although lesser and greater thicknesses can also be employed. The second continuous semiconductor channel material layer 602C contacts semiconductor surfaces that underlie the openings through the NAND memory films 50L. Generally, at least one semiconductor channel material layer (601L, 602C) can be deposited over each NAND memory film 50L, and can be subsequently divided into discrete vertically-extending semiconductor material strips to provide vertical semiconductor channels.

Figure 8A:
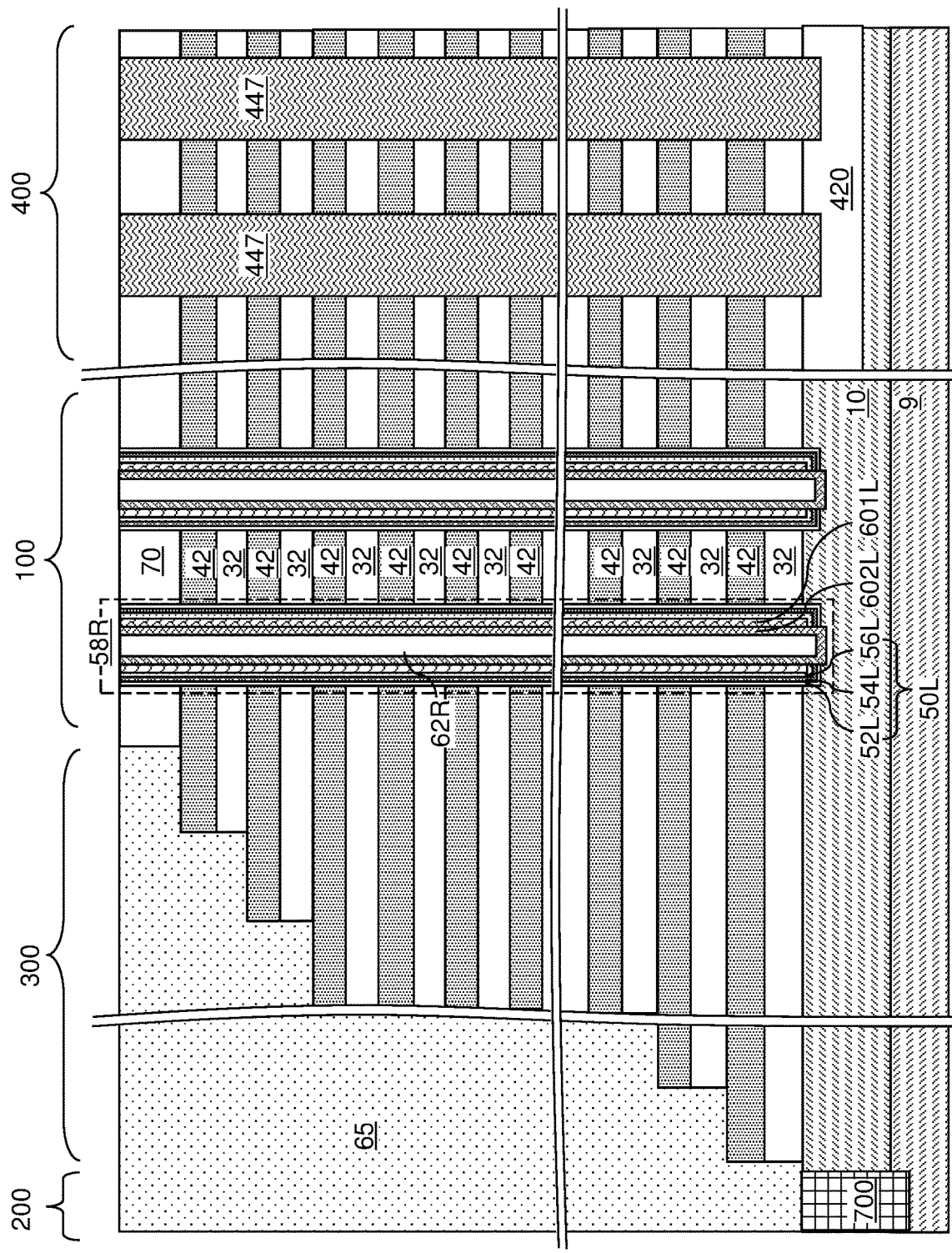
FIG. 8A is a schematic vertical cross-sectional view of the exemplary structure after formation of first line trench fill structures according to an embodiment of the present disclosure.
Figure 8B:
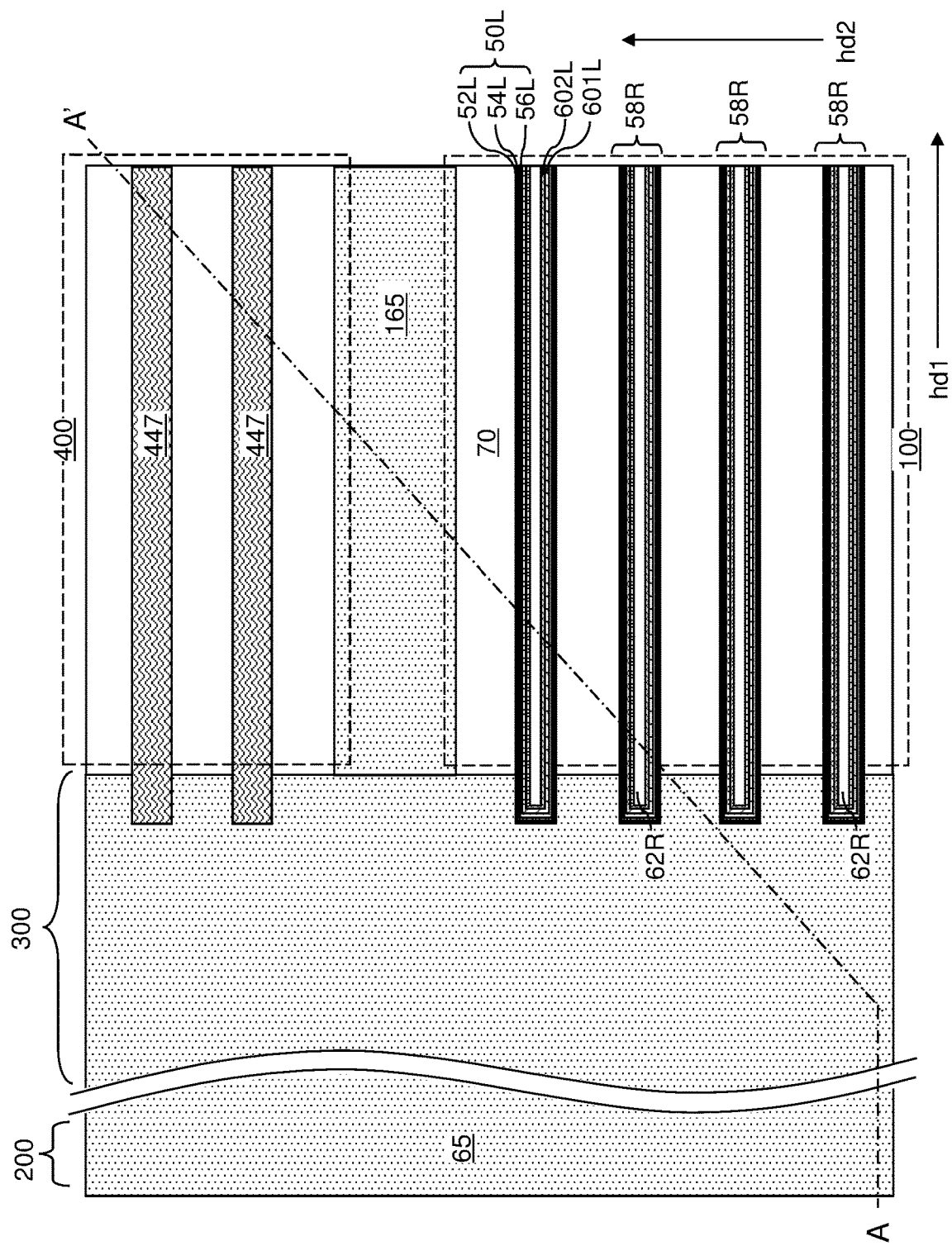
FIG. 8B is a top-down view of the exemplary structure of FIG. 8A. The vertical plane A-A' is the plane of the cross-section for FIG. 8A.

Referring to FIGS. 8A and 8B, a dielectric fill material such as undoped silicate glass or a doped silicate glass can be deposited in unfilled volumes of the first line trenches 149 by a conformal deposition process or by spin-coating. Excess portions of the dielectric fill material can be removed from above the horizontal plane including the top surfaces of the insulating cap strips 70 by a planarization process, which may employ a recess etch process or a chemical mechanical planarization process. Each remaining portion of the dielectric fill material that fills a respective first line trench 149 constitutes a dielectric core rail 62R that laterally extends along the lengthwise direction of the respective first line trench 149. Each remaining portion of the second continuous semiconductor channel material layer 602C is herein referred to as a second semiconductor channel material layer 602L.

The combination of all material portions that fills a first line trench 149 is herein referred to as an in-process first line trench fill structure 58R. Each in-process first line trench fill structure 58R includes a NAND memory film 50L, at least one semiconductor channel material layer (601L, 602L), and a dielectric core rail 62R. In one embodiment, each NAND memory film 50L can have a tubular configuration with a pair of lengthwise outer sidewalls and a pair of lengthwise inner sidewalls that laterally extend along a horizontal direction such as the first horizontal direction hd1. In one embodiment, the at least one semiconductor channel material layer (601L, 602L) can have a tubular configuration with a pair of lengthwise outer sidewalls and a pair of lengthwise inner sidewalls that laterally extend along a horizontal direction such as the first horizontal direction hd1. The dielectric core rail 62R can laterally extend along a lengthwise direction with a uniform width throughout.

While the present disclosure is described employing an embodiment in which the sidewalls of each line trench (149, 449) are straight, embodiments are expressly contemplated in which the sidewalls of at least a subset of the line trenches (149, 449) have lateral undulation along the width direction. Further, embodiments are expressly contemplated herein in which at least a subset of the line trenches (149, 449) has a periodic width modulation in lieu of a uniform width to enhance performance of NAND memory cells and/or NOR memory cells to be formed.

Figure 9:
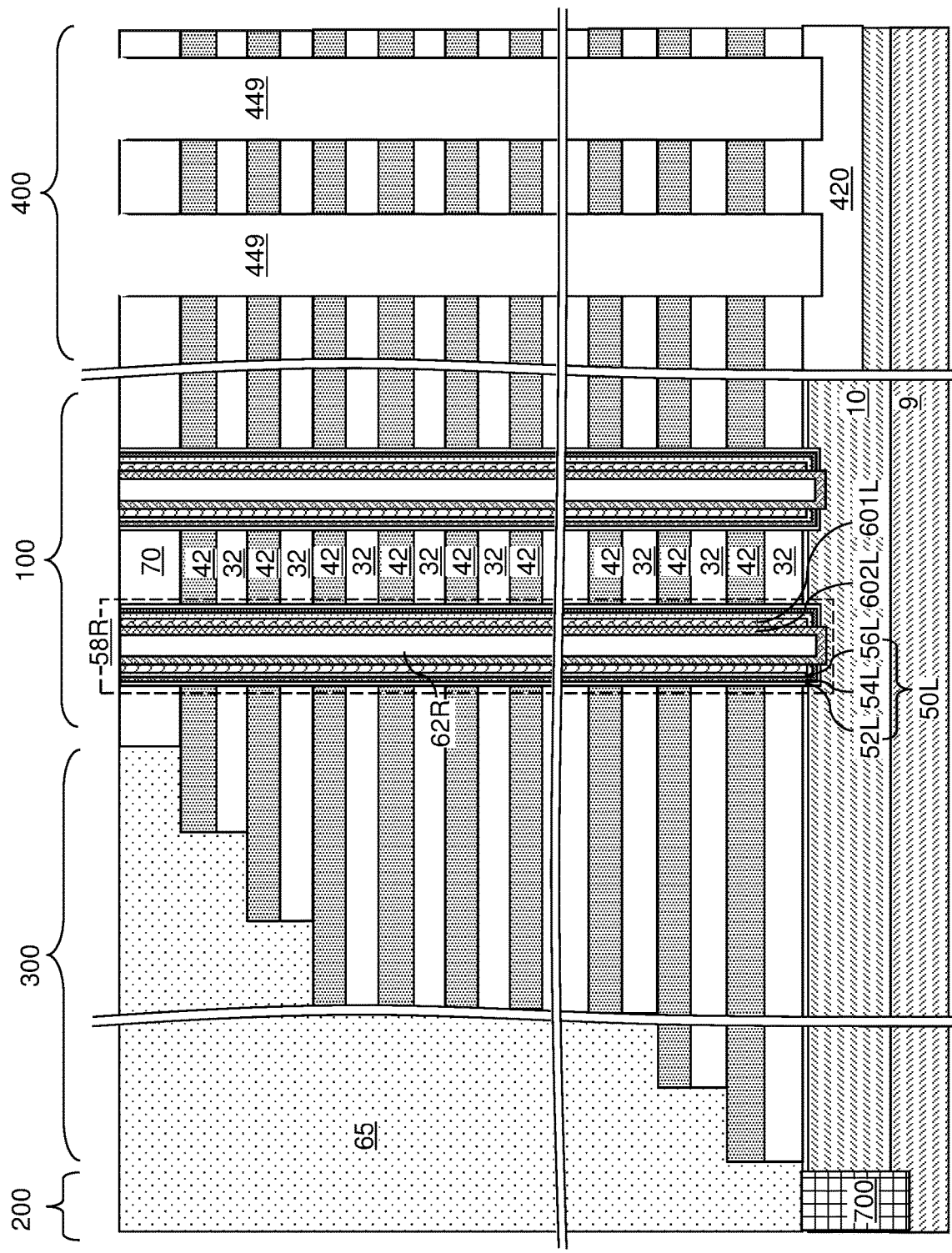
FIG. 9 is a schematic vertical cross-sectional view of the exemplary structure after removal of the sacrificial line trench fill structures from second line trenches according to an embodiment of the present disclosure.

Referring to FIG. 9, the sacrificial line trench fill structures 447 can be removed from second line trenches 449 selective to the materials of the insulating strips 32, the sacrificial material strips 42, and the dielectric isolation layer 420. For example, a photoresist layer (not shown) can be applied over the exemplary structure, and can be lithographically patterned to form an opening in the areas including the sacrificial line trench fill structures 447. An etch process (such as a wet etch process or a dry etch process) or an ashing process can be employed to remove the sacrificial line trench fill structures 447. The volumes of the second line trenches 449 become vacant, and surfaces of the dielectric isolation layer 420 can be physically exposed at the bottom of each second line trench 449.

Figure 10:
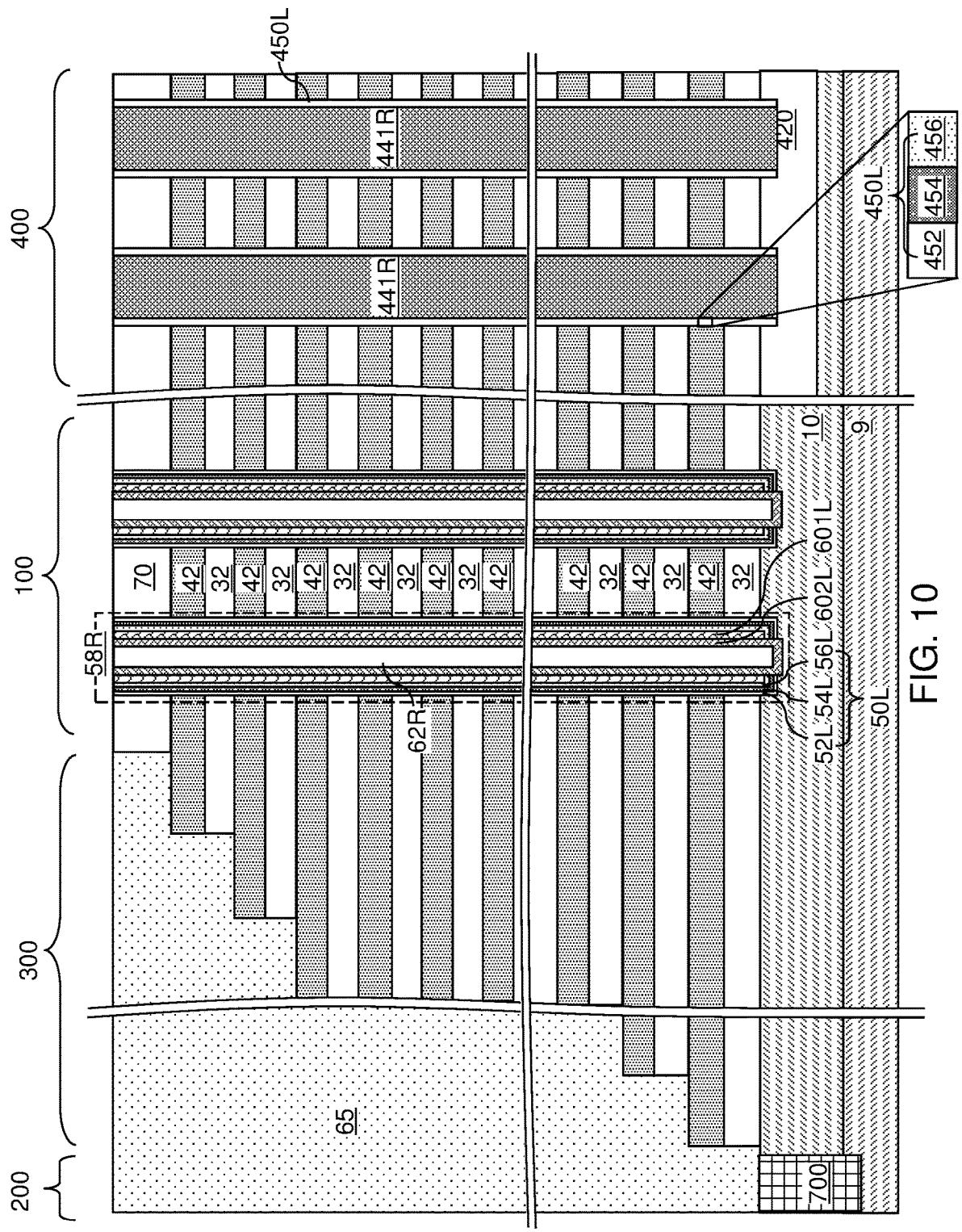
FIG. 10 is a schematic vertical cross-sectional view of the exemplary structure after formation of a NOR memory film and a sacrificial fill material rail in each second line trench according to an embodiment of the present disclosure.

Referring to FIG. 10, a NOR memory film 450L and a sacrificial fill material rail 441R can be formed in each second line trench 449. For example, a continuous memory film including at least one memory material layer can be conformally deposited on each physically exposed sidewall of the second line trenches 449 and on other physically exposed horizontal surfaces of the exemplary structure, and an anisotropic etch process may be performed to remove horizontal portions of the continuous memory film. Each remaining vertically-extending portion of the memory film constitutes a memory film that is subsequently employed to provide a NOR memory device. As such, each memory film formed on the sidewalls of the second line trenches 449 is herein referred to as a NOR memory film 450L.

In one embodiment, each NOR memory film 450L may include a layer stack that contains a blocking dielectric layer 452, a charge storage layer 454, and a tunneling dielectric layer 456. Each blocking dielectric layer 452 can include a dielectric metal oxide (such as aluminum oxide) and/or silicon oxide, and can have a thickness in a range from 2 nm to 20 nm, although lesser and greater thicknesses can also be employed. Each charge storage layer 454 includes a charge storage material such as silicon nitride, and can have a thickness in a range from 2 nm to 20 nm, although lesser and greater thicknesses can also be employed. In one embodiment, each charge storage layer 454 may be replaced with any vertical stack of memory elements that can store electrical charges such as a vertical stack of floating gate structures. Each tunneling dielectric layer 456 includes a tunneling dielectric material such as an ONO stack (i.e., a layer stack including a first silicon oxide layer, a silicon nitride layer, and a second silicon oxide layer). Each tunneling dielectric layer 456L can have a thickness in a range from 2 nm to 10 nm, although lesser and greater thicknesses can also be employed. Alternately, each NOR memory film 450L may comprise, and/or may consist essentially of, a ferroelectric dielectric layer for forming a three-dimensional NOR array including ferroelectric memory cells.

Generally, a NOR memory film 450L can be formed on each sidewall of the second line trenches 449. Each of the second line trenches 449 comprises lengthwise sidewalls that are contacted by a respective NOR memory film 450L. In one embodiment, each of the NOR memory films 450L comprises a ferroelectric dielectric layer or a layer stack containing a blocking dielectric layer 452, a charge storage layer 454, and a tunneling dielectric layer 456.

The sacrificial fill material can be deposited in unfilled volumes of the second line trenches 449 on sidewalls of the NOR memory films 450L. Excess portions of the sacrificial fill material can be removed from above the horizontal plane including the top surfaces of the insulating cap strips 70 by a planarization process, which may include a recess etch process and/or a chemical mechanical planarization process. Each remaining portion of the sacrificial fill material that fills a respective one of the second line trenches 449 constitutes a sacrificial fill material rail 441R. The sacrificial fill material of the sacrificial fill material rail 441R can include a material that can provide similar etch characteristics during a subsequent anisotropic etch process as the material of the dielectric core rails 62R, and may, or may not, be the same as the material of the dielectric core rails 62R. In one embodiment, the sacrificial fill material of the sacrificial fill material rail 441R may include an insulating material, such as silicon nitride, undoped silicate glass, a doped silicate glass, or silicon carbide nitride.

Figure 11A:
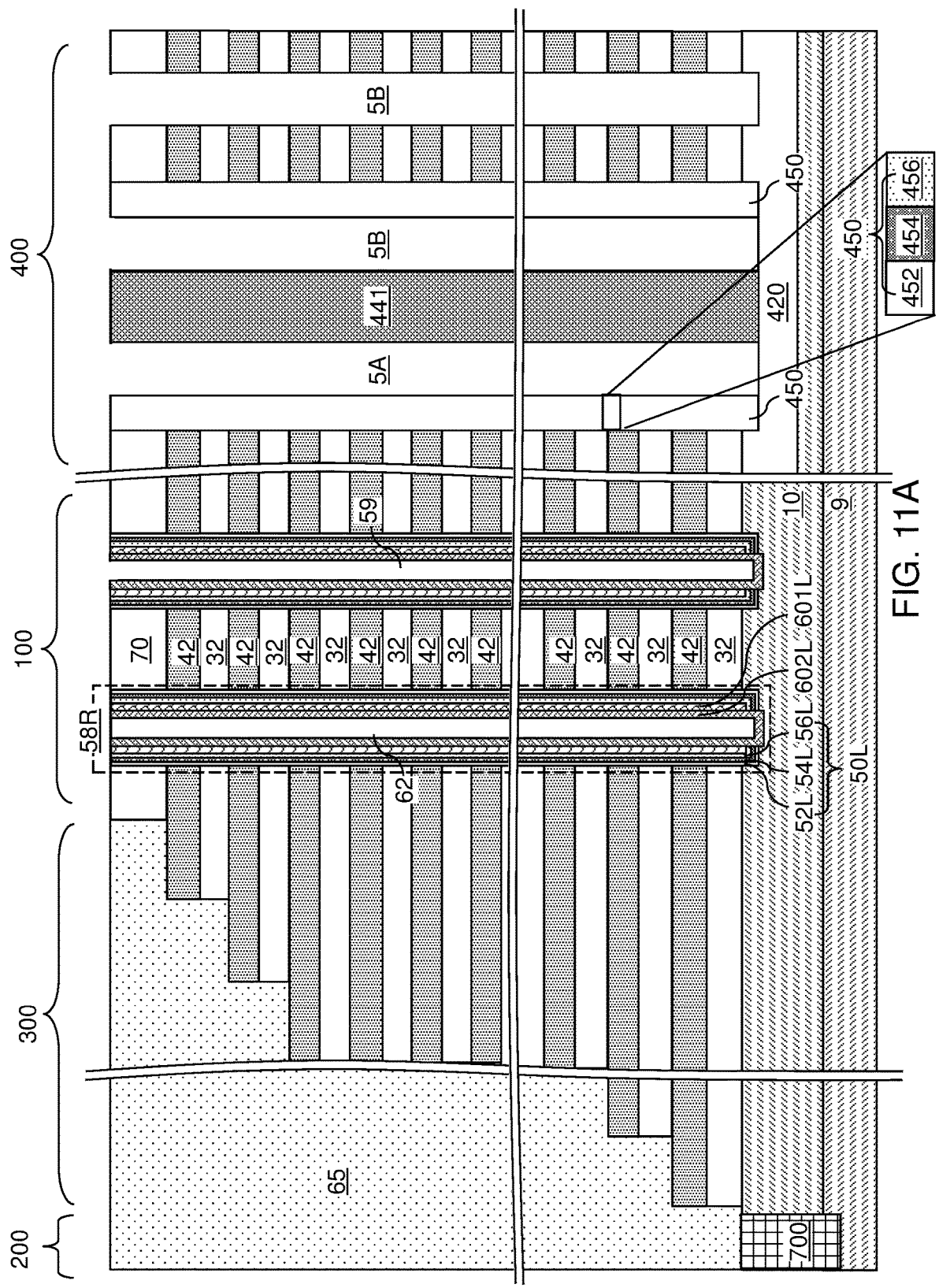
FIG. 11A is a schematic vertical cross-sectional view of the exemplary structure after formation of sacrificial pillar structures and first pillar cavities according to an embodiment of the present disclosure.
Figure 11B:
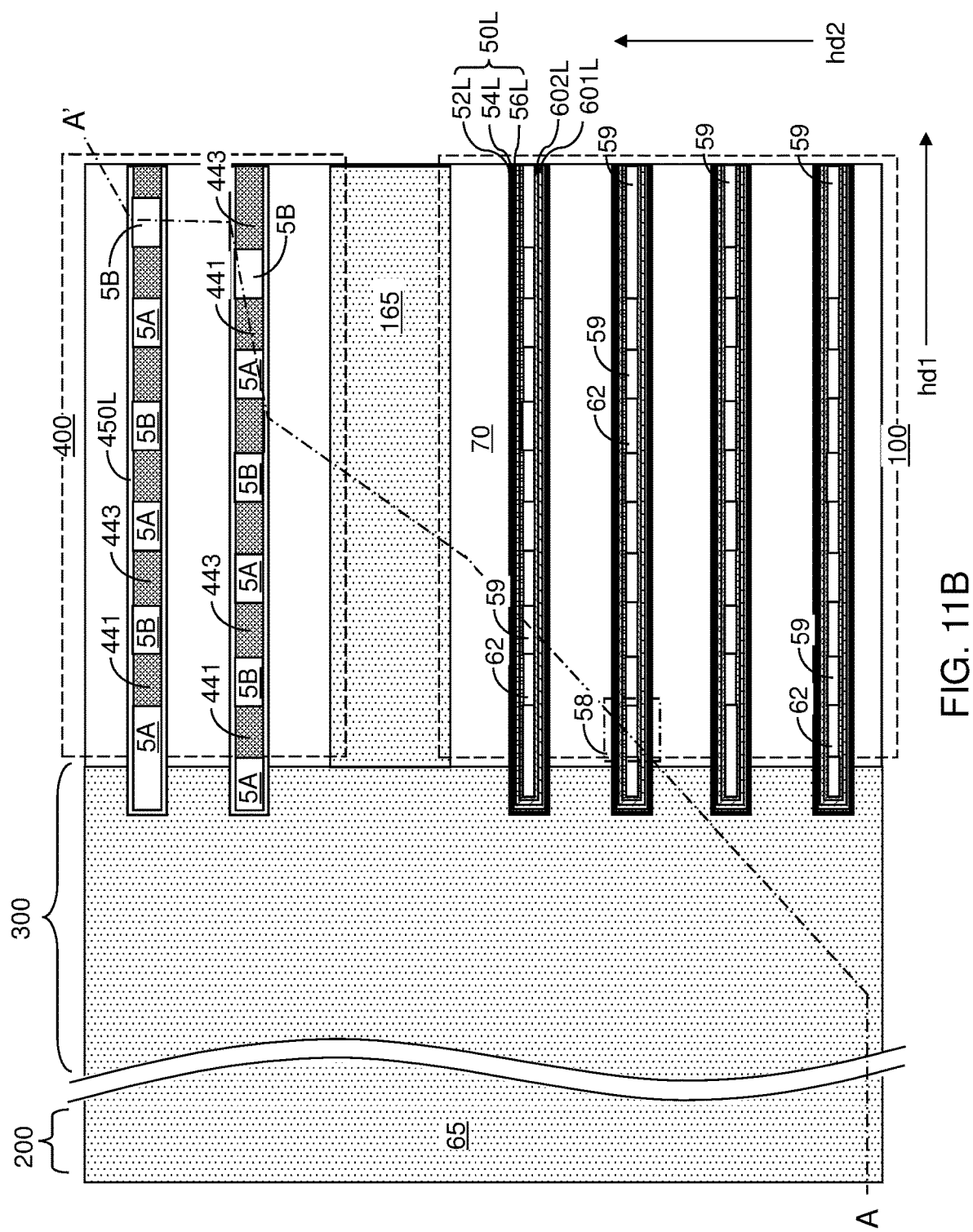
FIG. 11B is a top-down view of the exemplary structure of FIG. 11A. The vertical plane A-A' is the plane of the cross-section for FIG. 11A.

Referring to FIGS. 11A and 11B, a patterned etch mask layer (not shown) can be formed over the exemplary structure. For example, the patterned etch mask layer can include a photoresist layer that is applied over the exemplary structure, and is subsequently lithographically patterned to form a first array of openings in the first device region 100 and to form a second array of openings in the second device region 400. The first array of openings in the first device region 100 includes rows of openings that overlie the dielectric core rails 62R. Each row of openings in the patterned photoresist layer in the first device region 100 overlies a respective dielectric core rail 62R. The second array of openings in the second device region 400 includes rows of openings that overlie the sacrificial fill material rails 441R. Each row of openings in the patterned photoresist layer in the second device region 400 overlies a respective sacrificial fill material rail 441R.

An anisotropic etch process can be performed to remove unmasked portions of the dielectric core rails 62R and the sacrificial fill material rails 441R. Unmasked portions of the dielectric core rails 62R are removed to form pillar cavities between each neighboring pair of remaining portions of the dielectric core rails 62R. Each remaining portion of the dielectric core rail 62R includes a pillar-shaped dielectric material portion, which is herein referred to as a dielectric core, or a NAND dielectric core 62. The pillar cavities that are formed between each neighboring pair of NAND dielectric cores 62 are herein referred to as NAND pillar cavities 59.

Generally, each dielectric core rail 62R can be divided into a plurality of NAND dielectric cores 62 by anisotropically etching unmasked portions of the dielectric core rails 62R. The NAND pillar cavities 59 are formed in volumes from which the material of the dielectric core rails 62R are etched by the anisotropic etch process. The lateral dimension of each NAND dielectric core 62 along the lengthwise direction of the first line trenches 149 may be in a range from 30 nm to 600 nm, such as from 60 nm to 300 nm, although lesser and greater lateral dimensions may also be employed. The lateral dimension of each NAND pillar cavity 59 along the lengthwise direction of the first line trenches 149 may be in a range from 30 nm to 600 nm, such as from 60 nm to 300 nm, although lesser and greater lateral dimensions may also be employed.

Generally, each sacrificial fill material rail 441R can be divided into a plurality of sacrificial pillar structures (441, 443) by anisotropically etching unmasked portions of the sacrificial fill material rails 441R. First pillar cavities (5A, 5B), which are also referred to as first NOR pillar cavities, are formed in volumes from which the material of the sacrificial fill material rails 441R are etched by the anisotropic etch process. The first pillar cavities (5A, 5B) are formed between each neighboring pair of sacrificial pillar structures (441, 443).

The first pillar cavities (5A, 5B) include source pillar cavities 5A in which a respective source pillar of a NOR transistor is to be subsequently formed, and drain pillar cavities 5B in which a respective drain pillar of a NOR transistor is to be subsequently formed. The lateral dimension of each first pillar cavity (5A, 5B) along the lengthwise direction of the second line trenches 449 may be in a range from 30 nm to 600 nm, such as from 60 nm to 300 nm, although lesser and greater lateral dimensions may also be employed.

The sacrificial pillar structures (441, 443) include first sacrificial pillar structures 441 that are formed in volumes in which semiconductor channels of NOR transistors are to be subsequently formed, and second sacrificial pillar structures 443 that are formed in volumes in which dielectric pillar structures providing lateral electrical isolation between a neighboring pair of NOR transistors are to be subsequently formed. The lateral dimension of each first sacrificial pillar structure 441 along the lengthwise direction of the second line trenches 449 may be in a range from 30 nm to 600 nm, such as from 60 nm to 300 nm, although lesser and greater lateral dimensions may also be employed. The lateral dimension of each second sacrificial pillar structure 443 along the lengthwise direction of the second line trenches 449 may be in a range from 30 nm to 600 nm, such as from 60 nm to 300 nm, although lesser and greater lateral dimensions may also be employed.

Figure 12A:
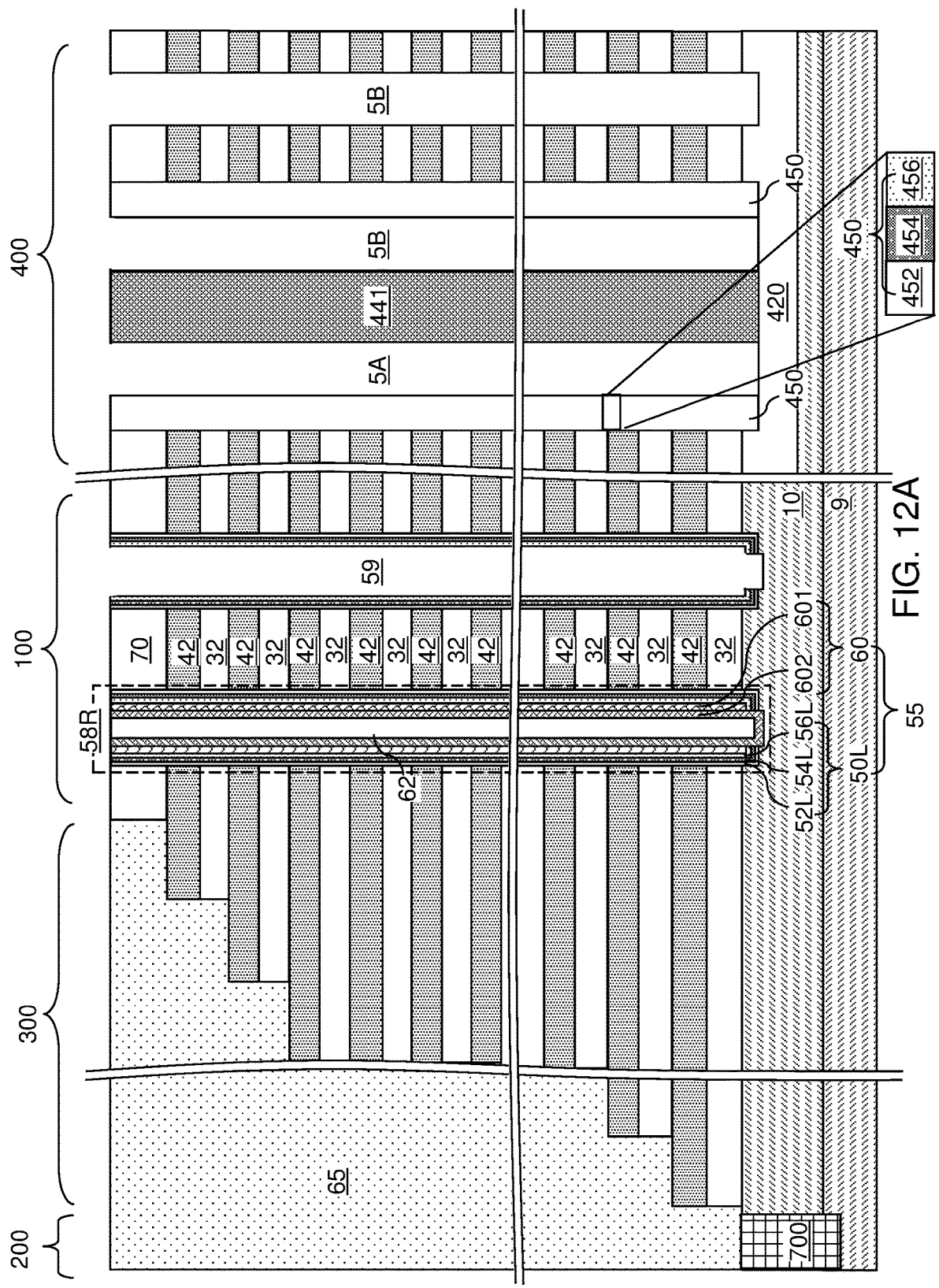
FIG. 12A is a schematic vertical cross-sectional view of the exemplary structure after dividing semiconductor channel material layers into vertical semiconductor channels according to an embodiment of the present disclosure.
Figure 12B:
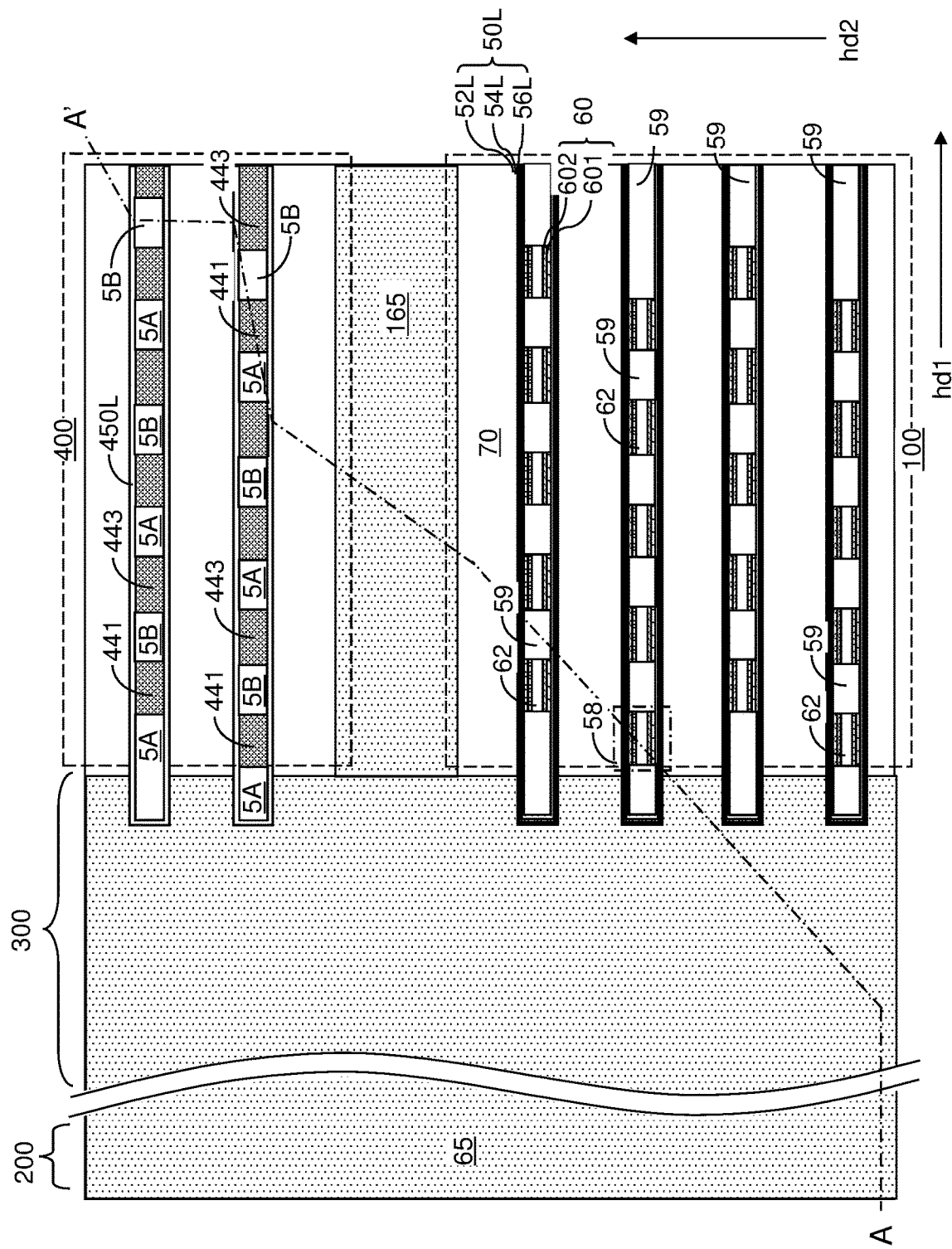
FIG. 12B is a top-down view of the exemplary structure of FIG. 12A. The vertical plane A-A' is the plane of the cross-section for FIG. 12A.

Referring to FIGS. 12A and 12B, an isotropic etch process can be performed, which introduces an isotropic etchant that etches the semiconductor materials of the at least one semiconductor channel material layer (601L, 602L) selective to the materials of the dielectric cores 62 and the NAND memory films 50L into the NAND pillar cavities 59. For example, the isotropic etch process can include a wet etch process employing hot trimethyl-2 hydroxyethyl ammonium hydroxide ("hot TMY") or tetramethyl ammonium hydroxide (TMAH). In one embodiment, each first semiconductor channel material layer 601L can be divided into a plurality of first semiconductor channel portions 601, and each second semiconductor channel material layer 602L can be divided into a plurality of second semiconductor channel portions 602. Each contiguous combination of a first semiconductor channel portion 601 and a second semiconductor channel portion 602 can constitute a vertical semiconductor channel 60. Generally, physically exposed portions of the at least one semiconductor channel material layer (601L, 602L) are removed around each NAND pillar cavity 59. The semiconductor channel material layers (601L, 602L) are divided into discrete vertically-extending semiconductor strips along the lengthwise direction of the first line trenches 149 to provide the vertical semiconductor channels 60. The vertical semiconductor channels 60 are laterally spaced apart along the lengthwise direction of each first line trench 149.

In one embodiment, each of the vertical semiconductor channels 60 can have a U-shaped vertical cross-sectional profile along a vertical direction that is perpendicular to the lengthwise direction of the first line trenches 149. Each of the vertical semiconductor channels 60 can comprises a respective pair of inner sidewalls that contact a respective dielectric core 62. Each of the vertical semiconductor channels 60 has a respective pair of planar vertical semiconductor surfaces that are parallel to the horizontal lengthwise direction of the first line trenches 149. In other words, the outer sidewalls and the inner sidewalls of each vertical semiconductor channel 60 can be with a respective two-dimensional Euclidean vertical plane that extends along the lengthwise direction of a respective first line trench 149.

Each of the NAND memory films 50L can contact a respective plurality of vertical semiconductor channels 60. Each portion of the NAND memory film 50L that contacts a vertical semiconductor channel 60 includes a vertical stack of memory elements, such as portions of a charge storage layer 54 located at levels of the sacrificial material strips 42. Generally, each vertical stack of memory elements comprises portions of a respective NAND memory film 50L, which has a respective pair of planar vertical dielectric surfaces that are parallel to the horizontal lengthwise direction of the first line trenches 149. Each combination of a vertical semiconductor channel 60 and an adjoining portion of a NAND memory film 50L constitutes a memory stack structure 55.

Figure 13A:
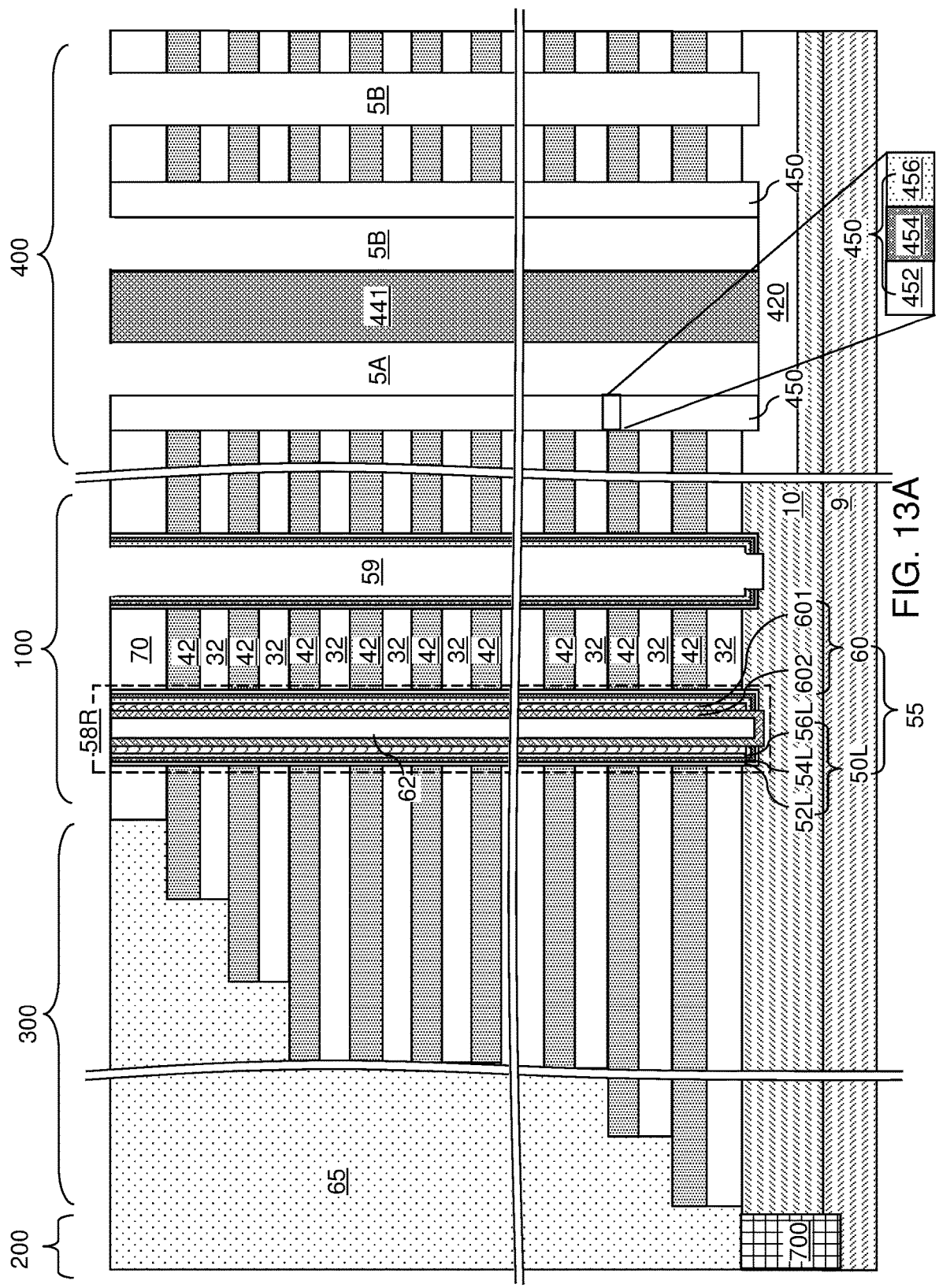
FIG. 13A is a schematic vertical cross-sectional view of the exemplary structure after formation of vertical semiconductor oxide strips by oxidation of vertical peripheral portions of the vertical semiconductor channels according to an embodiment of the present disclosure.
Figure 13B:
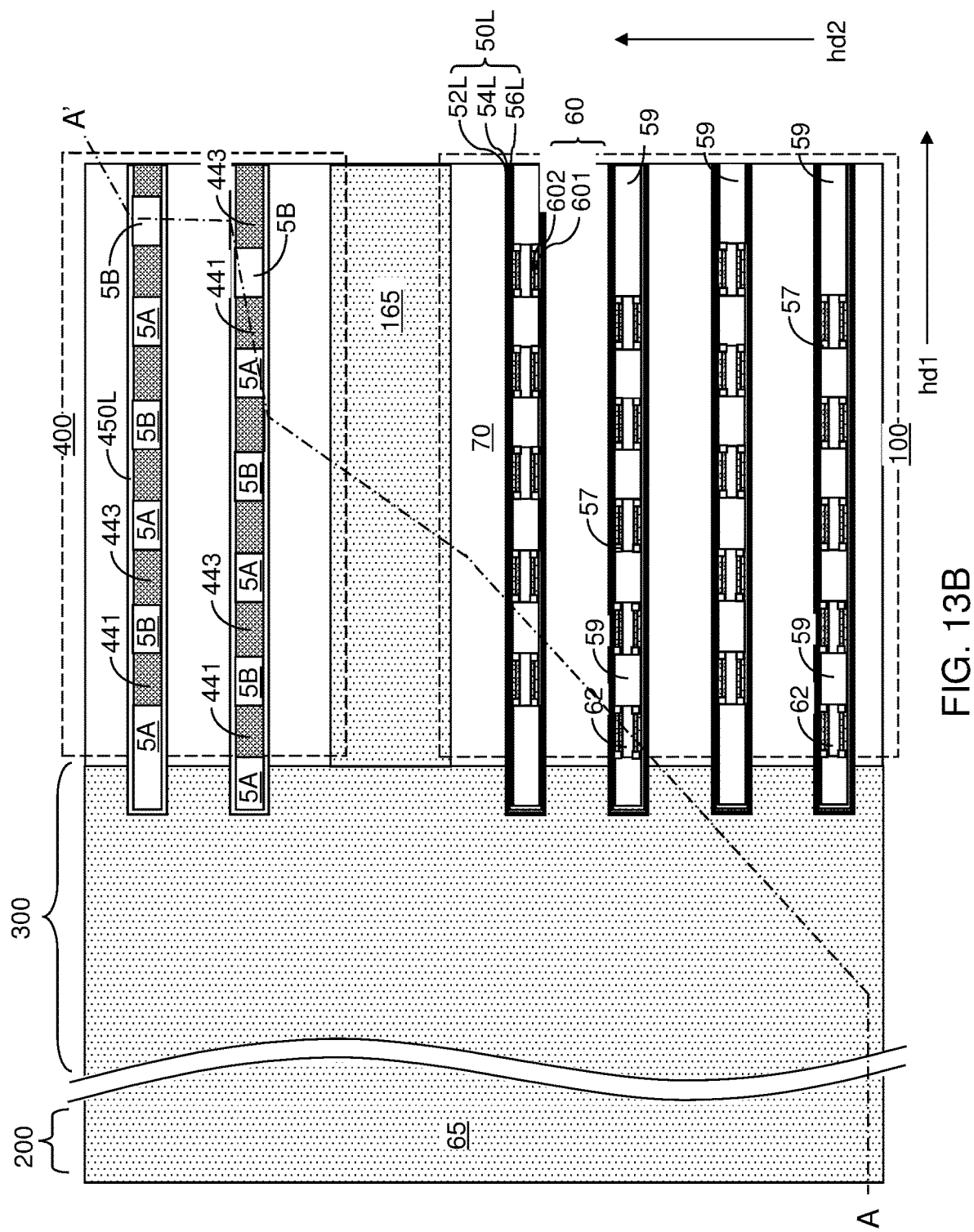
FIG. 13B is a top-down view of the exemplary structure of FIG. 13A. The vertical plane A-A' is the plane of the cross-section for FIG. 13A.

Referring to FIGS. 13A and 13B, an oxidation process can be performed to convert physically exposed vertically-extending peripheral portions of each vertical semiconductor channel 60 into vertical semiconductor oxide strips 57. A thermal oxidation process or a plasma oxidation process may be employed. The maximum lateral dimension of each vertical semiconductor oxide strip 57 may be in a range from 5 nm to 50 nm, although lesser or greater dimensions may also be employed. Each of the vertical semiconductor channels 60 can contact a respective pair of vertical semiconductor oxide strips 57 that comprises a dielectric oxide of the semiconductor material of the vertical semiconductor channels 60.

Figure 14A:
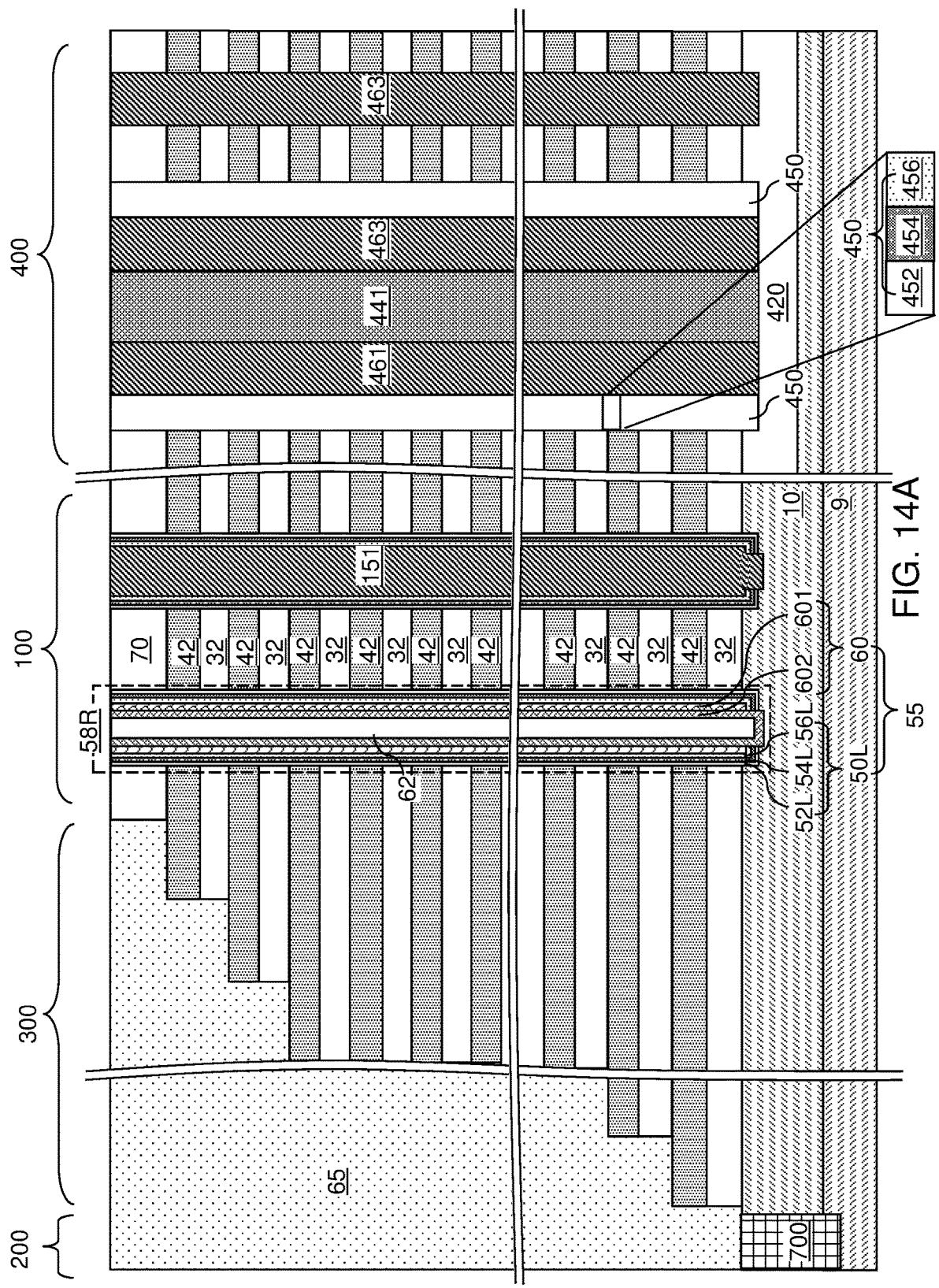
FIG. 14A is a schematic vertical cross-sectional view of the exemplary structure after formation of source pillars, drain pillars, and sacrificial inter-dielectric-core pillars according to an embodiment of the present disclosure.
Figure 14B:
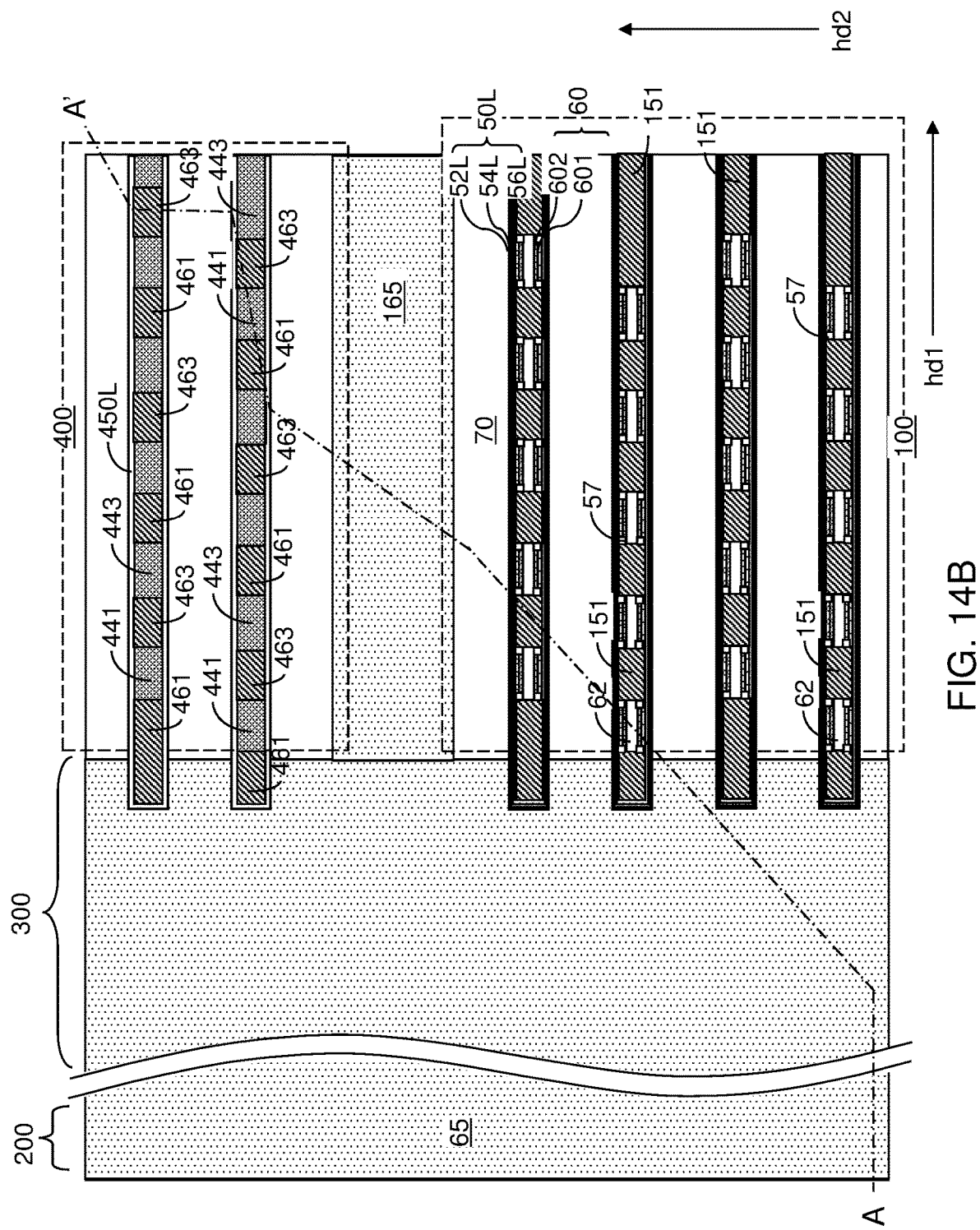
FIG. 14B is a top-down view of the exemplary structure of FIG. 14A. The vertical plane A-A' is the plane of the cross-section for FIG. 14A.

Referring to FIGS. 14A and 14B, a doped semiconductor material having a doping of a second conductivity type can be deposited in the first pillar cavities (5A, 5B) and the NAND pillar cavities 59 by a conformal deposition process. The doped semiconductor material can include, for example, amorphous silicon, polysilicon, a silicon-germanium alloy, or a compound semiconductor material. The second conductivity type is the opposite of the first conductivity type. For example, if the first conductivity type is p-type, then the second conductivity type is n-type, and vice versa. The atomic concentration of dopants of the second conductivity type in the deposited doped semiconductor material can be in a range from $5.0 \times 10^{18}/cm^3$ to $2.0 \times 10^{21}/cm^3$, although lesser or greater atomic concentrations can also be employed. Excess portions of the doped semiconductor material can be removed from above the horizontal plane including the top surfaces of the insulating cap strips 70 by a planarization process, which may employ a recess etch and/or a chemical mechanical planarization process. Each portion of the doped semiconductor material that fills a source pillar cavity 5A in the second device region 400 constitutes a source pillar 461. Each portion of the doped semiconductor material that fills a drain pillar cavity 5B in the second device region 400 constitutes a drain pillar 463. Each portion of the doped semiconductor material that fills a NAND pillar cavity 59 in the first device region 100 constitutes a sacrificial pillar that is formed between a respective pair of dielectric cores 62, and is herein referred to as a sacrificial inter-dielectric-core pillar 151.

Figure 15A:
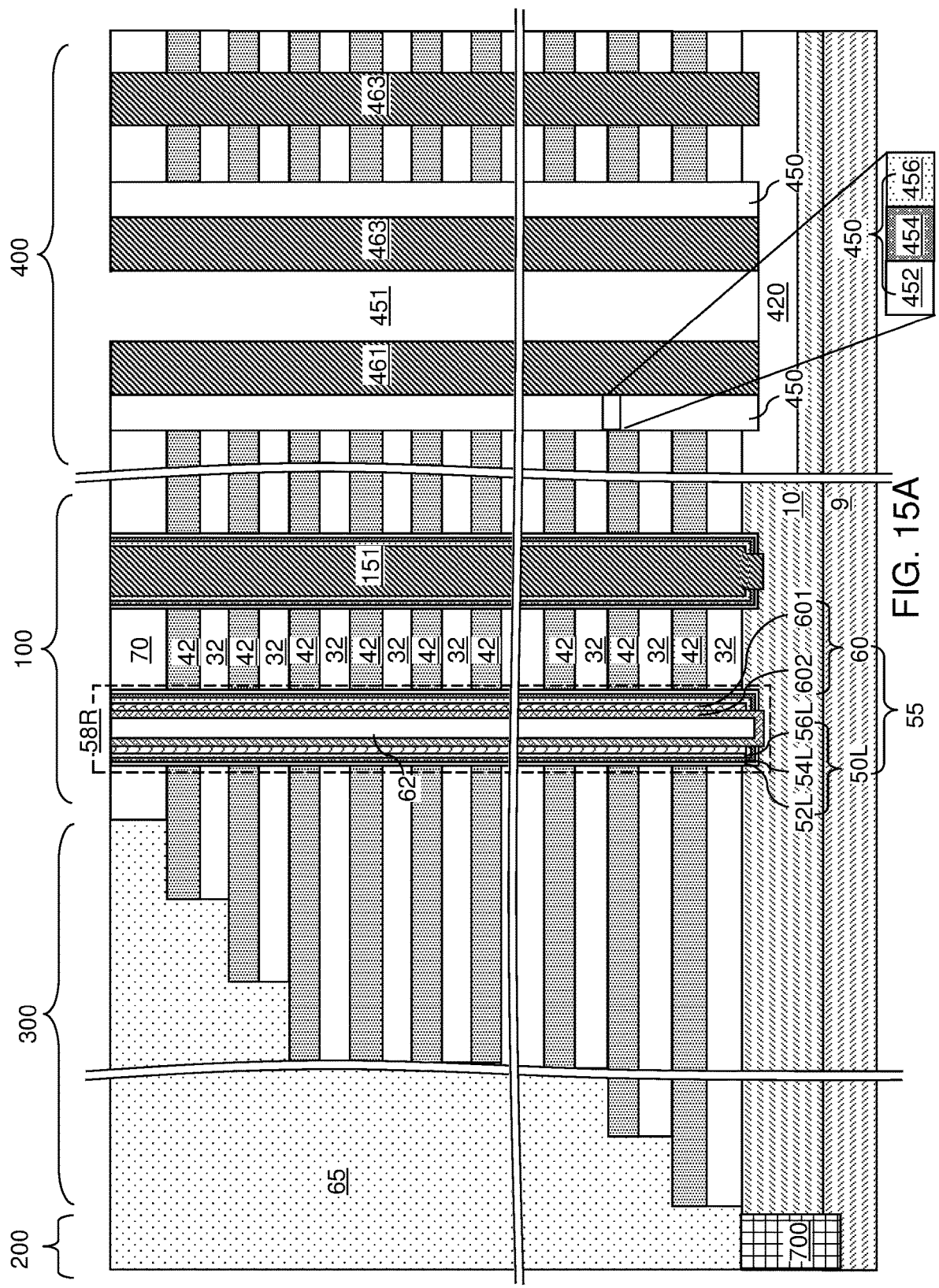
FIG. 15A is a schematic vertical cross-sectional view of the exemplary structure after formation of second pillar cavities by removing a first subset of the sacrificial pillar structures according to an embodiment of the present disclosure.
Figure 15B:
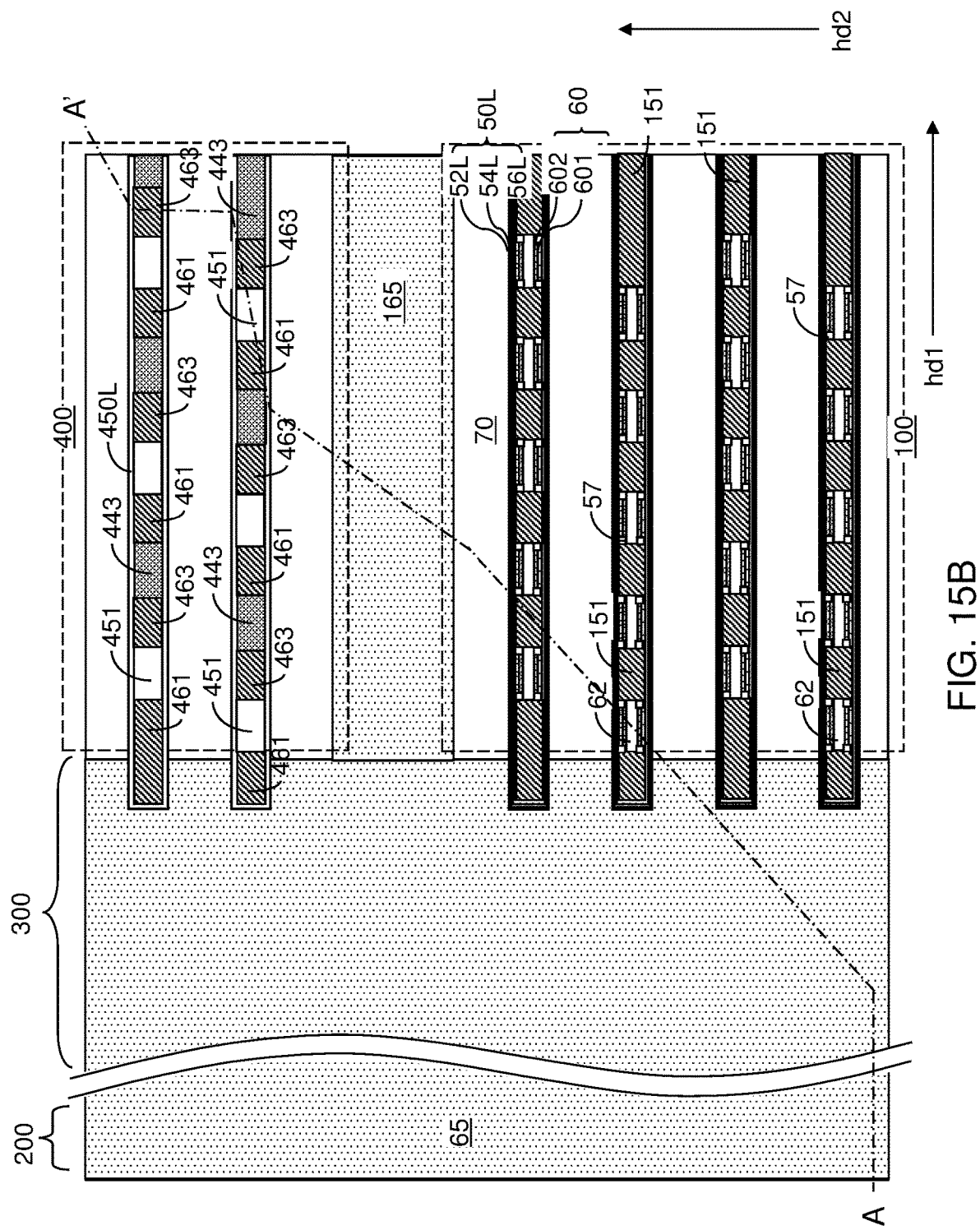
FIG. 15B is a top-down view of the exemplary structure of FIG. 15A. The vertical plane A-A' is the plane of the cross-section for FIG. 15A.

Referring to FIGS. 15A and 15B, a patterned etch mask layer (not shown) such as a patterned photoresist layer can be formed above the exemplary structure. The patterned etch mask layer includes an array of openings that overlie the first sacrificial pillar structures 441 (which are a first subset of the sacrificial pillar structures (441, 443)). The second sacrificial pillar structures 443 (which are a second subset of the sacrificial pillar structures (441, 443)) and the sacrificial inter-dielectric-core pillars 151 can be masked by the patterned etch mask layer. In one embodiment, the entire area of the first device region 100 and areas of the second device region 400 other than areas that overlie the first sacrificial pillar structures 441 can be covered by the patterned etch mask layer.

An etch process that removes the material of the first sacrificial pillar structures 441 selective to the materials of the source pillars 461, the drain pillars 463, and inner sidewalls of the NOR memory films 450L (which are in contact with the first sacrificial pillar structures 441) can be performed to remove the first sacrificial pillar structures 441. For example, if the first sacrificial pillar structures 441 include silicon nitride, a wet etch process employing hot phosphoric acid can be employed. If the first sacrificial pillar structures 441 include a silicon-germanium alloy, a wet etch process employing a mixture of hydrofluoric acid, hydrogen peroxide, and acetic acid. A second pillar cavity 451 can be formed in each volume from which a first sacrificial pillar structure 441 is removed. A pair of sidewalls of a NOR memory film 450L, a sidewall of a source pillar 461, and a sidewall of a drain pillar 463 can be physically exposed around each second pillar cavity 451. Generally, the second pillar cavities 451 can be formed by removing a first subset of the sacrificial pillar structures (441, 443), i.e., the first sacrificial pillar structures 441, selective to the source pillars 461 and the drain pillars 463. The patterned etch mask layer can be removed, for example, by ashing.

Figure 16B:
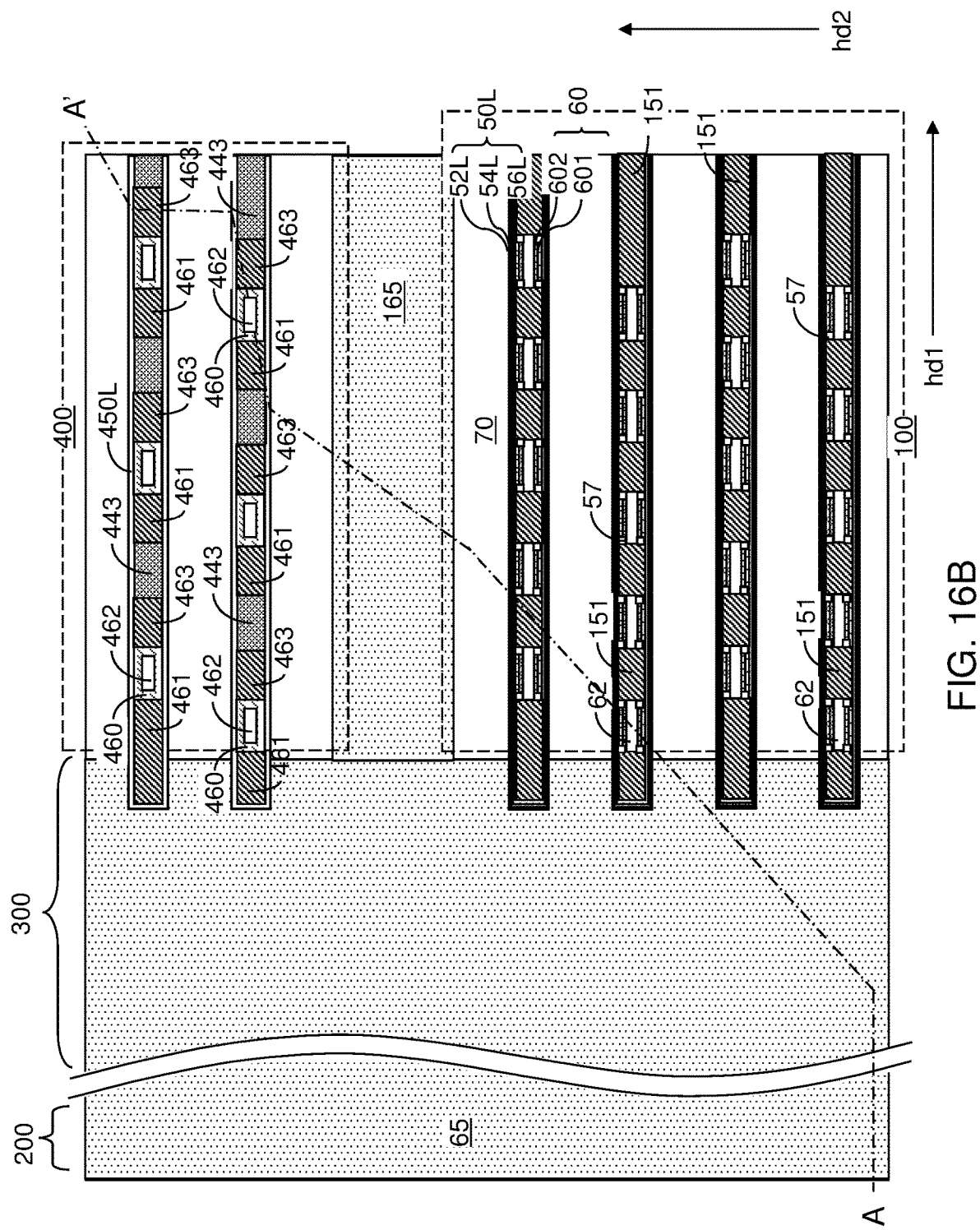
FIG. 16B is a top-down view of the exemplary structure of FIG. 16A. The vertical plane A-A' is the plane of the cross-section for FIG. 16A.

Referring to FIGS. 16A and 16B, a semiconductor channel material layer including a semiconductor channel material having a doping of the first conductivity type can be conformally deposited in the peripheral regions of second pillar cavities 451. The semiconductor channel material layer can be deposited on each physically exposed sidewall of the source pillars 461 and the drain pillars 463, and on each physically exposed sidewall of the NOR memory films 450L. The semiconductor channel material layer can include amorphous silicon, polysilicon, a silicon-germanium alloy, or a compound semiconductor material, and may have a thickness in a range from 6 nm to 60 nm, such as from 12 nm to 30 nm, although lesser and greater thicknesses can also be employed.

Remaining volumes of the second pillar cavities 451 can be subsequently filled with a dielectric material such as silicon oxide, for example, by a conformal deposition process. Excess portions of the semiconductor channel material layer and the dielectric material can be removed from above the horizontal plane including top surfaces of the source pillars 461 and the drain pillars 463 (which can be the horizontal plane including the top surfaces of the insulating cap strips 70) by a planarization process. The planarization process can employ a recess etch process and/or a chemical mechanical planarization process. Remaining portions of the semiconductor channel material layer comprise semiconductor channels 460 for NOR transistors, and are herein referred to as NOR semiconductor channels 460. Each NOR semiconductor channel 460 can include a tubular channel region 460T having an tubular configuration, and a semiconductor plate portion 460P that contacts the dielectric isolation layer 420 and is adjoined to a bottom end of the tubular channel region 460T. Each remaining portion of the dielectric material forms a dielectric core, which is herein referred to as a NOR dielectric core 462. Each volume of a second pillar cavity 451 can be filled with a combination of a NOR semiconductor channel 460 and a NOR dielectric core 462.

Each of the source pillars 461, the drain pillars 463, and the tubular channel regions 460T can vertically extend through each level of the second spacer material strips, which can be the second sacrificial material strips 42. In one embodiment, each tubular channel region 460T can have a uniform thickness throughout, and can laterally surround a respective NOR dielectric core 462.

Figure 17A:
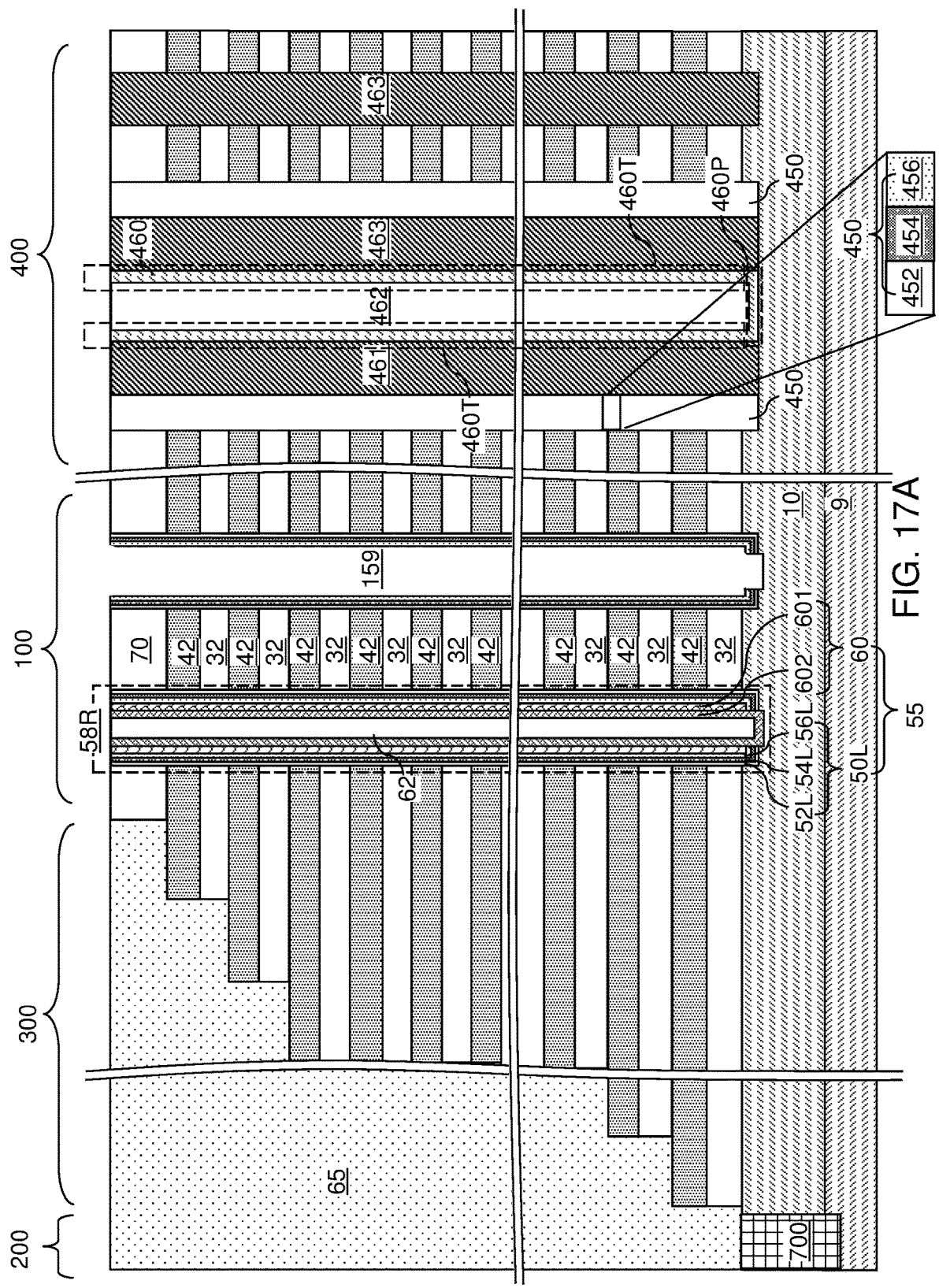
FIG. 17A is a schematic vertical cross-sectional view of the exemplary structure after removal of the sacrificial inter-dielectric-core pillars and a second subset of the sacrificial pillar structures according to an embodiment of the present disclosure.
Figure 17B:
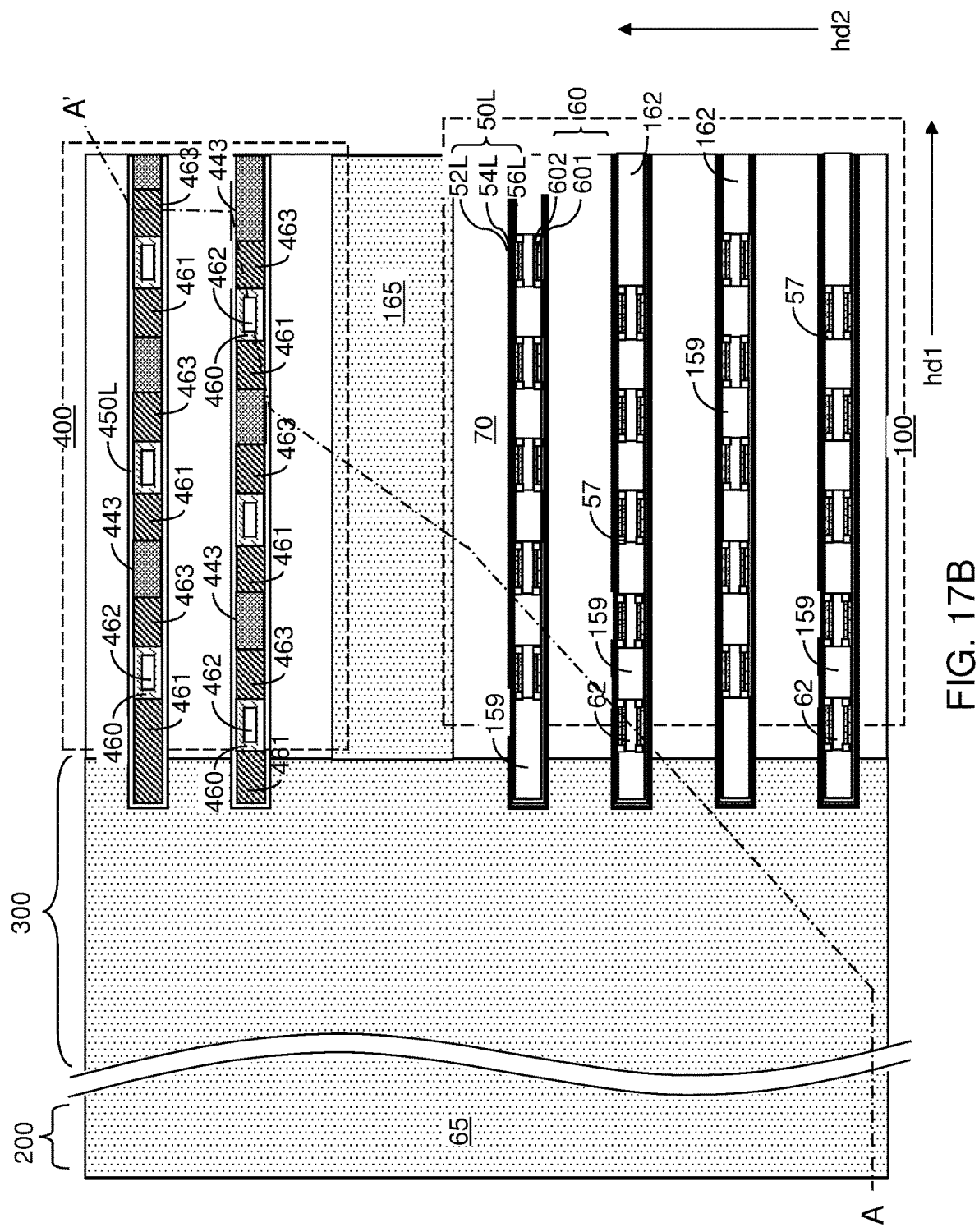
FIG. 17B is a top-down view of the exemplary structure of FIG. 17A. The vertical plane A-A' is the plane of the cross-section for FIG. 17A.

Referring to FIGS. 17A and 17B, the sacrificial inter-dielectric-core pillars 151 can be removed selective to the source pillars 461, the drain pillars 463, the NAND dielectric cores 62 and the second sacrificial pillar structures 443 (which is the second subset of the sacrificial pillar structures (441, 443)). For example, a patterned etch mask layer (not shown) such as a patterned photoresist layer can be formed over the exemplary structure such that openings in the patterned etch mask layer overlie each of the sacrificial inter-dielectric-core pillars 151. An isotropic etch process that etches the material of the sacrificial inter-dielectric-core pillars 151 and optionally the second sacrificial pillar structures 443 selective to the materials of the source pillars 461, the drain pillars 463, and the NAND dielectric cores 62 can be performed. For example, if the sacrificial inter-dielectric-core pillars 151 include doped polysilicon, then wet etch process employing hot trimethyl-2 hydroxyethyl ammonium hydroxide ("hot TMY") or tetramethyl ammonium hydroxide (TMAH) can be used. First isolation pillar cavities 159 can be formed in volumes from which the sacrificial inter-dielectric-core pillars 151 are removed. The second sacrificial pillar structures 443 are retained in the exemplary structure and comprise dielectric pillar structures.

Figure 18A:
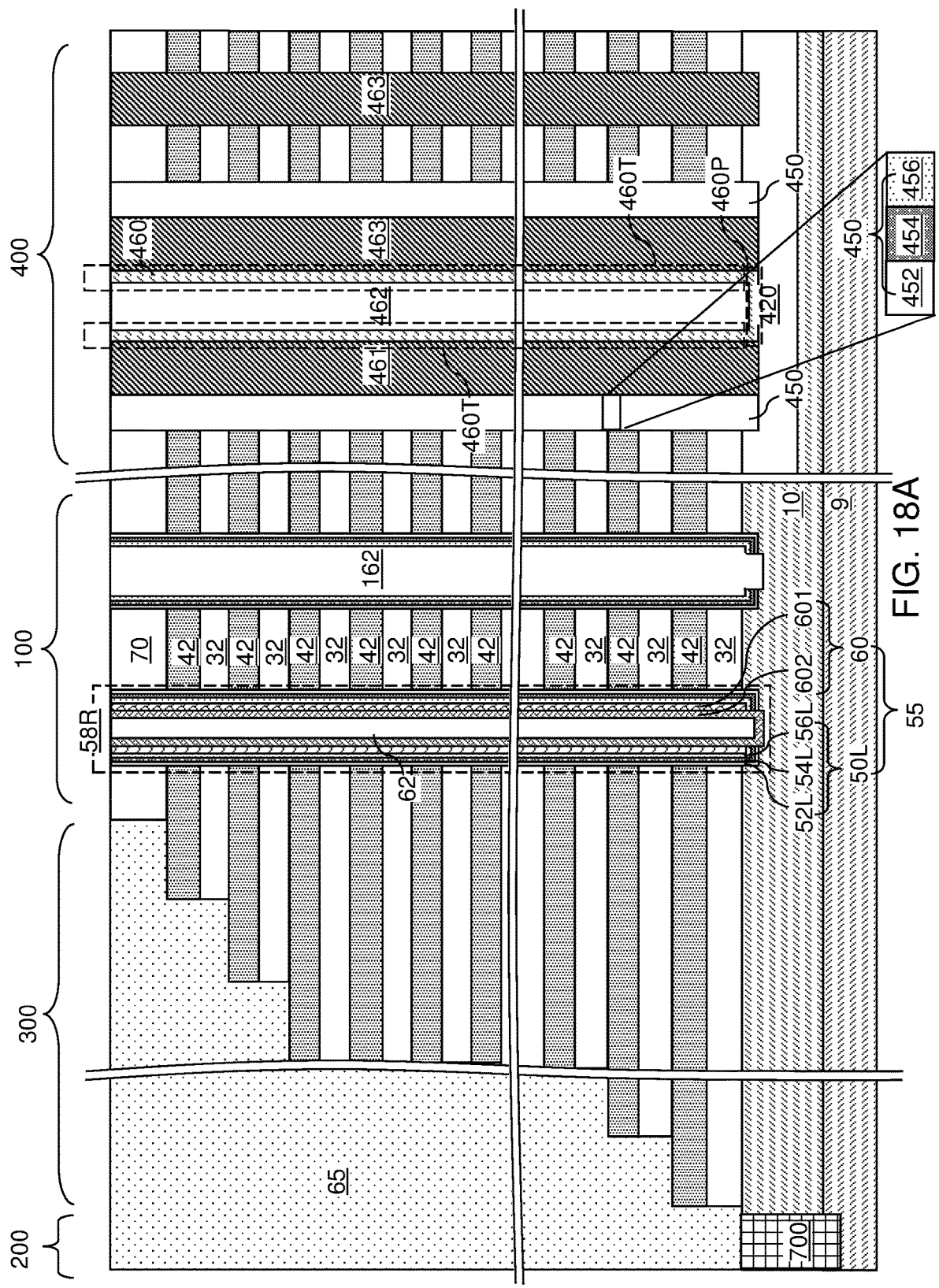
FIG. 18A is a schematic vertical cross-sectional view of the exemplary structure after formation of dielectric pillar structures according to an embodiment of the present disclosure.
Figure 18B:
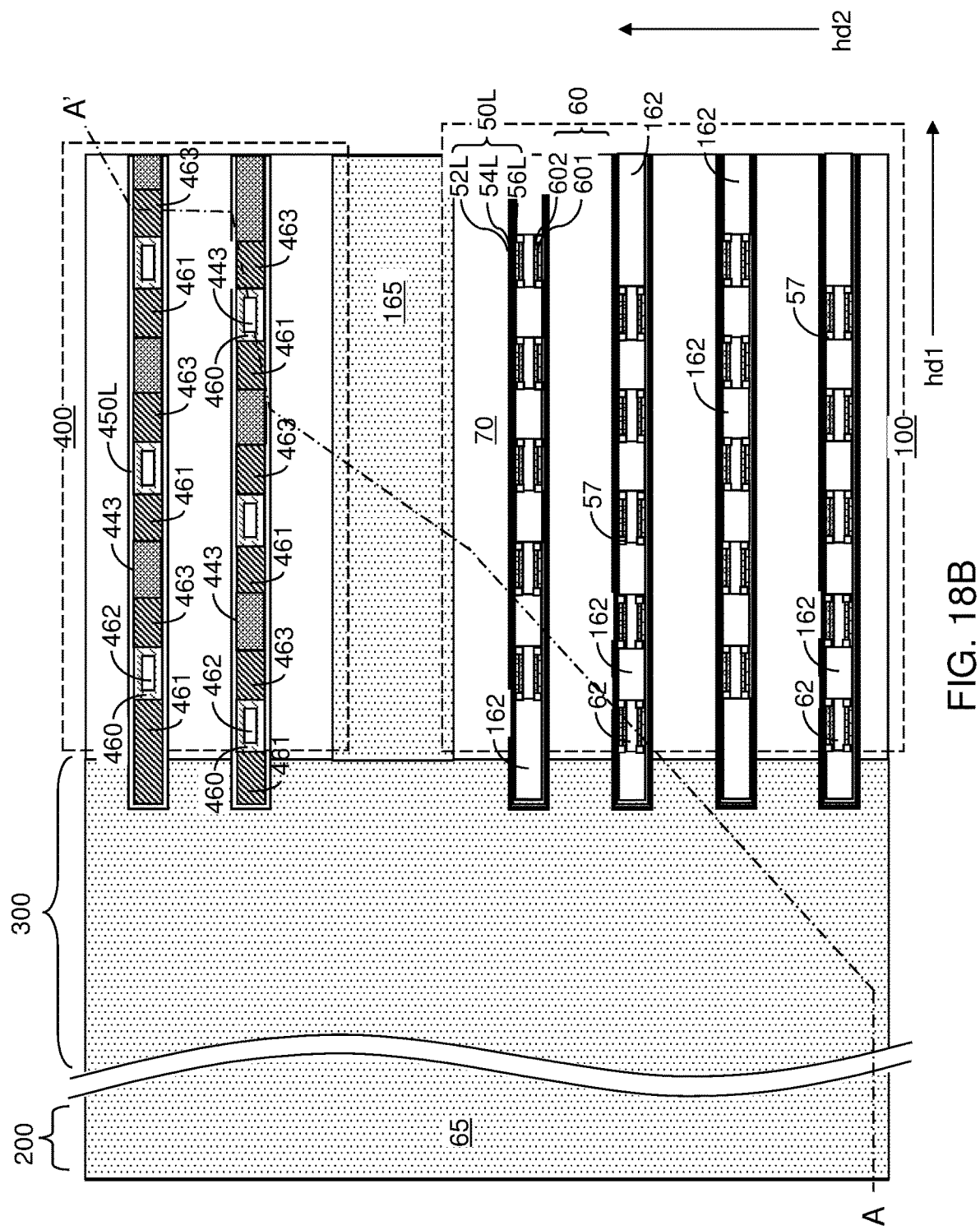
FIG. 18B is a top-down view of the exemplary structure of FIG. 18A. The vertical plane A-A' is the plane of the cross-section for FIG. 18A.

Referring to FIGS. 18A and 18B, a dielectric fill material such as undoped silicate glass or a doped silicate glass can be deposited in the first isolation pillar cavities 159 in the first device region 100. A conformal deposition process such as a chemical vapor deposition process can be employed to deposit the dielectric fill material. Excess portions of the dielectric fill material can be removed from above the horizontal plane including the top surfaces of the source pillars 461 and the drain pillars 463 by a planarization process, which may employ a recess etch and/or a chemical mechanical planarization process. Each portion of the dielectric fill material that fills the first isolation pillar cavities 159 constitute first dielectric pillar structures 162.

Each of the first line trenches 149 is filled with a respective laterally alternating sequence of memory stack structures 55 and first dielectric pillar structures 162. Each of the memory stack structures 55 comprises a vertical semiconductor channel 60 and a vertical stack of memory elements, which can be portions of a NAND memory film 50L located at levels of first spacer material strips (such as the first sacrificial material strips 42). For example, a vertical stack of memory elements can include portions of a charge storage layer 54L located at levels of first sacrificial material strips 42 or portions of a ferroelectric material layer located at levels of first sacrificial material strips 42. Each laterally alternating sequence of memory stack structures 55 and first dielectric pillar structures 162 is formed on a respective one of the NAND memory films 50L.

Each of the second line trenches 449 is filled with a respective laterally alternating sequence of active region assemblies (461, 460, 463) of lateral field effect transistors and second dielectric pillar structures 443. Each of the active region assemblies (461, 460, 463) of the lateral field effect transistors comprises a source pillar 461, a drain pillar 463, and a tubular channel region 460T contacting the source pillar 461 and the drain pillar 463. As used herein, an active region assembly of a field effect transistor refers to the assembly of all regions through which electrical current flows, i.e., the assembly of a source region, a drain region, and a channel region. Each laterally alternating sequence of active region assemblies (461, 463, 460) of lateral field effect transistors and second dielectric pillar structures 443 is formed on a respective one of the NOR memory films 450L. Each NOR memory film 450L contacts a respective laterally alternating sequence of active region assemblies (461, 463, 460) of lateral field effect transistors and second dielectric pillar structures 443.

Figure 19A:
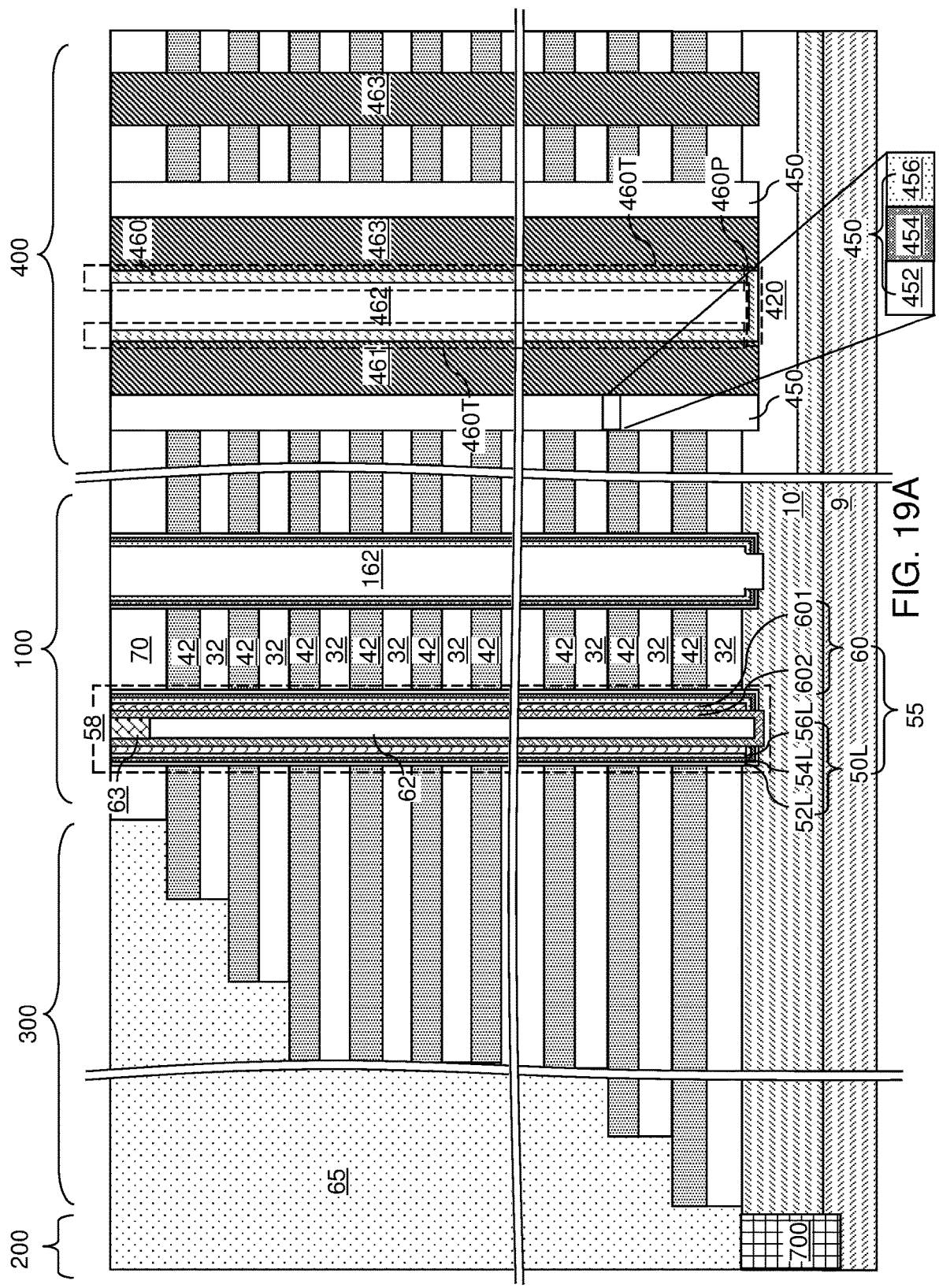
FIG. 19A is a schematic vertical cross-sectional view of the exemplary structure after formation of drain regions for vertical NAND strings according to an embodiment of the present disclosure.
Figure 19B:
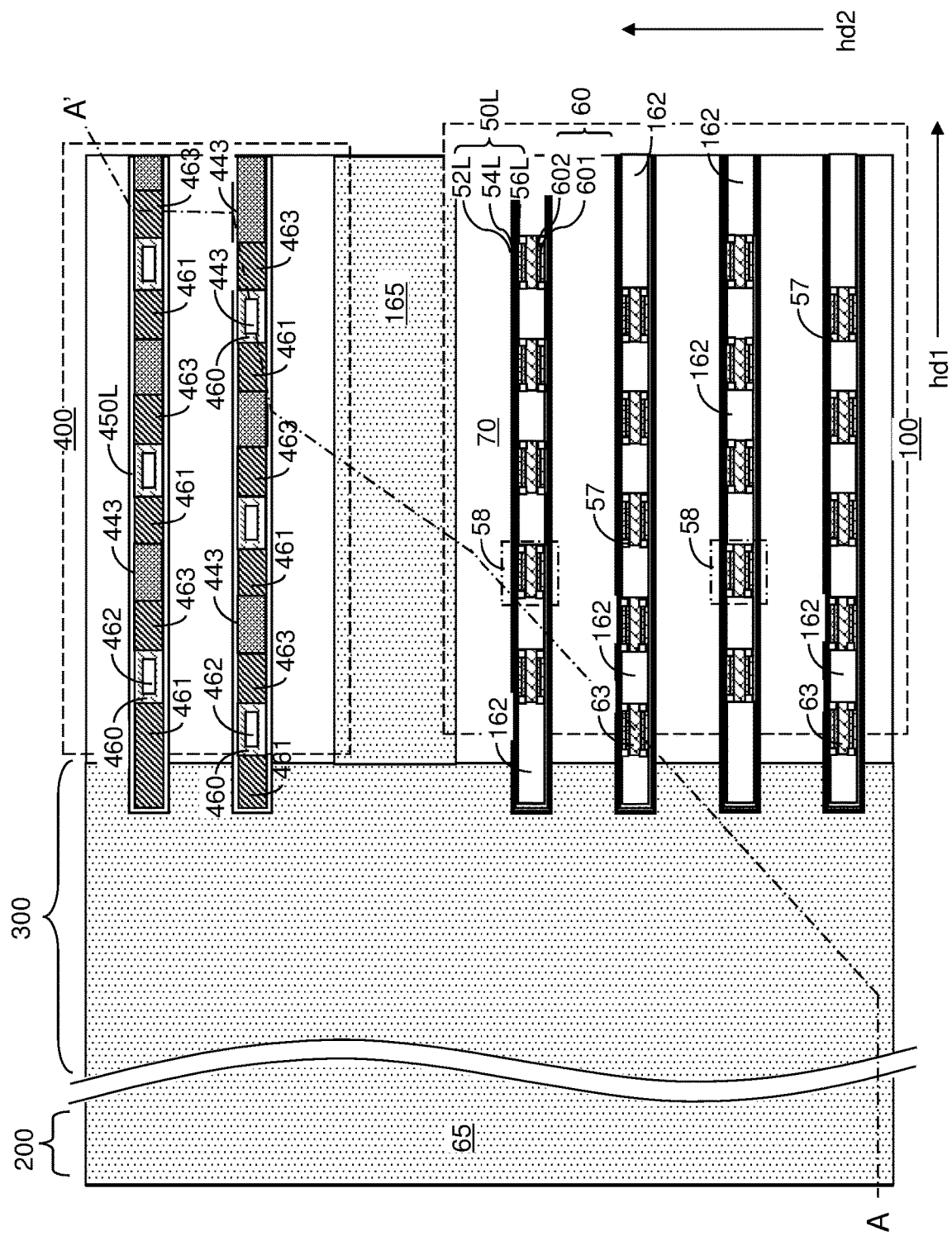
FIG. 19B is a top-down view of the exemplary structure of FIG. 19A. The vertical plane A-A' is the plane of the cross-section for FIG. 19A.

Referring to FIGS. 19A and 19B, each NAND dielectric core 62 in the first device region 100 can be vertically recessed to form a recess cavity, and can be filled with a doped semiconductor material having a doping of the second conductivity type to form drain regions 63, which are the drain regions 63 of a respective vertical NAND string 58 that includes a respective memory stack structure 55. A top end of each of the vertical semiconductor channels 60 contacts a respective drain region 63, and a bottom end of each of the vertical semiconductor channels 60 is electrically connected to a horizontal semiconductor channel, which can be a surface portion of the semiconductor material layer 10 or a surface portion of the substrate semiconductor layer 9 in case the semiconductor material layer 10 is omitted. Generally, the horizontal semiconductor channel comprises a surface portion of an underlying semiconductor material that contacts bottom surfaces of the bottommost first insulating strips 32. A source region (not illustrated) can be provided within a portion of the semiconductor material layer 10 in first device region 100 that is laterally offset from the memory stack structures 55. In this case, the source region can have a doping of the second conductivity type. The source region may be formed prior to formation of the vertically alternating sequence of the insulating layers 32L and the spacer material layers (such as the sacrificial material layers 42L), or may be formed after formation of a contact via cavity vertically extending through the retro-stepped dielectric material portion 65 by implantation of dopants of the second conductivity type in a subsequent processing step.

In case the spacer material strips comprise sacrificial material strips 42, the sacrificial material strips 42 can be subsequently replaced with electrically conductive strips. In case the spacer material strips are formed as electrically conductive strips, replacement of the spacer material strips is not necessary. Generally, the first spacer material strips in the first device region 100 and the second spacer material strips in the second device region 400 comprise, or are subsequently replaced with, first electrically conductive strips and second electrically conductive strips, respectively.

Figure 20A:
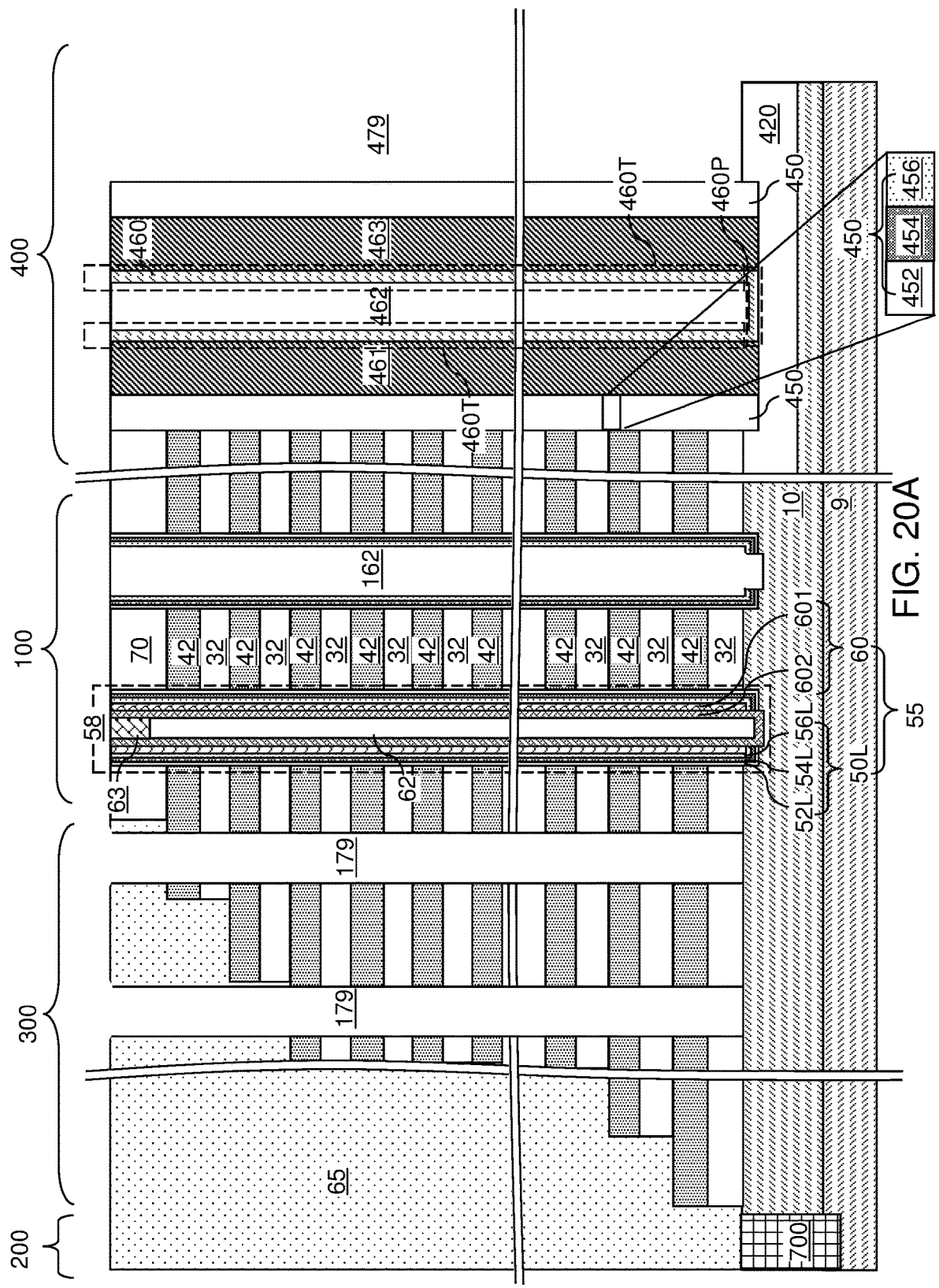
FIG. 20A is a vertical cross-sectional view of the exemplary structure after formation of backside via cavities according to an embodiment of the present disclosure.
Figure 20B:
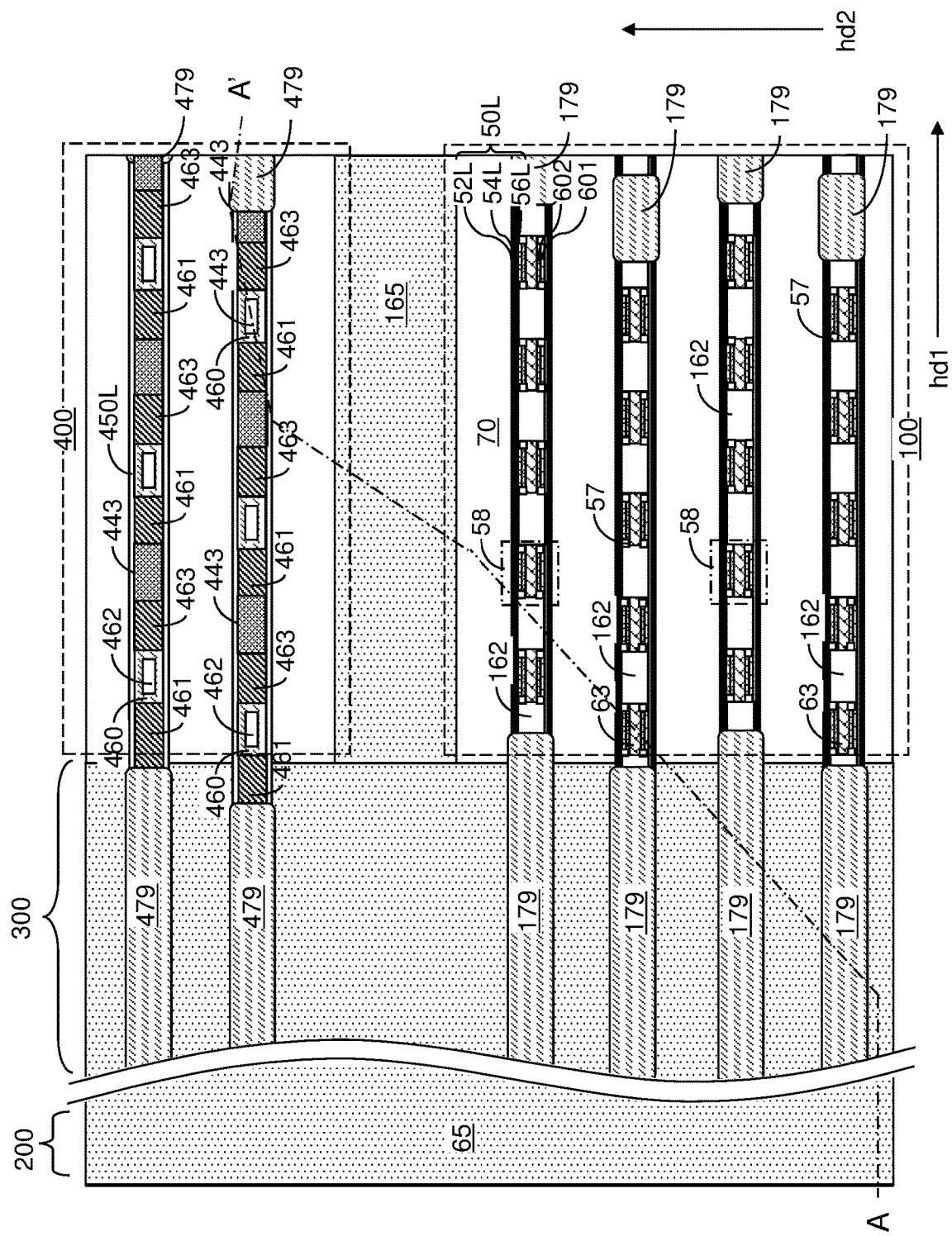
FIG. 20B is a top-down view of the exemplary structure of FIG. 20A. The vertical plane A-A' is the plane of the cross-section for FIG. 20A.

Referring to FIGS. 20A and 20B, backside via cavities (179, 479) can be formed through the retro-stepped dielectric material portion 65, the first dielectric pillar structures 162, and the second dielectric pillar structures 443. The backside via cavities (179, 479) are formed within areas that adjoin the first alternating stacks (32, 42) or the second alternating stacks (32, 42). The backside via cavities (179, 479) include first backside via cavities 179 that are formed in the first device region 100 or in the contact region 300 such that sidewalls of the first sacrificial material strips 42 are physically exposed around each of the first backside via cavities 179. In one embodiment, the first backside via cavities 179 can be formed through a respective first dielectric pillar structure 162 and/or through the retro-stepped dielectric material portion 65, and can cut into peripheral portions of two first alternating stacks of first insulating strips 32 and first sacrificial material strips 42 located in the first device region 100. The backside via cavities (179, 479) further include second backside via cavities 479 that are formed in the second device region 400 or in the contact region 300 such that sidewalls of the second sacrificial material strips 42 are physically exposed around each of the second backside via cavities 479. In one embodiment, the second backside via cavities 479 can be formed through a respective second dielectric pillar structure 443 and/or through the retro-stepped dielectric material portion 65, and can cut into peripheral portions of two second alternating stacks of second insulating strips 32 and second sacrificial material strips 42 located in the second device region 400.

Figure 21:
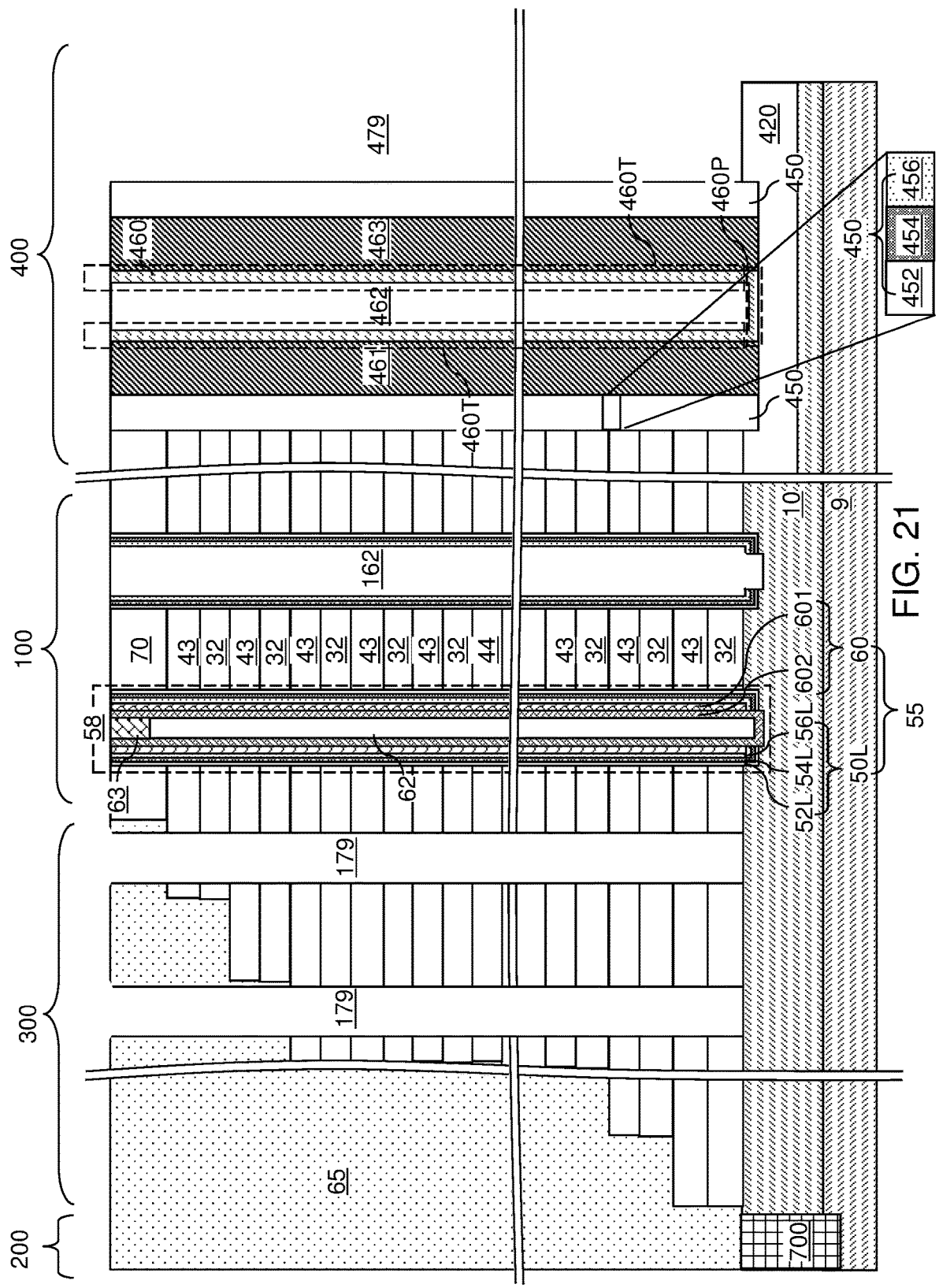
FIG. 21 is a schematic vertical cross-sectional view of the exemplary structure after formation of backside recesses according to an embodiment of the present disclosure.

Referring to FIG. 21, an etchant that selectively etches the second material of the sacrificial material strips 42 with respect to the first material of the insulating strips 32 can be introduced into the backside via cavities (179, 479), for example, employing an isotropic etch process. Backside recesses 43 are formed in volumes from which the sacrificial material strips 42 are removed. The removal of the second material of the sacrificial material strips 42 can be selective to the first material of the insulating strips 32, the material of the retro-stepped dielectric material portion 65, the material of the outer layer of each NAND memory film 50L (e.g., a blocking dielectric layer 52L), and the material of the outer layer of each NOR memory film 450L (e.g., a blocking dielectric layer 452). In one embodiment, the sacrificial material strips 42 can include silicon nitride, and the materials of the insulating strips 32 and the retro-stepped dielectric material portion 65 can be silicon oxide materials such as undoped silicate glass and/or a doped silicate glass.

The isotropic etch process that removes the second material selective to the first material and the outermost layers of the NAND memory films 50L and the NOR memory films 450L can be a wet etch process employing a wet etch solution, or can be a gas phase (dry) etch process in which the etchant is introduced in a vapor phase into the backside via cavities 79. For example, if the sacrificial material strips 42 include silicon nitride, the etch process can be a wet etch process in which the exemplary structure is immersed within a wet etch tank including phosphoric acid, which etches silicon nitride selective to silicon oxide. The duration of the isotropic etch process can be selected such that the sacrificial material strips 42 are completely removed from each alternating stack (32, 42) of insulating strips 32 and sacrificial material strips 42. Each backside recess 43 can be a laterally extending cavity having a lateral dimension that is greater than the vertical extent of the cavity. In other words, the lateral dimension of each backside recess 43 can be greater than the height of the backside recess 43. A backside recess 43 can be vertically bounded by a top surface of an underlying insulating strip 32 and a bottom surface of an overlying insulating strip 32.

Figure 22:
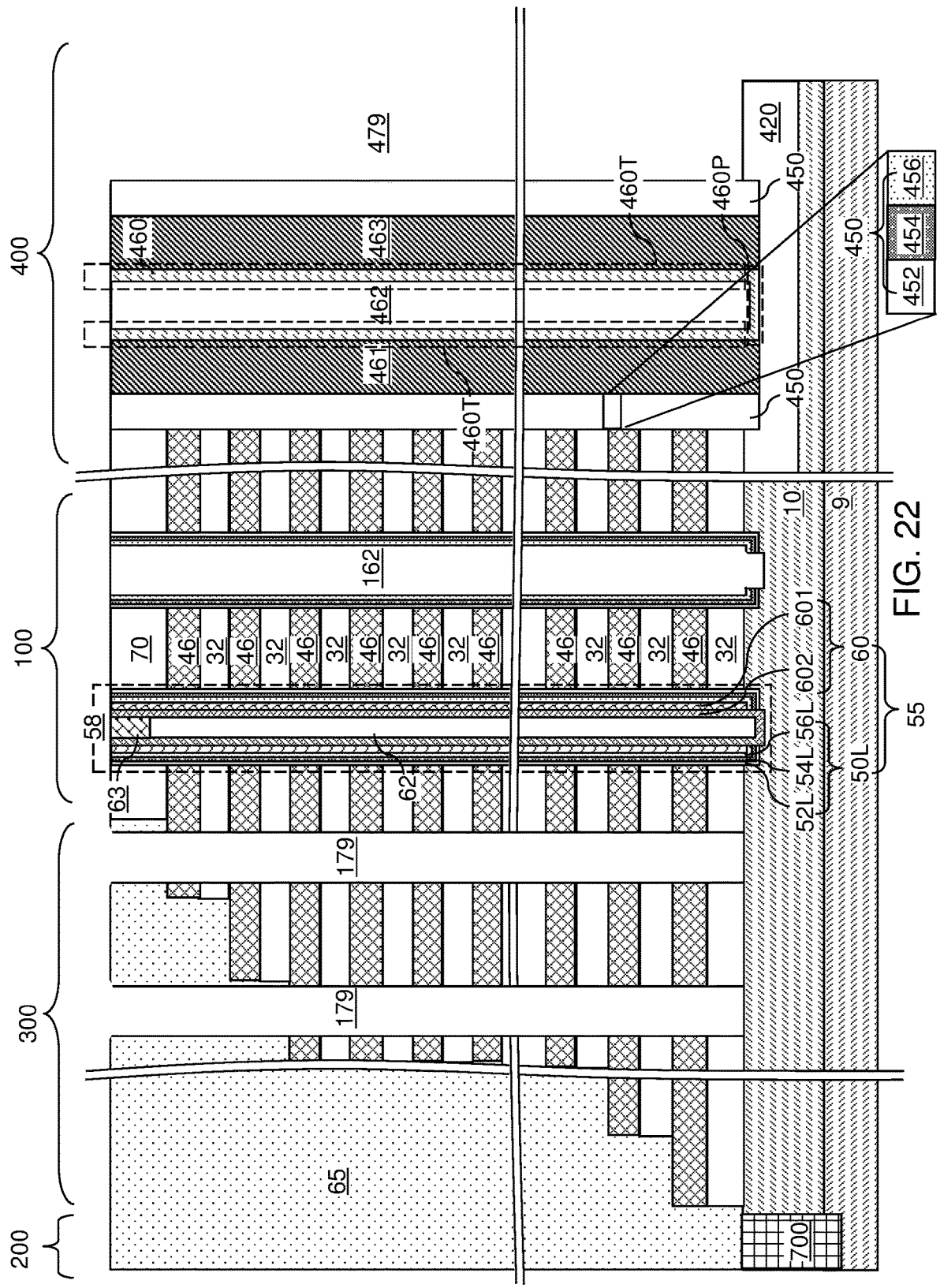
FIG. 22 is a schematic vertical cross-sectional view of the exemplary structure after formation of electrically conductive strips in the backside recesses according to an embodiment of the present disclosure.

Referring to FIG. 22, a backside blocking dielectric layer (not shown) can be optionally formed in the backside recesses 43 by a conformal deposition process. The conformal deposition process can include, for example, an atomic layer deposition (ALD) process to form an aluminum oxide backside blocking dielectric. The thickness of the backside blocking dielectric layer can be in a range from 1 nm to 6 nm, although lesser and greater thicknesses can also be employed.

At least one conductive material can be deposited in remaining volumes of the backside recesses 43. For example, a metallic barrier layer can be deposited in the backside recesses 43 directly on the physically exposed surfaces of the backside blocking dielectric layer, or on the physically exposed surfaces of the NAND memory films 50L, the NOR memory films 450L, and the insulating strips 32 in case a backside blocking dielectric layer is not employed. The metallic barrier layer includes an electrically conductive metallic material that can function as a diffusion barrier layer and/or adhesion promotion layer for a metallic fill material to be subsequently deposited. The metallic barrier layer can include a conductive metallic nitride material such as TiN, TaN, WN, or a stack thereof, or can include a conductive metallic carbide material such as TiC, TaC, WC, or a stack thereof. In one embodiment, the metallic barrier layer can be deposited by a conformal deposition process such as chemical vapor deposition (CVD) or atomic layer deposition (ALD). The thickness of the metallic barrier layer can be in a range from 2 nm to 8 nm, such as from 3 nm to 6 nm, although lesser and greater thicknesses can also be employed. In one embodiment, the metallic barrier layer can consist essentially of a conductive metal nitride such as TiN.

A metal fill material is deposited in remaining volumes of backside recesses 43, on the sidewalls of the backside via cavities (179, 479), and over the top surface of the insulating cap strips 70 to form a continuous metallic fill material portion. The continuous metallic fill material can be deposited by a conformal deposition method, which can be, for example, chemical vapor deposition (CVD), atomic layer deposition (ALD), electroless plating, electroplating, or a combination thereof. In one embodiment, the continuous metallic fill material portion can consist essentially of at least one elemental metal. The at least one elemental metal of the metallic fill material portion can be selected, for example, from tungsten, cobalt, ruthenium, titanium, and tantalum. In one embodiment, the continuous metallic fill material portion can consist essentially of a single elemental metal. In one embodiment, the continuous metallic fill material portion can be deposited employing a fluorine-containing precursor gas such as $WF_6$. In one embodiment, the continuous metallic fill material portion can be a tungsten layer including a residual level of fluorine atoms as impurities. A continuous electrically conductive layer fills each of the backside recesses 43 and peripheral portions of the backside via cavities (179, 479) and extends over the insulating cap strips 70.

The deposited metallic material of the continuous electrically conductive material layer is etched back from the sidewalls of each backside via cavity (179, 479) and from above the insulating cap strips 70, for example, by an isotropic wet etch, an anisotropic dry etch, or a combination thereof. Each remaining portion of the deposited metallic material in the backside recesses 43 constitutes an electrically conductive strip 46. Each electrically conductive strip 46 can be a conductive line structure. Thus, the sacrificial material strips 42 are replaced with the electrically conductive strips 46.

A plurality of electrically conductive strips 46 (i.e., electrically conductive structures having strip shapes) can be formed in the plurality of backside recesses 43. Each electrically conductive strip 46 can include a portion of the metallic barrier layer and a metallic fill material portion. Each electrically conductive strip 46 formed in the first device region 100 is herein referred to as a first electrically conductive strip 46. Each electrically conductive strip formed in the second device region 400 is herein referred to as a second electrically conductive strip 46. Each first electrically conductive strip 46 in the first device region 100 can function as a combination of a word line and control gates for a respective set of vertical NAND strings located within a pair of first line trenches 149. Each second electrically conductive strip 46 in the second device region 400 can function as a combination of a word line and control gates for a respective set of lateral NOR field effect transistors including active region assemblies (461, 463, 460) located within a pair of second line trenches 449.

First alternating stacks of first insulating strips 32 and first electrically conductive strips 46 are formed in the first device region 100. Second alternating stacks of second insulating strips 32 and second electrically conductive strips 46 are formed in the second device region 400. In one embodiment, the total number of first insulating strips 32 within each first alternating stack (32, 46) is the same as the total number of second insulating strips 32 within each second alternating stack (32, 46), and the total number of first electrically conductive strips 46 within each first alternating stack (32, 46) is the same as the total number of second electrically conductive strips 46 within each second alternating stack (32, 46). In one embodiment, for each positive integer i that is not greater than the total number of first insulating strips 32 within each first alternating stack (32, 46), an i-th first insulating strip 32 as counted upward from the substrate (9, 10) in each first alternating stack (32, 46) has a same thickness and a same material composition as an i-th second insulating strip 32 as counted upward from the substrate (9, 10) in each second alternating stack (32, 46), and for each positive integer j that is not greater than the total number of first electrically conductive strips 46 within each first alternating stack (32, 46), a j-th first electrically conductive strip 46 as counted upward from the substrate (9, 10) in each first alternating stack (32. 46) has a same thickness and a same material composition as a j-th second electrically conductive strip 46 as counted upward from the substrate (32, 46) in each second alternating stack (32, 6).

Figure 23A:
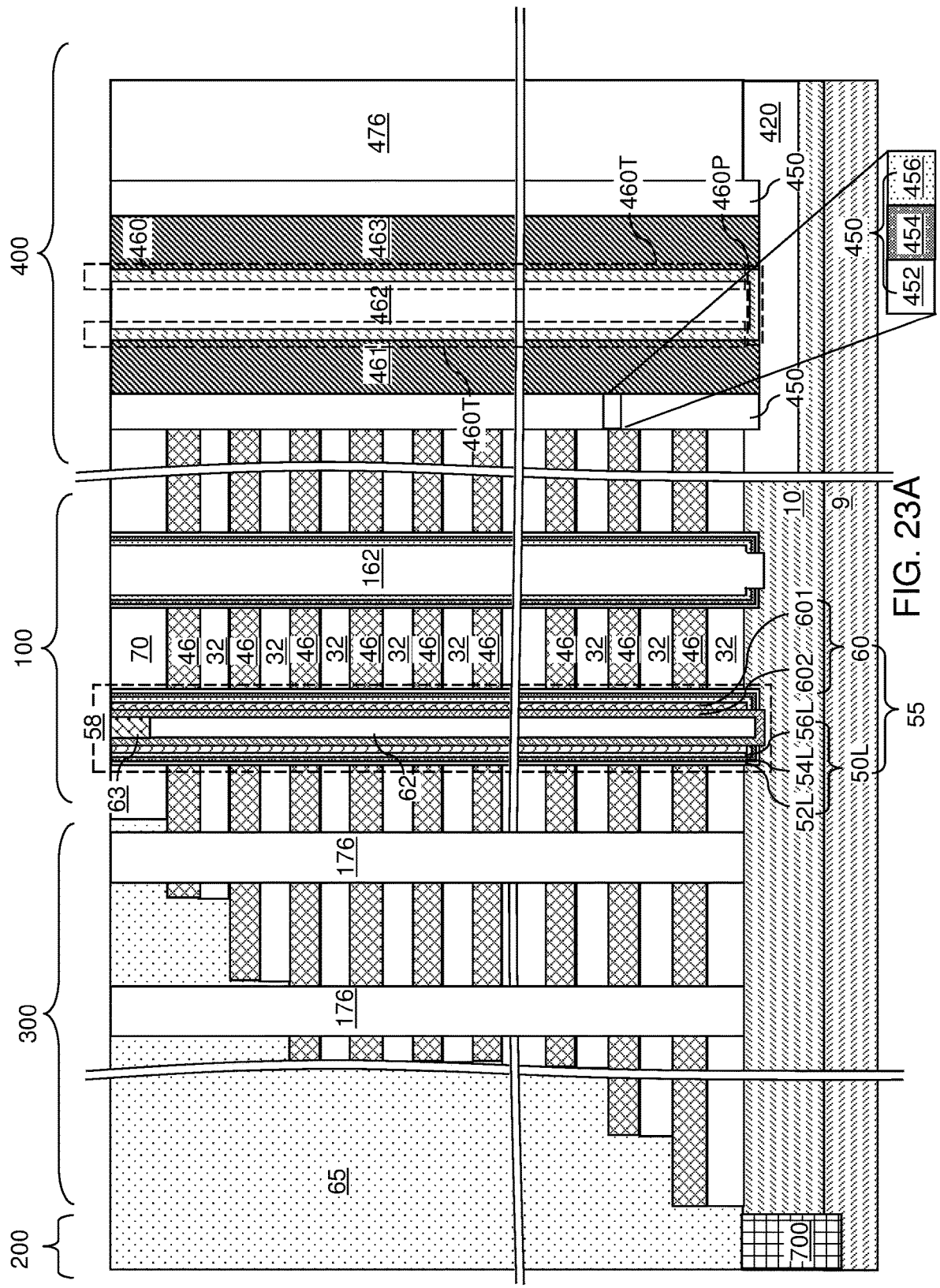
FIG. 23A is a schematic vertical cross-sectional view of the exemplary structure after formation of backside trench fill structures according to an embodiment of the present disclosure.
Figure 23B:
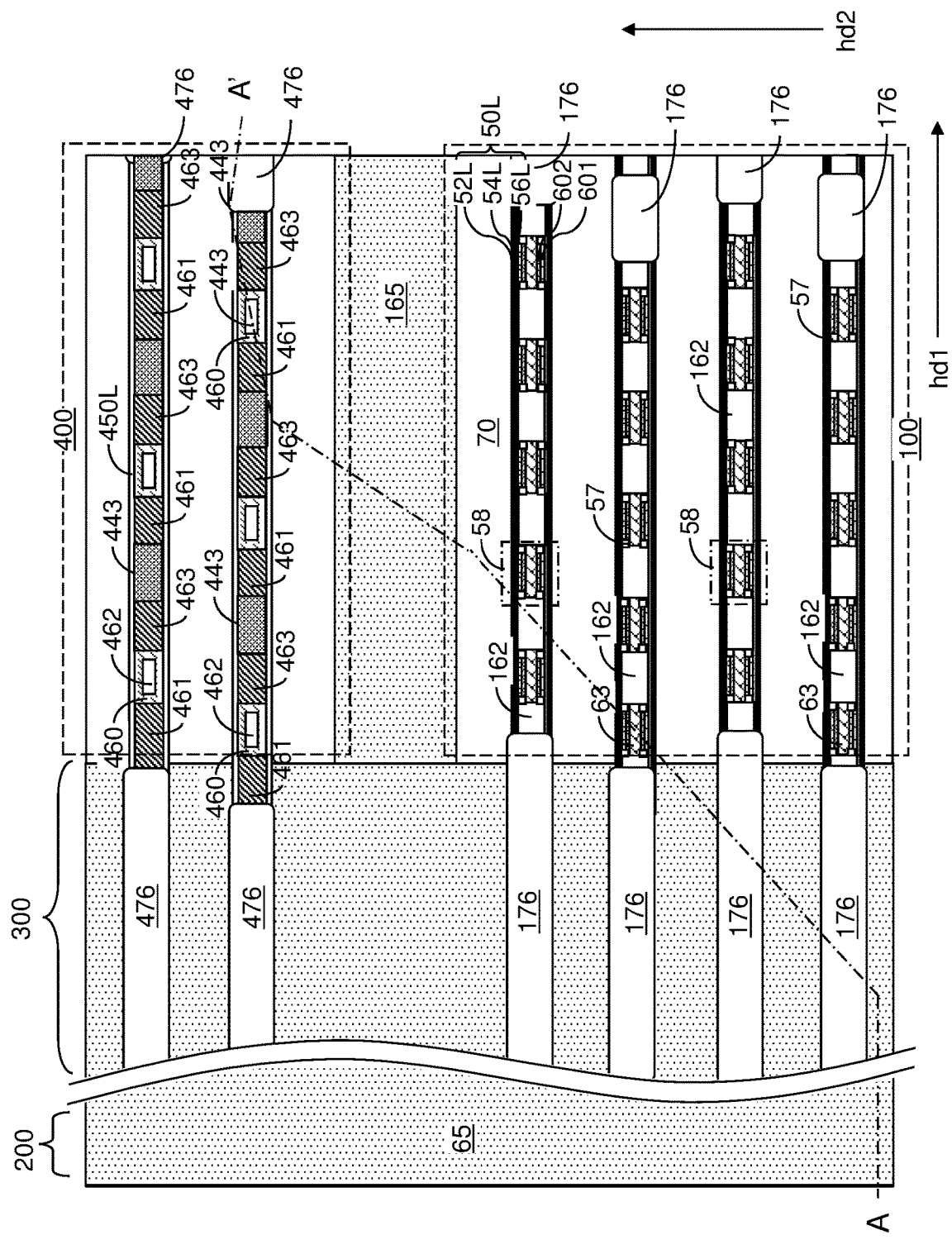
FIG. 23B is a top-down view of the exemplary structure of FIG. 23A. The vertical plane A-A' is the plane of the cross-section for FIG. 23A.

Referring to FIGS. 23A and 23B, a dielectric fill material can be deposited in the backside via cavities (179, 479) to form backside trench fill structures (176, 476). A first backside trench fill structure 176 can be formed in each backside via cavity 179, and a second backside trench fill structure 476 can be formed in each backside via cavity 479. Alternatively, a source region (not shown) may be formed at the bottom of each first backside via cavity 179 in a respective surface portion of the semiconductor material layer 10 by ion implantation of dopants of the second conductivity type, and each first backside via cavity 179 may be filled with a combination of an insulating spacer and a source contact via structure.

Figure 24B:
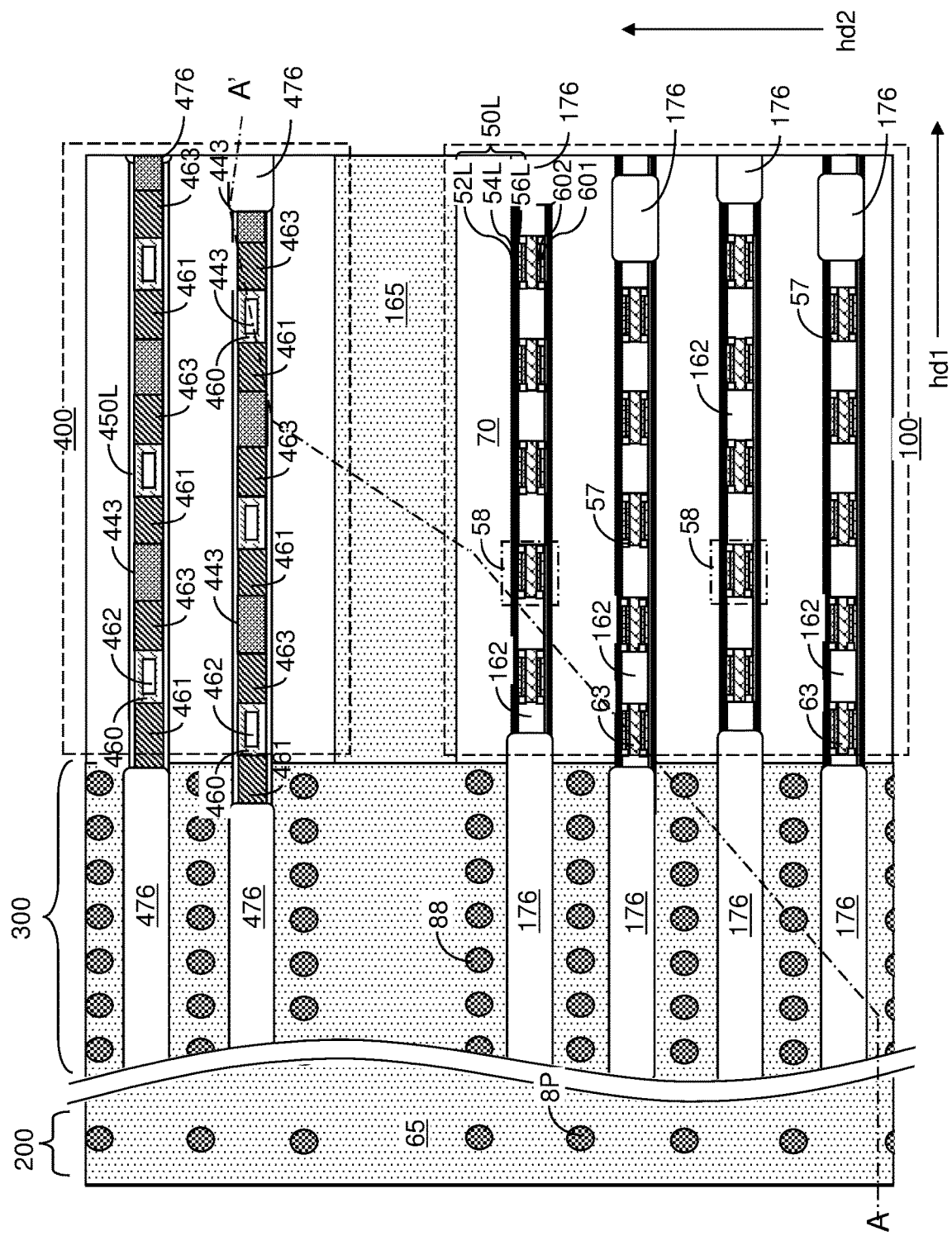
FIG. 24B is a top-down view of the exemplary structure of FIG. 23A. The vertical plane A-A' is the plane of the cross-section for FIG. 24A.

Referring to FIGS. 24A and 24B, layer contact via structures 86 can be formed through the retro-stepped dielectric material portion 65 directly on a top surface of a respective one of the electrically conductive strips 46 in the contact region 300. Peripheral contact via structures 8P can be formed on a respective semiconductor device 700 in the peripheral device region 200.

Subsequently, additional dielectric material layers and metal interconnect structures (such as metal lines (e.g., bit lines in the first device region 100 and source and drain lines in the second device region 400) and metal via structures) can be formed above the exemplary structure illustrated in FIGS. 24A and 24B. Bonding pads (not shown) can be formed as needed, and the substrate including the exemplary structure can be diced and packaged as needed.

Figure 25:
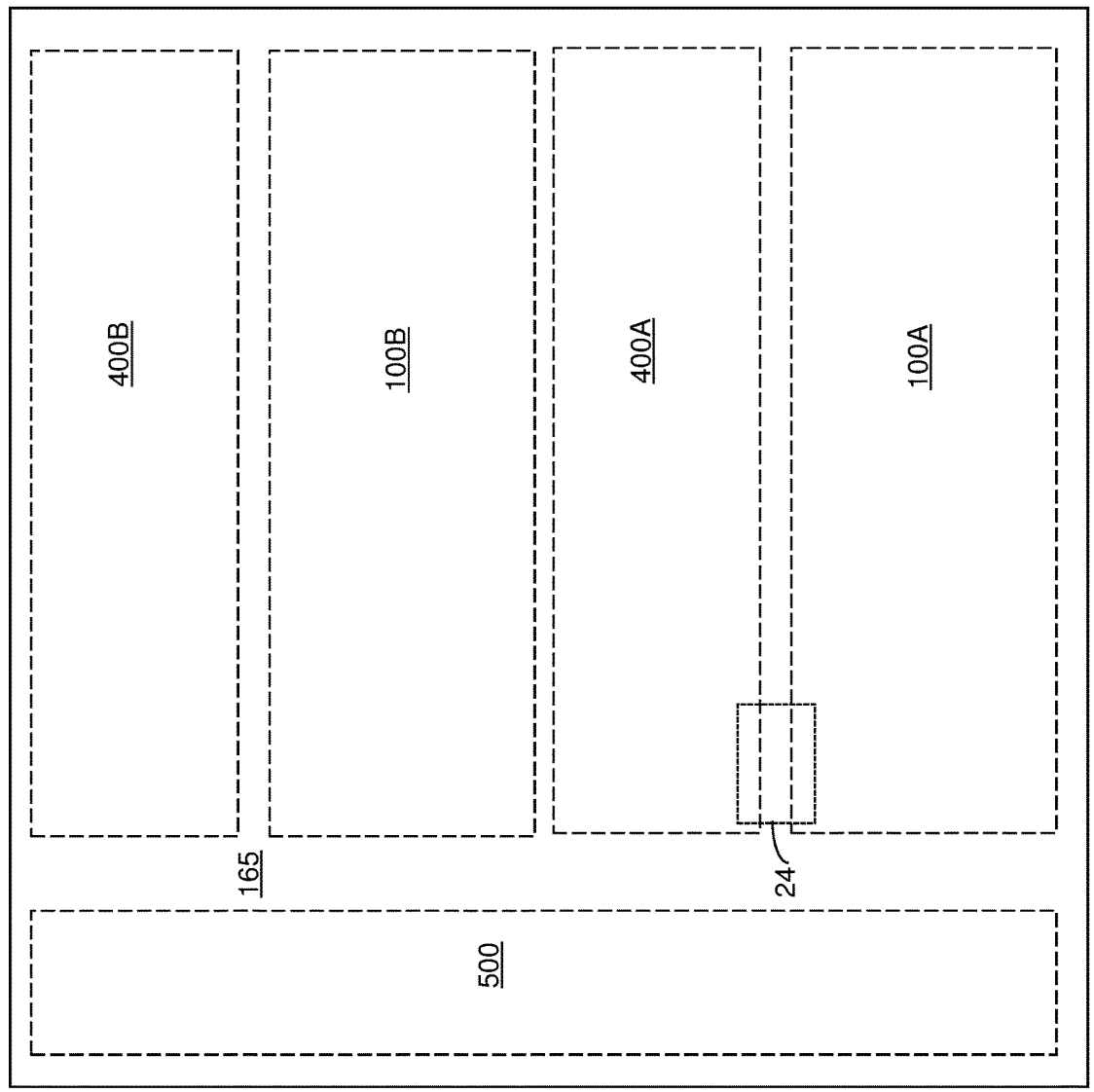
FIG. 25 is a plan view of an exemplary semiconductor die including a three-dimensional NAND memory array and a three-dimensional NOR memory array according to an embodiment of the present disclosure.

Referring to FIG. 25, a plan view of an exemplary semiconductor die 1000 is illustrated, which includes a three-dimensional NAND memory array (not expressly shown) in each first device region 100 (e.g., first and second memory blocks 100A and 100B) and a three-dimensional NOR memory array (not expressly shown) in each second device region 400 (e.g., third and fourth memory blocks 400A and 400B). A word line switch region 500 may be located adjacent to the memory blocks (100A, 200A, 400A and 400B). Region 24 shown in FIG. 25 corresponds to the exemplary structure shown in FIGS. 24A and 24B.

A semiconductor die 1000 including a three-dimensional NAND array and a three-dimensional NOR array can provide the advantages of both the three-dimensional NAND array and the three-dimensional NOR array. For example, the three-dimensional NOR array can provide data necessary for operation of the semiconductor die with a short power on read time, and the three-dimensional NAND array can be employed to provide fast erase and programming. The various relative advantages of a three-dimensional NAND memory array and a three-dimensional NOR memory array can be leveraged by allocating each of the three-dimensional NAND memory array and the three-dimensional NOR memory array for specific types of operations designed to utilize advantageous operational parameters of each three-dimensional memory array. Thus, a three-dimensional NOR-NAND combination memory device of the present disclosure can be utilized to enhance performance of the memory die 1000.

For example, the third memory block 400A may contain fuses (e.g., ROM fuses) in addition to the NOR memory array, and the fourth memory block 400B may include a special user block which requires a faster read time. The ROM fuse data is read during a voltage read operation during the power on read sequence. By using the shorter read time NOR flash memory in the one or more blocks that contains the ROM fuse data, the voltage read operation and the power on read sequence time is reduced. Data is then written to the three-dimensional NAND memory array in blocks 100A and 100B after the power on read sequence.

The slower write and erase times for the NOR flash memory does not significantly degrade the memory die 1000 performance because the ROM fuse data is written only once. Furthermore the faster read time for some special user blocks 400B may be required, even if the faster read time comes with slower write/erase performance of the NOR flash memory, depending on the application.

Referring to all drawings and according to various embodiments of the present disclosure, a three-dimensional memory device is provided, which comprises: first alternating stacks (32, 46) of first insulating strips 32 and first electrically conductive strips 46 located over a first device region 100 of a substrate (9, 10) and laterally spaced apart from each other by first line trenches 149, wherein each of the first line trenches 149 is filled with a respective laterally alternating sequence of memory stack structures 55 and first dielectric pillar structures 162, and wherein each of the memory stack structures 55 comprises a vertical semiconductor channel 60 that continuously extends vertically through each level of the first electrically conductive strips 46 and a vertical stack of memory elements (comprising proximal portions of a NAND memory film 50L) located at each level of the first electrically conductive strips 46; and second alternating stacks (32, 46) of second insulating strips 32 and second electrically conductive strips 46 located over second device region 400 of the substrate (9, 10) and laterally spaced apart from each other by second line trenches 449, wherein each of the second line trenches 449 comprises a laterally alternating sequence of active region assemblies (461, 463, 460) of NOR memory lateral field effect transistors and second dielectric pillar structures 443, and wherein each of the active region assemblies (461, 463, 460) of the NOR memory lateral field effect transistors comprises a source pillar 461, a drain pillar 463, and a tubular channel region 460T contacting the source pillar 461 and the drain pillar 463.

In one embodiment, each of the source pillar 461, the drain pillar 463, and the tubular channel region 460T vertically extends through each level of the second electrically conductive strips 46. In one embodiment, each of the second line trenches 449 comprises lengthwise sidewalls that are contacted by a respective NOR memory film 450L; and each NOR memory film 450L contacts a respective laterally alternating sequence of active region assemblies (461, 463, 460) of NOR memory lateral field effect transistors and second dielectric pillar structures 443. In one embodiment, each of the NOR memory films 450L comprises a ferroelectric dielectric layer or a layer stack containing a blocking dielectric layer 452, a charge storage layer 454, and a tunneling dielectric layer 456. In one embodiment, the tubular channel region 460T within each of the active region assemblies (461, 463, 460) of the NOR memory lateral field effect transistors has a uniform thickness throughout and laterally surrounds a respective dielectric core such as a NOR dielectric core 462.

In one embodiment, each of the vertical semiconductor channels 60 has a respective pair of planar vertical semiconductor surfaces that are parallel to a horizontal lengthwise direction of the first line trenches 149; and each vertical stack of memory elements comprises portions of a respective NAND memory film 50L having a respective pair of planar vertical dielectric surfaces that are parallel to the horizontal lengthwise direction of the first line trenches 149, which can be, for example, parallel to a first horizontal direction hd1. In one embodiment, each of the NAND memory films 50L comprises a ferroelectric dielectric layer or a layer stack including a blocking dielectric layer 52L, a charge storage layer 54L, and a tunneling dielectric layer 56L; a top end of each of the vertical semiconductor channels 60 contacts a respective drain region 63; and a bottom end of each of the vertical semiconductor channels 60 is electrically connected to a horizontal semiconductor channel embedded within a semiconductor material layer 10 underlying the first alternating stacks (32, 46).

In one embodiment, each of the NAND memory films 50L contacts a sidewall of a respective one of the first line trenches 149 (and may contact a pair of lengthwise sidewalls of the respective one of the first line trenches 149); and each of the NAND memory films 50L contacts a respective plurality of vertical semiconductor channels 60 that are laterally spaced apart from each other by a subset of the first dielectric pillar structures 162 located within the respective one of the first line trenches 149.

In one embodiment, each of the vertical semiconductor channels 60 has a U-shaped vertical cross-sectional profile along a vertical direction that is perpendicular to a lengthwise direction of the first line trenches 149, and comprises a respective pair of inner sidewalls that contact a respective dielectric core 62; and each of the vertical semiconductor channels 60 contacts a pair of vertical semiconductor oxide strips 57 that comprises a dielectric oxide of a semiconductor material of the vertical semiconductor channels 60 and contacts a respective one of the first dielectric pillar structures 162.

In one embodiment, the memory stack structures 55 in combination with the first electrically conductive strips 46 constitute a three-dimensional NAND memory array in which each vertical semiconductor channel 60 functions a common channel of a respective NAND string 58. The NOR memory lateral field effect transistors in combination with the second electrically conductive strips 46 constitute a three-dimensional NOR memory array in which each tubular channel region 460T functions as a common channel of a respective NOR string. The three-dimensional NAND memory array is located in a first memory block 100A, and the three-dimensional NOR memory array is located in a different second memory block 400A which contains fuses configured to store ROM fuse data.

In one embodiment, each of the first alternating stacks (32, 46) and the second alternating stacks (32, 46) comprises a respective stepped surface in a terrace region; each horizontal top surface of the first electrically conductive strips 46 is contacted by a respective first contact via structure 86 in the terrace region; and each horizontal top surface of the second electrically conductive strips 46 is contacted by a respective second contact via structure 86 in the terrace region.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:
   first alternating stacks of first insulating strips and first electrically conductive strips located over a first device region of a substrate and laterally spaced apart from each other by first line trenches, wherein each of the first line trenches is filled with a respective laterally alternating sequence of memory stack structures and first dielectric pillar structures, and wherein each of the memory stack structures comprises a vertical semiconductor channel that continuously extends vertically through each level of the first electrically conductive strips and a vertical stack of memory elements located at each level of the first electrically conductive strips; and
   second alternating stacks of second insulating strips and second electrically conductive strips located over second device region of the substrate and laterally spaced apart from each other by second line trenches, wherein each of the second line trenches comprises a laterally alternating sequence of active region assemblies of NOR memory lateral field effect transistors and second dielectric pillar structures, and wherein each of the active region assemblies of the NOR memory lateral field effect transistors comprises a source pillar, a drain pillar, and a tubular channel region contacting the source pillar and the drain pillar.

2. The three-dimensional memory device of claim 1, wherein each of the source pillar, the drain pillar, and the tubular channel region vertically extends through each level of the second electrically conductive strips.

3. The three-dimensional memory device of claim 2, wherein:
   each of the second line trenches comprises lengthwise sidewalls that are contacted by a respective NOR memory film; and
   each NOR memory film contacts a respective laterally alternating sequence of active region assemblies of the NOR memory lateral field effect transistors and second dielectric pillar structures.

4. The three-dimensional memory device of claim 3, wherein each of the NOR memory films comprises a ferroelectric dielectric layer or a layer stack containing a blocking dielectric layer, a charge storage layer, and a tunneling dielectric layer.

5. The three-dimensional memory device of claim 2, wherein the tubular channel region within each of the active region assemblies of the NOR memory lateral field effect transistors has a uniform thickness throughout and laterally surrounds a respective dielectric core.

6. The three-dimensional memory device of claim 1, wherein:
   each of the vertical semiconductor channels has a respective pair of planar vertical semiconductor surfaces that are parallel to a horizontal lengthwise direction of the first line trenches; and
   each vertical stack of memory elements comprises portions of a respective NAND memory film having a respective pair of planar vertical dielectric surfaces that are parallel to the horizontal lengthwise direction of the first line trenches.

7. The three-dimensional memory device of claim 6, wherein:
   each of the NAND memory films comprises a ferroelectric dielectric layer or a layer stack including a blocking dielectric layer, a charge storage layer, and a tunneling dielectric layer;
   a top end of each of the vertical semiconductor channels contacts a respective drain region; and
   a bottom end of each of the vertical semiconductor channels is electrically connected to a horizontal semiconductor channel embedded within a semiconductor material layer underlying the first alternating stacks.

8. The three-dimensional memory device of claim 6, wherein:
   each of the NAND memory films contacts a sidewall of a respective one of the first line trenches; and
   each of the NAND memory films contacts a respective plurality of vertical semiconductor channels that are laterally spaced apart from each other by a subset of the first dielectric pillar structures located within the respective one of the first line trenches.

9. The three-dimensional memory device of claim 6, wherein:
   each of the vertical semiconductor channels has a U-shaped vertical cross-sectional profile along a vertical direction that is perpendicular to a lengthwise direction of the first line trenches, and comprises a respective pair of inner sidewalls that contact a respective dielectric core; and
   each of the vertical semiconductor channels contacts a pair of vertical semiconductor oxide strips that comprises a dielectric oxide of a semiconductor material of the vertical semiconductor channels and contacts a respective one of the first dielectric pillar structures.

10. The three-dimensional memory device of claim 1, wherein:
    the memory stack structures in combination with the first electrically conductive strips constitute a three-dimensional NAND memory array in which each vertical semiconductor channel functions a common channel of a respective NAND string;
    the NOR memory lateral field effect transistors in combination with the second electrically conductive strips constitute a three-dimensional NOR memory array in which each tubular channel region functions as a common channel of a respective NOR string;
    the three-dimensional NAND memory array is located in a first memory block; and
    the three-dimensional NOR memory array is located in a different second memory block which contains fuses configured to store ROM fuse data.

11. The three-dimensional memory device of claim 1, wherein:

a total number of first insulating strips within each first alternating stack is the same as a total number of second insulating strips within each second alternating stack; and a total number of first electrically conductive strips within each first alternating stack is the same as a total number of second electrically conductive strips within each second alternating stack.

12. The three-dimensional memory device of claim 11, wherein:

for each positive integer i that is not greater than a total number of first insulating strips within each first alternating stack, an i-th first insulating strip as counted upward from the substrate in each first alternating stack has a same thickness and a same material composition as an i-th second insulating strip as counted upward from the substrate in each second alternating stack;

for each positive integer j that is not greater than a total number of first electrically conductive strips within each first alternating stack, a j-th first electrically conductive strip as counted upward from the substrate in each first alternating stack has a same thickness and a same material composition as a j-th second electrically conductive strip as counted upward from the substrate in each second alternating stack;

each of the first alternating stacks and the second alternating stacks comprises a respective stepped surface in a terrace region;

each horizontal top surface of the first electrically conductive strips is contacted by a respective first contact via structure in the terrace region; and each horizontal top surface of the second electrically conductive strips is contacted by a respective second contact via structure in the terrace region.

13. A method of operating the three-dimensional memory device of claim 10, comprising reading the ROM fuse data using the three-dimensional NOR memory array during a voltage read operation of a power on read sequence, followed by writing data to the three-dimensional NAND memory array after the power on read sequence.

14. A method of forming a three-dimensional memory device, comprising:

forming a vertically alternating sequence of insulating layers and spacer material layers over a substrate, wherein the spacer material layers comprise a sacrificial material or an electrically conductive material;

forming first line trenches in a first device region and second line trenches in a second device region, wherein the vertically alternating sequence is divided into first alternating stacks of first insulating strips and first spacer material strips in the first device region, and is divided into second alternating stacks of second insulating strips and second spacer material strips in the second device region;

filling each of the first line trenches with a respective laterally alternating sequence of memory stack structures and first dielectric pillar structures, and wherein each of the memory stack structures comprises a vertical semiconductor channel and a vertical stack of memory elements; and filling each of the second line trenches with a respective laterally alternating sequence of active region assemblies of NOR memory lateral field effect transistors and second dielectric pillar structures, and wherein each of the active region assemblies of the lateral field effect transistors comprises a source pillar, a drain pillar, and a tubular channel region contacting the source pillar and the drain pillar, wherein the first spacer material strips and the second spacer material strips comprise, or are subsequently replaced with, first electrically conductive strips and second electrically conductive strips, respectively.

15. The method of claim 14, further comprising forming a NAND memory film on each sidewall of the first line trenches, wherein each laterally alternating sequence of memory stack structures and first dielectric pillar structures is formed on a respective one of the NAND memory films.

16. The method of claim 15, wherein:

the NAND memory films are formed by depositing a continuous NAND memory film in each of the first line trenches and by anisotropically etching horizontal portions of the continuous NAND memory film; and the vertical semiconductor channels are formed by depositing at least one semiconductor channel material layer over each NAND memory film and by dividing the at least one semiconductor channel material layer into discrete vertically-extending semiconductor strips along a lengthwise direction of the first line trenches.

17. The method of claim 14, further comprising forming a NOR memory film on each sidewall of the second line trenches, wherein each laterally alternating sequence of active region assemblies of lateral field effect transistors and second dielectric pillar structures is formed on a respective one of the NOR memory films.

18. The method of claim 17, further comprising:

depositing a sacrificial fill material in unfilled volumes of the second line trenches on sidewalls of the NOR memory films; and patterning the sacrificial fill material into sacrificial pillar structures by masking portions of the sacrificial pillar material and by anisotropically etching unmasked portions of the sacrificial pillar material, wherein first pillar cavities are formed between each neighboring pair of sacrificial pillar structures; and forming the source pillars and the drain pillars by depositing a doped semiconductor material into the first pillar cavities.

19. The method of claim 18, further comprising:

forming second pillar cavities by removing a first subset of the sacrificial pillar structures selective to the source pillars and the drain pillars;

conformally depositing a semiconductor channel material at peripheral regions of the second pillar cavities on each physically exposed sidewall of the source pillar and the drain pillars;

filling remaining volumes of the second pillar cavities with a dielectric material and removing portions of the semiconductor channel material from above a horizontal plane including top surfaces of the source pillars and the drain pillars, wherein remaining portions of the semiconductor channel material comprise the tubular channel regions.

20. The method of claim 14, further comprising:

filling each of the first line trenches with a respective combination of a NAND memory film, at least one semiconductor channel material layer, and a dielectric core rail;

masking portions of each dielectric core rail with a patterned etch mask layer;

dividing each dielectric core rail into a plurality of dielectric cores by anisotropically etching unmasked portions of the dielectric core rails, wherein pillar cavities are formed in volumes from which a material of the dielectric core rails are etched; and dividing the at least one semiconductor channel material layer into a respective plurality of vertical semiconductor channels by etching physically exposed portions of the at least one semiconductor channel material layer from the pillar cavities.

* * * * *